(12) United States Patent
Lee et al.

(10) Patent No.: US 12,414,251 B2
(45) Date of Patent: Sep. 9, 2025

(54) PROTECTION MEMBER, DISPLAY APPARATUS, AND METHOD OF MANUFACTURING DISPLAY APPARATUS

(71) Applicant: Samsung Display Co., Ltd., Yongin-si (KR)

(72) Inventors: Joonik Lee, Yongin-si (KR); Cheuljin Park, Yongin-si (KR); Kisang Yoo, Yongin-si (KR); Hyunkyung Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 337 days.

(21) Appl. No.: 17/957,335

(22) Filed: Sep. 30, 2022

(65) Prior Publication Data

US 2023/0107898 A1   Apr. 6, 2023

(30) Foreign Application Priority Data

Oct. 1, 2021   (KR) .......................... 10-2021-0131132

(51) Int. Cl.
  *H05K 5/03*   (2006.01)
  *B32B 3/08*   (2006.01)
  *B32B 7/12*   (2006.01)
  *B32B 37/12*  (2006.01)

(52) U.S. Cl.
  CPC .................. *H05K 5/03* (2013.01); *B32B 3/08* (2013.01); *B32B 7/12* (2013.01); *B32B 37/12* (2013.01); *B32B 2264/105* (2013.01); *B32B 2307/202* (2013.01); *B32B 2457/20* (2013.01); *B32B 2556/00* (2013.01)

(58) Field of Classification Search
  CPC .......................... H05K 5/0017; H05K 5/0217
  USPC ......................................................... 361/807
  See application file for complete search history.

(56) References Cited

U.S. PATENT DOCUMENTS

| 10,273,395 | B2 | 4/2019 | Lee et al. |
| 10,496,134 | B2 | 12/2019 | Park et al. |
| 2018/0184534 | A1* | 6/2018 | Na .................. F16M 11/041 |
| 2020/0176696 | A1* | 6/2020 | Dai ..................... H10K 59/173 |
| 2020/0401185 | A1* | 12/2020 | Won ......................... B32B 38/10 |
| 2023/0126098 | A1* | 4/2023 | Yun ....................... H10K 59/873 |
| | | | 257/40 |

FOREIGN PATENT DOCUMENTS

| CN | 111179777 | 5/2020 |
| CN | 210780905 | 6/2020 |
| CN | 112133733 | 12/2020 |
| CN | 113745087 A * | 12/2021 ......... C23C 16/4412 |

(Continued)

*Primary Examiner* — Hung S. Bui
(74) *Attorney, Agent, or Firm* — Sughrue Mion, PLLC

(57) ABSTRACT

The present disclosure relates to a protection member, a display apparatus and a method of manufacturing the display apparatus. The protection member includes a protective film including a first layer having a central area, a first side area extended to a first edge of the central area, a second side area intersecting the first edge of the central area, and a corner area extended between the first side area and the second side area, and a second layer arranged on the first layer and exposing at least a portion of the corner area of the first layer; and a shielding member shielding the at least the portion of the corner area exposed.

33 Claims, 54 Drawing Sheets

(56) References Cited

FOREIGN PATENT DOCUMENTS

| | | | |
|---|---|---|---|
| JP | 6548484 B2 * | 7/2019 | ........ H01J 37/32834 |
| KR | 10-2018-0034781 | 4/2018 | |
| KR | 10-2154522 | 9/2020 | |

* cited by examiner

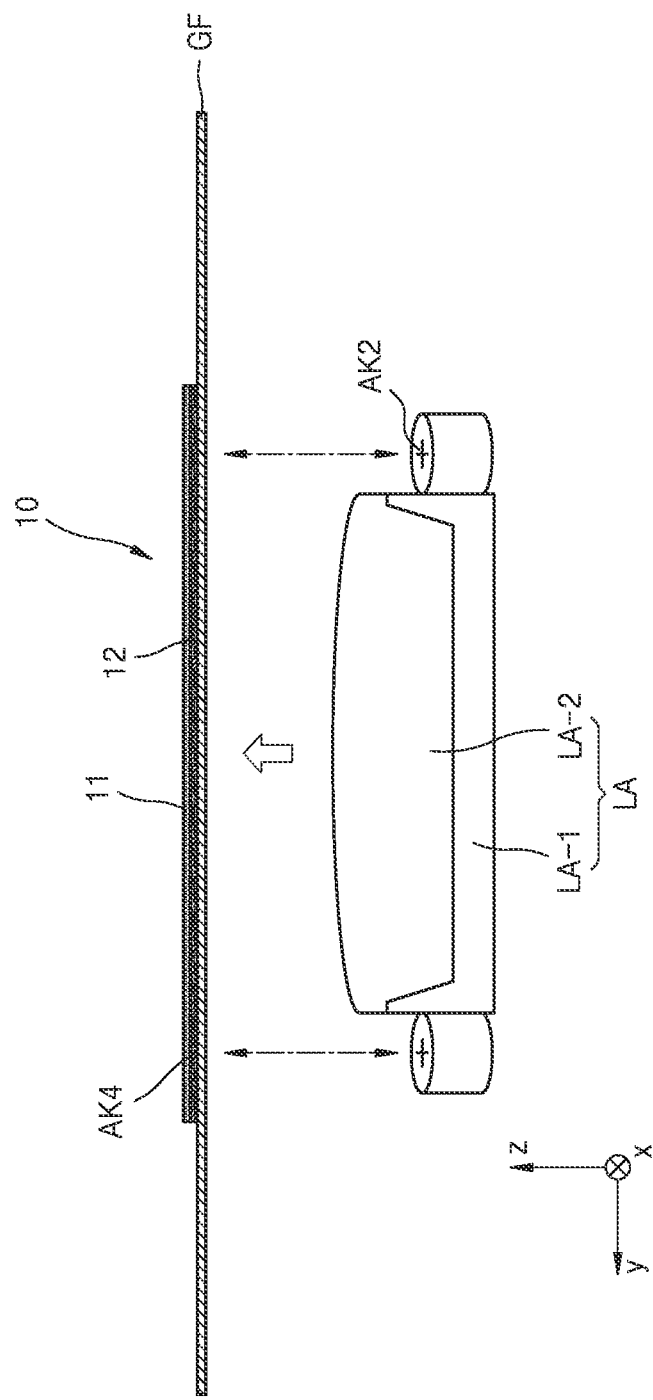

PROTECTION MEMBER, DISPLAY APPARATUS, AND METHOD OF MANUFACTURING DISPLAY APPARATUS

CROSS-REFERENCE TO RELATED APPLICATION(S)

This application is based on and claims priority to and benefits of Korean Patent Application No. 10-2021-0131132 under 35 U.S.C. § 119, filed on Oct. 1, 2021, in the Korean Intellectual Property Office (KIPO), the entire contents of which are incorporated herein by reference.

BACKGROUND

1. Technical Field

One or more embodiments relate to an apparatus and a method, and more specifically, to a protection member, a display apparatus and a method of manufacturing the display apparatus.

2. Description of the Related Art

Mobile electronic apparatuses have been widely used. Recently, tablet computers have been commonly used as mobile electronic apparatuses, in addition to small electronic apparatuses such as mobile phones.

Such mobile electronic apparatuses include display apparatuses to support various functions or provide users with visual information such as images or videos. As other components for driving display apparatuses decrease in size, areas of the electronic apparatuses that are occupied by display apparatuses tend to increase, and structures, which are bendable in a flat state to have certain angles, have been developed.

A protective film may be arranged in a display apparatus to protect a display panel. In this case, in case that the display apparatus has a round edge, a portion of the protective film may be removed and arranged at the round edge so that the protective film may be readily round.

SUMMARY

One or more embodiments include a protection member for protecting a corner of a display panel, in which an image may be displayed even on a side surface and/or at a corner thereof, to reduce an area of a non-display area and increase an area of a display area. In addition, one or more embodiments include a display apparatus in which an image may be displayed even on the side surface and/or the corner thereof, to reduce the area of the non-display area and increase the area of the display area, and the corner of a protective film may be protected after the display panel and the protective film are attached to each other, for a manufacture of the display apparatus, and a method of manufacturing the display apparatus.

Additional aspects will be set forth in part in the description that follows and, in part, will be apparent from the description, or may be learned by practice of the embodiments of the present disclosure.

According to an embodiment, a protection member includes a protective film including a first layer having a central area, a first side area extended to a first edge of the central area, a second side area intersecting the first edge of the central area, and a corner area extended between the first side area and the second side area; and a second layer arranged on the first layer and exposing at least a portion of the corner area of the first layer; and a shielding member shielding the at least the portion of the corner area, the portion of the corner area being exposed.

The second layer may overlap the central area, the first side area, and the second side area of the first layer in a plan view, and the second layer may expose the corner area of the first layer.

The corner area may include a first area and a second area. The second layer may overlap the central area, the first side area, the second side area of the first layer, and the first area in a plan view. The second layer may expose the second area of the first layer.

The shielding member may shield the second area and at least one of the central area, the first side area, the second side area, and the first area.

The first area may include a first line area and a second line area spaced apart from each other, the first line area may be positioned between the first side area and the second area, and the second line area may be positioned between the second side area and the second area.

The shielding member may shield the second area and at least one of the central area, the first side area, and the second side area, the first line area, and the second line area.

The first area may include line areas that extend in a first direction and are spaced apart from each other in a second direction, the second area may include space areas that extend in the first direction and are arranged in the second direction, and the line areas and the space areas may be arranged to alternate each other in the second direction.

The shielding member may include a first shielding member shielding one of the space areas, and a second shielding member shielding another one of the space areas.

The shielding member may include a body portion, and a contact layer contacting the second layer.

The contact layer may include metal particles.

The contact layer may include a blocking layer arranged on the body portion, and a conductive layer arranged on the blocking layer.

A surface of the body portion may be flat.

At least a portion of the shielding member may be curved.

According to another embodiment, a display apparatus includes a protective film including a first layer having a central area, a side area extended to an edge of the central area, and a corner area that extends from a corner of the central area and is bent at a first curvature radius; and a second layer exposing at least a portion of the corner area of the first layer, a shielding member shielding at least the portion of the corner area, the portion of the corner area being exposed, and a display panel arranged on a second surface facing the first surface, the display panel including a main display area corresponding to the central area and a corner display area corresponding to the corner area.

The second layer may overlap the central area and the side area of the first layer in a plan view, and the second layer may expose the corner area of the first layer.

The corner area may include a first area and a second area. The second layer may overlap the central area, the side area of the first layer, and the first area in a plan view. The second layer may expose the second area of the first layer.

The shielding member may shield the second area and at least one of the central area, the side area, and the first area.

The first area may include a first line area and a second line area spaced apart from each other, the first line area may be positioned between a first side area of the side area and the second area, and the second line area may be positioned between a second side area of the side area and the second area.

The shielding member may shield the second area and at least one of the central area, the first side area, the second side area, the first line area, and the second line area.

The first area may include line areas that extend in a first direction and are spaced apart from each other in a second direction, the second area may include space areas that extend in the first direction and are arranged in the second direction, and the line areas and the space areas may be arranged to alternate each other in the second direction.

The shielding member may include a first shielding member shielding one of the space areas, and a second shielding member shielding another one of the space areas.

The shielding member may include a body portion, and a contact layer contacting the second layer.

The contact layer may include metal particles.

The contact layer may include a blocking layer arranged on the body portion, and a conductive layer arranged on the blocking layer.

A surface of the body portion may be flat, the surface being arranged in an opposite direction to a surface facing the display panel.

At least a portion of the shielding member may be curved.

The display apparatus may further include a cover window overlapping the display panel in a plan view.

According to an embodiment, a method of manufacturing a display apparatus includes aligning a first surface of a display panel to face a cover window and bonding the cover window and the display panel to each other, aligning a first surface of a protective film to face a second surface opposite to the first surface of the display panel and bonding the display panel to the protective film, the protective film including a first layer having a central area, a first side area extended to a first edge of the central area, a second side area extended to a second edge crossing the first edge of the central area, and a corner area extended between the first side area and the second side area, and a second layer arranged on the first layer and exposing at least a portion of the corner area of the first layer, and arranging a shielding member on the second layer to shield the first layer that is exposed.

The shielding member may include a body portion, and a contact layer on the body portion and contacting the second layer.

The contact layer may include metal particles.

The contact layer may include a blocking layer arranged on the body portion, and a conductive layer arranged on the blocking layer.

A surface of the body portion may be flat, the surface being arranged in an opposite direction to a surface facing the display panel.

At least a portion of the shielding member may be curved.

Other aspects, features, and advantages other than those described above will become apparent from the accompanying drawings, the appended claims, and the detailed description of the present disclosure.

BRIEF DESCRIPTION OF THE DRAWINGS

The above and other aspects, features, and advantages of certain embodiments will be more apparent from the following description taken in conjunction with the accompanying drawings, in which:

FIGS. 23C to 23G are side views schematically illustrating a method of manufacturing a display apparatus, according to an embodiment.

DETAILED DESCRIPTIONS OF THE EMBODIMENTS

Figure 1A:
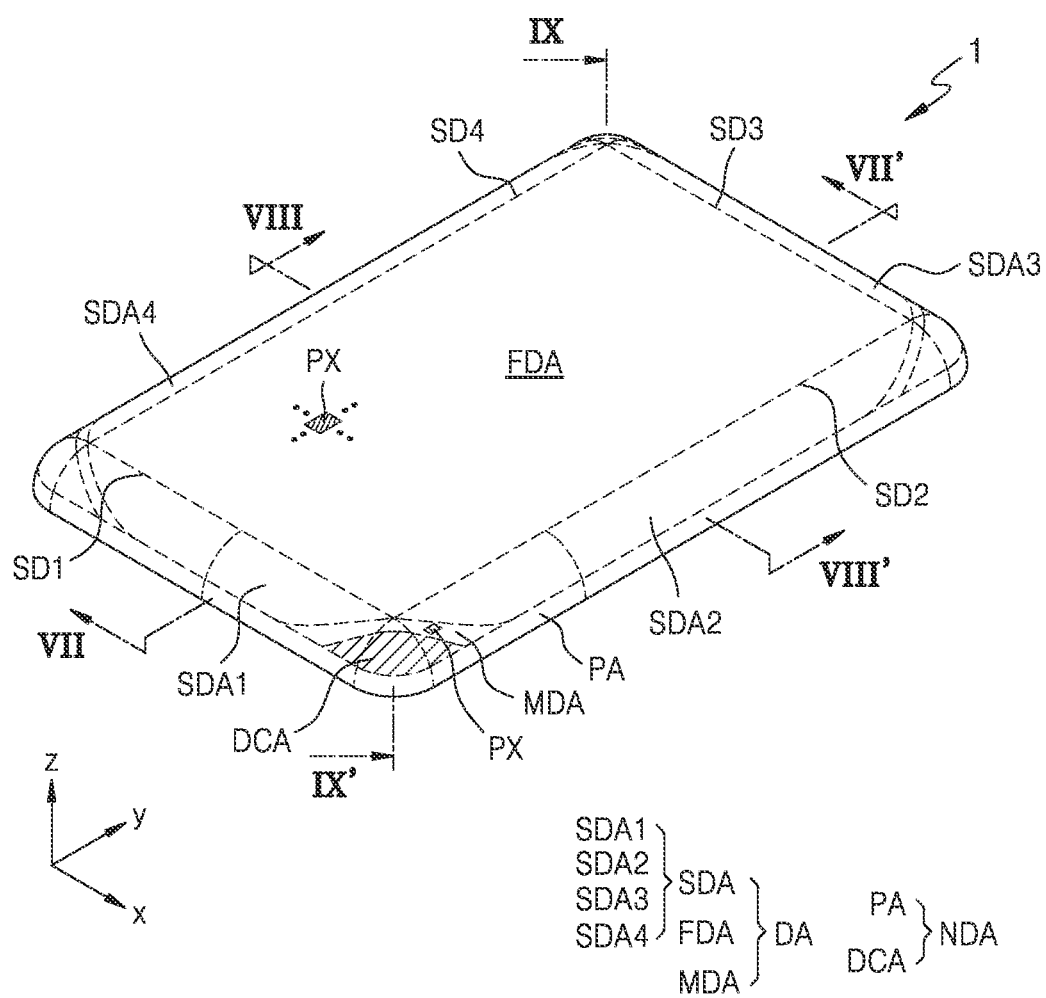
FIG. 1A is a perspective view schematically illustrating a display apparatus according to an embodiment.

Reference will now be made in detail to embodiments, examples of which are illustrated in the accompanying drawings, wherein like reference numerals refer to like elements throughout the disclosure. In this regard, the embodiments of the disclosure may have different forms and should not be construed as being limited to the descriptions set forth herein. Accordingly, the embodiments are merely described below, by referring to the figures, to explain aspects of the description of the disclosure. As used herein, the term "and/or" includes any and all combinations of one or more of the associated listed items. The phrase "at least one of" is intended to include the meaning of "at least one selected from the group of" for the purpose of its meaning and interpretation. For example, "at least one of A and B" may be understood to mean "A, B, or A and B."

The disclosure may, however, be embodied in many different forms and should not be construed as being limited to the embodiments set forth herein. Effects and features of the disclosure, and methods for achieving the same will be clarified with reference to embodiments described below in detail with reference to the drawings. However, the embodiments of the disclosure may be implemented in various forms, not by being limited to the embodiments presented below.

Hereinafter, embodiments will be described with reference to the accompanying drawings, wherein like reference symbols refer to like elements throughout the disclosure, and redundant descriptions thereof are omitted.

Although the terms "first," "second," and the like may be used to describe various elements, these elements should not be limited by these terms. These terms are only used to distinguish one element from another element.

In an embodiment below, an expression used in the singular encompasses the expression of the plural, unless it has a clearly different meaning in the context.

It will be understood that the terms "comprise," "comprising," "include" and/or "including" as used herein specify the presence of stated features or components but do not preclude the addition of one or more other features or components.

It will be further understood that, when a layer, area, or component is referred to as being "on" another layer, area, or component, it can be directly or indirectly on the other layer, area, or component. That is, for example, intervening layers, areas, or components may be present.

In the drawings, sizes of components in the drawings may be exaggerated or reduced for convenience of explanation. In other words, because sizes and thicknesses of components in the drawings are arbitrarily illustrated for convenience of description, the following embodiments are not limited thereto.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two processes described in succession may be performed substantially simultaneously, or may be performed in an order opposite to that described.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1A is a perspective view schematically illustrating a display apparatus 1 according to an embodiment.

Referring to FIG. 1A, the display apparatus 1 may be used not only in portable electronic apparatuses such as mobile phones, smartphones, tablet personal computers, mobile communication terminals, electronic notebooks, electronic books, portable multimedia players (PMPs), navigation systems, and ultra-mobile personal computers (UMPC), but also as display screens of various products such as televisions, laptops, monitors, billboards, and Internet of things (IoT) devices.

In an embodiment, the display apparatus 1 may have a quadrangular shape in a plan view. In an optional embodiment, the display apparatus 1 may have a polygonal shape such as a triangular shape and a quadrangular shape, a circular shape, an elliptical shape, etc. In an embodiment, in case that the display apparatus 1 has a polygonal shape in a plan view, a corner of the polygonal shape may be rounded. Hereinafter, for convenience of explanation, the display apparatus 1 having a polygonal shape with rounded corners in a plan view will be described in detail.

The display apparatus 1 may have a short side in a first direction (e.g., an x direction or a −x direction) and a long side in a second direction (e.g., a y direction or a −y direction). In another embodiment, in the display apparatus 1, a side in the first direction (e.g., the x direction or the −x direction) and a side in the second direction (e.g., the y direction or the −y direction) may have a same length. In another embodiment, the display apparatus 1 may have a long side in the first direction (e.g., the x direction or the −x direction) and a short side in the second direction (e.g., the y direction or the −y direction).

Each of corners at which the short side in the first direction (e.g., the x direction or the −x direction) meets the long side in the second direction (e.g., the y direction or the −y direction) may be rounded to have a curvature.

The display apparatus 1 may include a display area DA and a non-display area NDA outside the display area DA. Pixels PX may be arranged in the display area DA, and an image may be provided from an array of the pixels PX. The pixels PX may be defined as an area in which light is emitted by light-emitting elements provided in the display apparatus 1. For example, each of the pixels PX may include a red sub-pixel, a green sub-pixel, and a blue sub-pixel. As another example, each of the pixels PX may include a red sub-pixel, a green sub-pixel, a blue sub-pixel, and a white sub-pixel.

In an embodiment, the display area DA may include a main display area FDA, an auxiliary display area SDA, and an intermediate display area MDA. Pixels PX may be arranged in each of the main display area FDA, the auxiliary display area SDA, and the intermediate display area MDA.

The main display area FDA may include a flat surface. In an embodiment, the main display area FDA may occupy the greatest proportion in the display area DA of the display apparatus 1 and thus may provide most images.

The auxiliary display area SDA may have at least a portion being bent to include a curved surface, and may extend outward from each of edges of the main display area FDA. In an embodiment, the auxiliary display area SDA may include a first auxiliary display area SDA1, a second auxiliary display area SDA2, a third auxiliary display area SDA3, and a fourth auxiliary display area SDA4. In an embodiment, at least one of the first auxiliary display area SDA1, the second auxiliary display area SDA2, the third auxiliary display area SDA3, and the fourth auxiliary display area SDA4 may be omitted.

In an embodiment, the first auxiliary display area SDA1 may be adjacent to a first edge SD1 of the main display area FDA, and may extend outward in the −y direction from the first edge SD1 thereof. The second auxiliary display area SDA2 may be adjacent to a second edge SD2 of the main display area FDA, and may extend outward in the x direction from the second edge SD2 thereof. The third auxiliary display area SDA3 may be adjacent to a third edge SD3 of the main display area FDA, and may extend outward in the y direction from the third edge SD3 thereof. The fourth auxiliary display area SDA4 may be adjacent to a fourth edge SD4 of the main display area FDA, and may extend outward in the −x direction from the fourth edge SD4 thereof. In this case, the first auxiliary display area SDA1 and the third auxiliary display area SDA3 may be positioned at opposite sides with the main display area FDA therebetween, and the second auxiliary display area SDA2 and the fourth auxiliary display area SDA4 may be positioned at opposite sides with the main display area FDA therebetween.

As shown in FIG. 1A, each of the first to fourth auxiliary display areas SDA1, SDA2, SDA3, and SDA4 may include a curved surface which is bent to have a curvature. For example, each of the first auxiliary display area SDA1 and the third auxiliary display area SDA3 may have a curved surface that is bent with respect to a bending axis extending in the x direction, and each of the second auxiliary display area SDA2 and the fourth auxiliary display area SDA4 may have a curved surface that is bent with respect to a bending axis extending in the y direction. The first to fourth auxiliary display areas SDA1, SDA2, SDA3, and SDA4 may have a same curvature or different curvatures. For example, the first auxiliary display area SDA1 and the third auxiliary display area SDA3 may have a same curvature, and the second auxiliary display area SDA2 and the fourth auxiliary display area SDA4 may have a same curvature. For example, the first auxiliary display area SDA1 and the second auxiliary display area SDA2 may have different curvatures from each other. In another example, the first auxiliary display area SDA1 and the second auxiliary display area SDA2 may have a same curvature.

The intermediate display area MDA may be arranged between the main display area FDA and a display apparatus corner area DCA to be described below. In addition, the intermediate display area MDA may be positioned between the auxiliary display area SDA and the display apparatus corner area DCA. The intermediate display area MDA may extend between the main display area FDA and the display apparatus corner area DCA and between the auxiliary display area SDA and the display apparatus corner area DCA. As shown in FIG. 1A, in case that the display apparatus 1 has a quadrangular shape in a plan view, four intermediate display areas MDA may be provided.

In an embodiment, not only the pixels PX are included in the intermediate display area MDA, but also, a driver or the like for providing electrical signals or power to each of the display areas DA may be arranged in the intermediate display area MDA. In some embodiments, the pixels PX positioned in the intermediate display area MDA may be arranged to overlap (e.g., in a plan view) an upper portion of the driver or the like positioned in the intermediate display area MDA. In some embodiments, a pixel circuit for driving the pixels PX positioned in the intermediate display area MDA may be arranged in the main display area FDA, the auxiliary display area SDA, and/or the display apparatus corner area DCA that are adjacent to the intermediate display area MDA.

The display apparatus 1 of FIG. 1A may display an image not only in the main display area FDA, but also in the auxiliary display area SDA and the intermediate display area MDA. Accordingly, a proportion that the display area DA occupies in the display apparatus 1 may increase. In other words, in the display apparatus 1 having a same size, the area of the non-display area NDA may decrease, and the area of the display area DA may increase.

The pixels PX are not arranged in the non-display area NDA, and thus, the non-display area NDA may be an area in which an image is not provided. The non-display area NDA may include a peripheral area PA outside the display area DA. The peripheral area PA may entirely or partially surround the display area DA. A driver or the like for providing electrical signals or power to the display area DA may be arranged in the peripheral area PA.

In an embodiment, the non-display area NDA may include the display apparatus corner area DCA. The display apparatus corner area DCA may be positioned on a corner side where two edges of the main display area FDA, adjacent to each other, meet each other. For example, the display apparatus corner area DCA may be positioned on the corner side where the first edge SD1 meets the second edge SD2 of the main display area FDA, and the display apparatus corner area DCA may be adjacent to the first auxiliary display area SDA1 and the second auxiliary display area SDA2. As shown in FIG. 1A, in case that the display apparatus 1 has a quadrangular shape in a plan view, four display apparatus corner areas DCA may be provided.

Because the display apparatus corner area DCA is positioned between the auxiliary display areas SDA adjacent to each other and having curved surfaces that are bent in different directions from each other, the display apparatus corner area DCA may include a curved surface in which curved surfaces that are bent in multiple directions are continuously arranged. In addition, in case that curvatures of the auxiliary display areas SDA adjacent to each other are different from each other, a curvature of the display apparatus corner area DCA may be gradually changed along an edge of the display apparatus 1. For example, in case that a curvature of the first auxiliary display area SDA1 and a curvature of the second auxiliary display area SDA2 are different from each other, the display apparatus corner area DCA between the first auxiliary display area SDA1 and the second auxiliary display area SDA2 may have a curvature that is gradually changed according to a position of the display apparatus corner area DCA.

Although an embodiment is described through the first auxiliary display area SDA1, the second auxiliary display area SDA2, and the display apparatus corner area DCA therebetween, the embodiment may also be similarly applied to the other three display apparatus corner areas DCA.

Figure 1B:
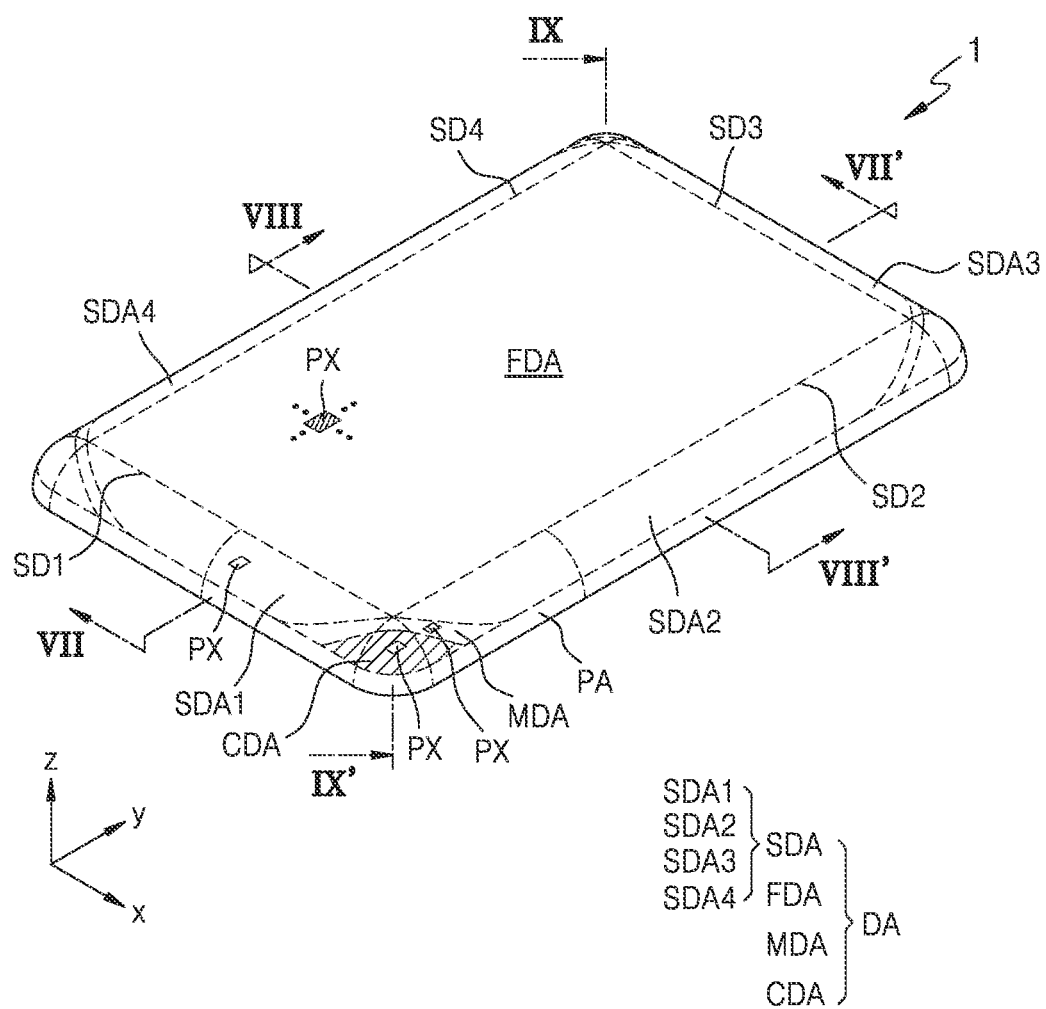
FIG. 1B is a perspective view schematically illustrating a display apparatus according to another embodiment.

FIG. 1B is a perspective view schematically illustrating a display apparatus 1 according to another embodiment. The descriptions already provided with reference to FIG. 1A are omitted, and only differences therebetween are mainly described below.

Referring to FIG. 1B, the display area DA may include the main display area FDA, the auxiliary display area SDA, the intermediate display area MDA, and a corner display area CDA. Pixels PX may be arranged in each of the main display area FDA, the auxiliary display area SDA, the intermediate display area MDA, and the corner display area CDA. Descriptions of the main display area FDA and the auxiliary display area SDA are provided above with reference to FIG. 1A, and thus are omitted.

The intermediate display area MDA may be arranged between the main display area FDA and the corner display area CDA to be described below. In addition, the intermediate display area MDA may be positioned between the auxiliary display area SDA and the corner display area CDA. The intermediate display area MDA may extend between the main display area FDA and the corner display area CDA and between the auxiliary display area SDA and the corner display area CDA. As shown in FIG. 1B, in case that the display apparatus 1 has a quadrangular shape in a plan view, four intermediate display areas MDA may be provided. In some embodiments, a pixel circuit for driving the pixels PX positioned in the intermediate display area MDA may be arranged in the main display area FDA, the auxiliary display area SDA, and/or the corner display area CDA that are adjacent to the intermediate display area MDA.

The corner display area CDA may be arranged on the corner side of the display apparatus 1, and may include a curved surface. Here, the corner of the display apparatus 1 may include a portion at which a short side in the first direction (e.g., the x direction or the −x direction) meets a long side in the second direction (e.g., the y direction or the −y direction). As shown in FIG. 1B, in case that the display apparatus 1 has a quadrangular shape in a plan view, four corner display areas CDA may be provided.

The corner display area CDA may be positioned on the corner side where two edges of the main display area FDA meet each other. In other words, the corner display area CDA may be adjacent to two auxiliary display areas SDA. For example, the corner display areas CDA are positioned on the corner side where the first edge SD1 meets the second edge SD2 of the main display area FDA, and may be adjacent to the first auxiliary display area SDA1 and the second auxiliary display area SDA2.

Because the corner display area CDA is positioned between the auxiliary display areas SDA adjacent to each other and having curved surfaces that are bent in different directions from each other, the corner display area CDA may include a curved surface in which curved surfaces that are bent in multiple directions are continuously arranged. In addition, in case that the auxiliary display areas SDA adjacent to each other have different curvatures from each other, a curvature of the corner display area CDA may be gradually changed along the edge of the display apparatus 1. For example, in case that the first auxiliary display area SDA1 and the second auxiliary display area SDA2 have different curvatures from each other, the corner display area CDA between the first auxiliary display area SDA1 and the second auxiliary display area SDA2 may have a curvature that is gradually changed according to a position of the corner display area CDA.

Although an embodiment is described through the first auxiliary display area SDA1, the second auxiliary display area SDA2, and the corner display area CDA therebetween, the embodiment may also be similarly applied to the other three corner display areas CDA.

The display apparatus 1 of FIG. 1B may display an image not only in the main display area FDA, the auxiliary display area SDA, and the intermediate display area MDA, but also in the corner display area CDA. Thus, a proportion occupied by the display area DA in the display apparatus 1 may further increase. In other words, in the display apparatus 1 having a same size, the area of the non-display area NDA may be reduced, and the area of the display area DA may increase. In addition, the display apparatus 1 may include the corner display area CDA, which includes a rounded and curved surface at a corner thereof, and in which an image is displayed, thus improving a sense of aesthetics.

The non-display area NDA of the display apparatus 1 of FIG. 1B may include the peripheral area PA outside the display area DA. In an embodiment, the peripheral area PA may entirely surround the main display area FDA, the four auxiliary display areas SDA, and the four corner display areas CDA.

For convenience of explanation, although the display apparatus 1 of FIG. 1B is described below, as an example, the following descriptions may also be equally applied to the display apparatus 1 of FIG. 1A.

Figure 2:
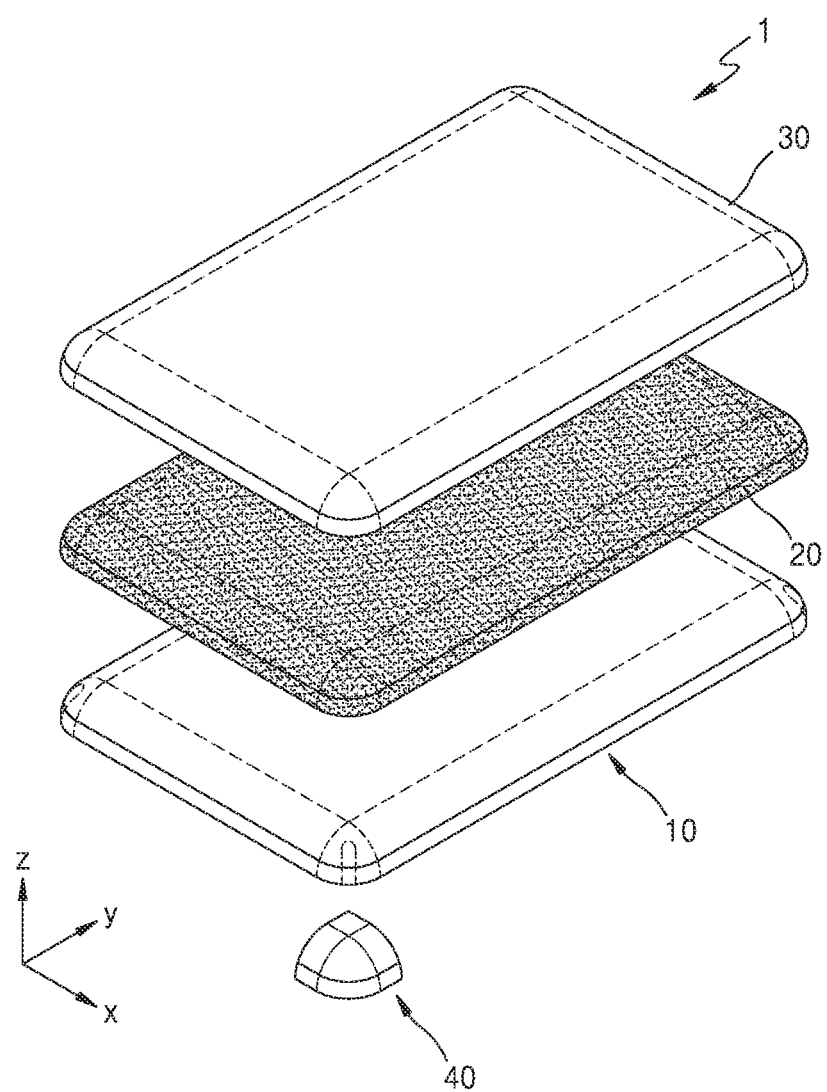
FIG. 2 is an exploded perspective view schematically illustrating a display apparatus according to an embodiment.

FIG. 2 is an exploded perspective view schematically illustrating a display apparatus 1 according to an embodiment.

Referring to FIG. 2, the display apparatus 1 may include a protection member, a display panel 20, and a cover window 30. The cover window 30 may be arranged on a front surface of the display panel 20. Here, the "front surface" of the display panel 20 may be defined as a surface facing a direction in which the display panel 20 provides an image.

In an embodiment, the cover window 30 may be arranged to cover (or overlap, e.g., in a plan view) the front surface of the display panel 20. The cover window 30 may perform a function of protecting the front surface of the display panel 20. In addition, the cover window 30 forms the exterior of the display apparatus 1 and thus may include a flat surface and a curved surface corresponding to the shape of the display apparatus 1 described above.

The cover window 30 may be attached onto the display panel 20 by using an adhesive layer (not shown). For example, the adhesive layer may include an adhesive member such as an optical clear adhesive (OCA) or a pressure sensitive adhesive (PSA).

The cover window 30 may have a high transmittance so as to transmit light emitted from the display panel 20, and may have a small thickness in order to minimize a weight of the display apparatus 1. In addition, the cover window 30 may have a great strength and rigidity in order to protect the display panel 20 from external shock. In an embodiment, the cover window 30 may include a flexible window. The cover window 30 may protect the display panel 20 by being readily bent according to an external force without cracking or the like. In an embodiment, the cover window 30 may include glass, sapphire, or plastic. For example, the cover window 30 may be an ultra-thin glass (UTG®) of which a strength is increased by using a method such as chemical strengthening or thermal strengthening. In an embodiment, the cover window 30 may be UTG® and colorless polyimide (CPI). In an embodiment, the cover window 30 may have a structure in which a flexible polymer layer is arranged on a surface of a glass substrate, or may only include a polymer layer.

An image implemented in the display panel 20 may be provided to a user through the cover window 30 that is transparent. In other words, an image provided by the display apparatus 1 may be understood as being implemented by the display apparatus 1, and thus, the display area DA (see FIG. 1B) and the non-display area NDA (see FIG. 1A) of the display apparatus 1 described above may be understood to be included in the display apparatus 1.

The protection member may include a protective film 10 and a shielding member 40. The protective film 10 may be arranged on a rear surface of the display panel 20. In other words, the protective film 10 may be arranged on the other side of the display panel 20 facing a surface of the display panel 20 on which the cover window 30 is arranged. In this case, the protective film 10 may not only protect the display panel 20 from the outside, but also absorb shock applied thereto from the cover window 30, etc. The protective film 10 is arranged at an edge portion of the cover window 30 and may include a groove provided by removing a portion of the protective film 10.

The shielding member 40 may be arranged at a rounded edge of the cover window 30. In this case, the shielding member 40 may be arranged to shield the groove of the protective film 10. For example, the shielding member 40 may be formed as a portion of a sphere, etc. and arranged on a rear surface of the protective film 10.

Figure 3:
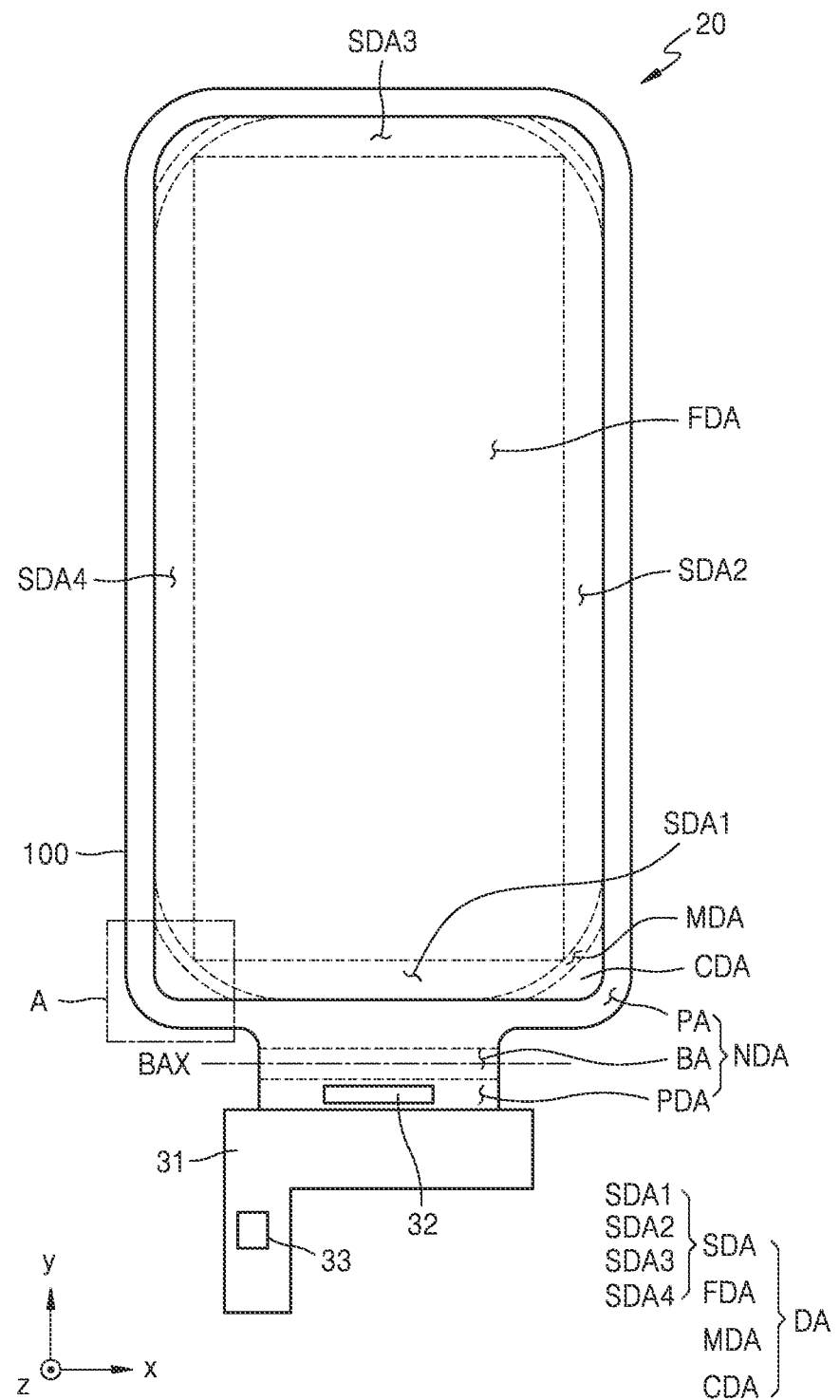
FIG. 3 is a plan view schematically illustrating a portion of a display panel provided in a display apparatus, according to an embodiment.

FIG. 3 is a plan view schematically illustrating a portion of a display panel 20 provided in a display apparatus, according to an embodiment.

Referring to FIG. 3, the display area DA and the non-display area NDA of the display panel 20 may respectively correspond to the display area DA and the non-display area NDA of the display apparatus 1 (see FIG. 1A or 1B) described with reference to FIG. 1A or 1B. For example, the display panel 20 provided in the display apparatus 1 (see FIG. 1A) shown in FIG. 1A may include the display area DA and the non-display area NDA. The display area DA of the display panel 20 may include the main display area FDA, the auxiliary display area SDA, and the intermediate display area MDA. In addition, the non-display area NDA of the display panel 20 may include a non-display area corresponding to the display apparatus corner area DCA, the peripheral area PA outside the display area DA, a bending area BA arranged at a side of the peripheral area PA, and a pad area PDA that is spaced apart from the peripheral area PA with the bending area BA therebetween. In another example, the display panel 20 provided in the display apparatus 1 shown in FIG. 1B may include the display area DA and the non-display area NDA. The display area DA of the display panel 20 may include the main display area FDA, the auxiliary display area SDA, the intermediate display area MDA, and the corner display area CDA. The non-display area NDA of the display panel 20 may include the peripheral area PA outside the display area DA, the bending area BA arranged at a side of the peripheral area PA, and the pad area PDA that is spaced apart from the peripheral area PA with the bending area BA therebetween. For convenience of explanation, a case in which the peripheral area PA completely surrounds the display area DA, as shown in FIG. 3, is described below.

In an embodiment, the display panel 20 may be bent with respect to a bending axis BAX in the bending area BA so that the display area DA and the pad area PDA overlap each other in a thickness direction (e.g., a z direction) of the display panel 20. In other words, the pad area PDA may be bent to overlap the display area DA on a rear side of the display panel 20. Therefore, in the display apparatus 1 that is completed, the area of the non-display area NDA may be reduced, and the proportion occupied by the display area DA of the display apparatus 1 may be increased.

A display driving part 32 and a display circuit board 31 may be arranged in the pad area PDA. The display driving part 32 may receive control signals and power voltages and generate and output signals and voltages for driving the display panel 20. The display driving part 32 may include an integrated circuit (IC).

The display circuit board 31 may be electrically connected to the display panel 20. For example, although not shown in FIG. 3, the display circuit board 31 may be electrically connected to a pad part (not shown) positioned in the pad area PDA via an anisotropic conductive film.

The display circuit board 31 may be a flexible printed circuit board (FPCB) that is bendable or a rigid printed circuit board (PCB) that is rigid and not readily bendable, and in some embodiments, may be a composite PCB including both the rigid PCB and the FPCB.

A sensor driving part 33 may be arranged on the display circuit board 31. The sensor driving part 33 may include an IC. The sensor driving part 33 may be attached to or built in the display circuit board 31. The sensor driving part 33 may be electrically connected to sensing electrodes of a touch sensing layer of the display circuit board 31 through the display circuit board 31.

In addition, pixel circuits of the display panel 20, a scan driving part, and a power supply part (not shown) for applying voltages for driving the display driving part 32 may be further arranged on the display circuit board 31. In some embodiments, the power supply part may be integral with the display driving part 32, and in this case, the display driving part 32 and the power supply part may be implemented as a single IC.

In addition, the display circuit board 31 may be electrically connected to a main circuit board (not shown). The main circuit board may include a main processor including at least one of a central processing unit (CPU), a graphics processing unit (GPU), a memory, a communication chip, a digital signal processor (DSP), an in-system programming (ISP) device, and various types of interfaces, such as an application processor (AP).

In addition, the display panel 20 includes a substrate 100, and various elements of the display panel 20 may be arranged on the substrate 100. For example, light-emitting elements included in the display area DA, pixel circuits for driving each of the light-emitting elements, signal lines and/or voltage lines configured to provide an electrical signal and/or a voltage to each of the pixel circuits, and driving circuits may be arranged on the substrate 100. The display driving part 32 and the display circuit board 31 described above may also be arranged on the substrate 100. In an embodiment, in case that a line is arranged by drilling a hole in the substrate 100, the display driving part 32 and the display circuit board 31 may be arranged below the substrate 100.

Figure 4A:
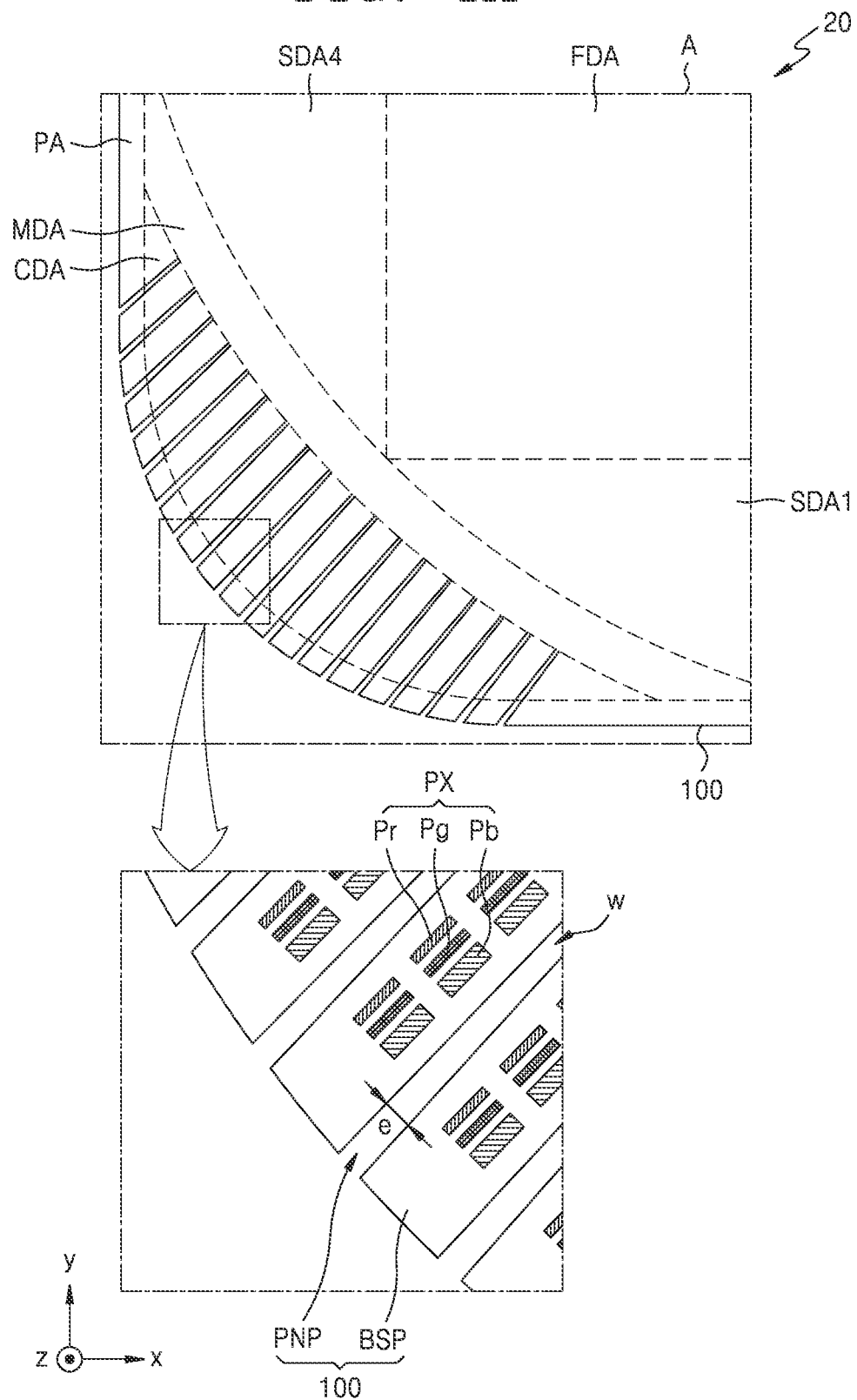
FIGS. 4A and 4B are enlarged plan views schematically illustrating portion A of a display panel according to an embodiment.
Figure 4B:
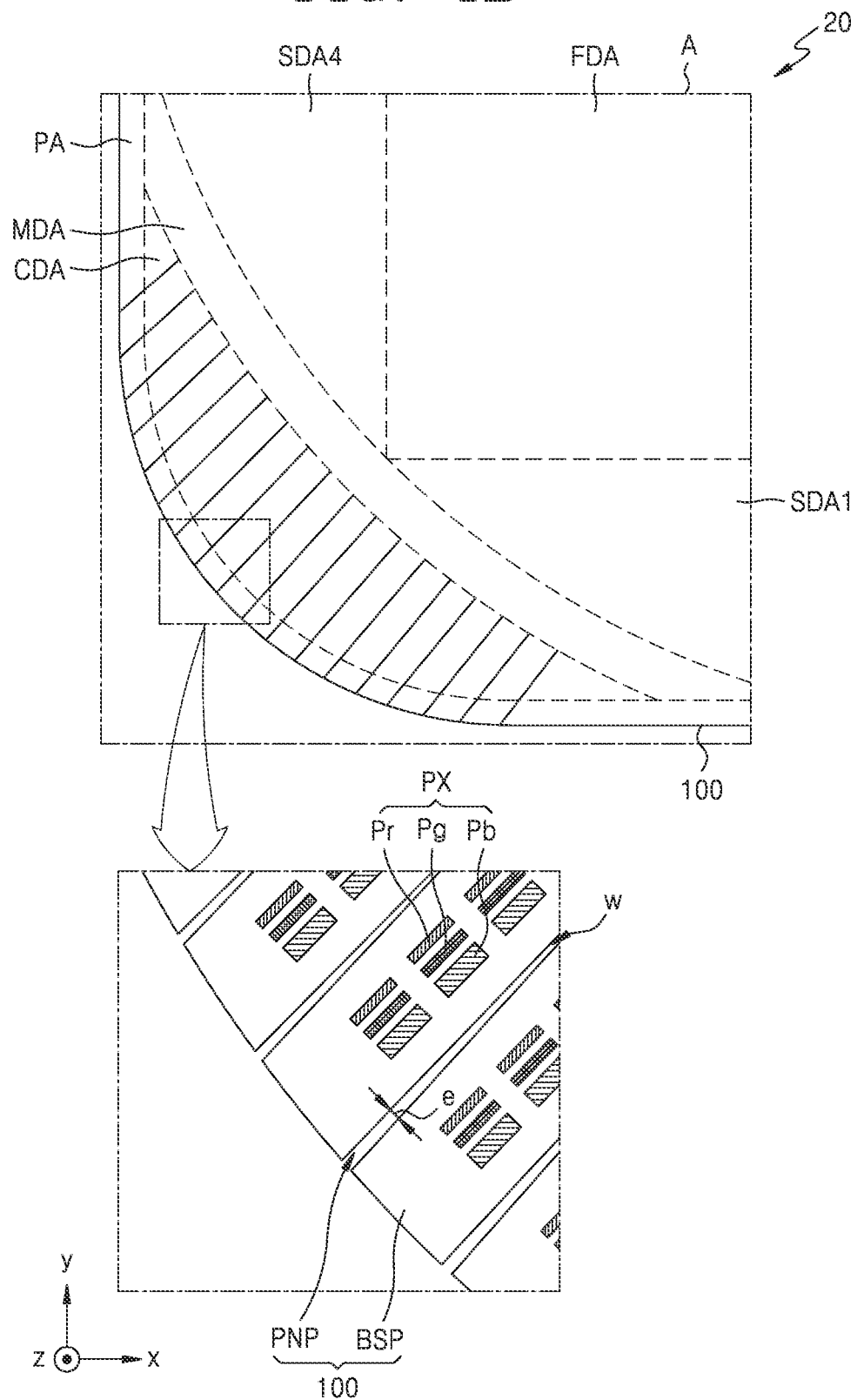

FIGS. 4A and 4B are enlarged plan views schematically illustrating portion A of a display panel 20 according to an embodiment.

Referring to FIG. 4A, a display panel 20 may include a substrate 100 including penetration portions PNP and base portions BSP that are spaced apart from each other by the penetration portions PNP. In an embodiment, the penetration portions PNP and the base portions BSP of the substrate 100 are positioned in the corner display area CDA of the substrate 100, and may extend in an outer direction away from the main display area FDA of the substrate 100.

For example, the base portions BSP may each extend long in the outer direction away from the main display area FDA of the substrate 100. In other words, an extension length of the base portions BSP may be greater than a width of the base portions BSP in a direction intersecting the extension direction. One end portion (or first end portion) of the base portions BSP is connected to a portion of the substrate 100, and the other end portion thereof may form a corner of the substrate 100.

The base portions BSP may be arranged parallel to each other, or may be radially arranged. In an embodiment, in case that the base portions BSP are arranged parallel to each other, an interval e between two base portions BSP adjacent to each other may be constant in the extension direction of the base portions BSP. In an embodiment, in case that the base portions BSP are radially arranged, the interval e between the two base portions BSP adjacent to each other may gradually increase in the extension direction of the base portions BSP. For convenience of explanation, a case in which the base portions BSP are radially arranged, as shown in FIG. 4A, is described below.

Elements such as a pixel circuit, a light-emitting element, and a signal line may be arranged on the base portions BSP. Pixels PX may be arranged on each of the base portions BSP. In an embodiment, the pixels PX may include a red sub-pixel Pr, a green sub-pixel Pg, and a blue sub-pixel Pb. The corner display area CDA may be implemented by the pixels PX on the base portions BSP.

The penetration portion PNP may be positioned between two base portions BSP that are adjacent to each other among the base portions BSP. The penetration portion PNP may be defined by two base portions BSP adjacent to each other and a portion of the substrate 100 connected to the two base portions BSP. The penetration portion PNP may extend in the extension direction of the base portions BSP. The penetration portion PNP may penetrate through an upper surface and a lower surface of the display panel 20 and reduce a weight of the display panel 20. By the penetration portion PNP, two base portions BSP adjacent to each other among the base portions BSP may be spaced apart from each other by an interval e. The penetration portion PNP may provide a space area W between the two base portions BSP adjacent to each other. In other words, each of the penetration portions PNP may overlap the space area W.

Referring to FIG. 4B, in case that an external force (e.g., a force such as bending and compressive force) is applied to the display panel 20, positions of the base portions BSP may be changed, and a shape of the space area W between two base portions BSP adjacent to each other may be changed. Therefore, both contraction and stretching characteristics may be given to the display panel 20. For example, as an external force is applied to the base portions BSP, each of the base portions BSP may be stretched in the extension direction thereof, and as an area of the space area W between the two base portions BSP adjacent to each other is reduced, thereby obtaining a contraction effect. In addition, in some embodiments, the base portions BSP may be bent at curvatures different from each other.

By virtue of the structure of the substrate 100, elements arranged in the corner display areas CDA of the substrate 100 may be prevented from being damaged, even in case that the corner display area CDA of the substrate 100 is bent. Because the elements may be arranged in the corner display areas CDA without damage, the pixel PX may be stably provided in the corner display area CDA. Accordingly, the corner display area CDA of the display apparatus 1 may be implemented, and through this, the display area DA of the display apparatus 1 may be extended.

Figure 5:
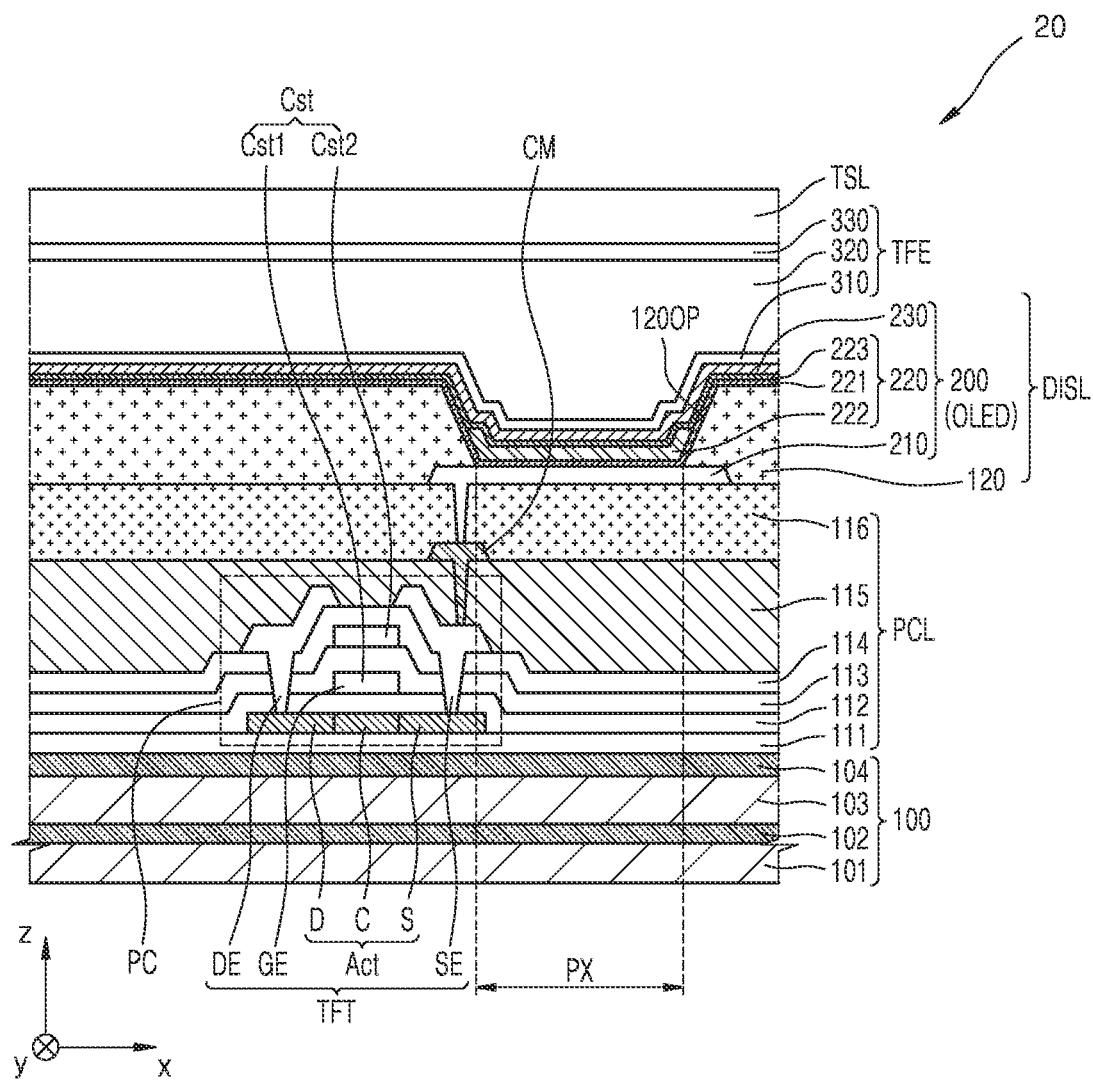
FIG. 5 is a cross-sectional view schematically illustrating a portion of a display panel provided in a display apparatus, according to an embodiment.

FIG. 5 is a cross-sectional view schematically illustrating a portion of a display panel 20 provided in a display apparatus, according to an embodiment.

Referring to FIG. 5, the display panel 20 may include a substrate 100, a pixel circuit layer PCL, a display layer DISL, a thin-film encapsulation layer TFE, and a touch sensing layer TSL.

The substrate 100 may have a multi-layer structure including a base layer and an inorganic layer, and the base layer may include a polymer resin. For example, the substrate 100 may include the base layer including the polymer resin and a barrier layer including an inorganic insulating layer. For example, the substrate 100 may include a first base layer 101, a first barrier layer 102, a second base layer 103, and a second barrier layer 104, which are sequentially stacked. Each of the first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate, cellulose triacetate (TAC), or/and cellulose acetate propionate (CAP). Each of the first barrier layer 102 and the second barrier layer 104 may include an inorganic insulating material such as silicon oxide, silicon oxynitride, or/and silicon nitride. The substrate 100 may be flexible.

The pixel circuit layer PCL may be arranged on the substrate 100. The pixel circuit layer PCL may include a pixel circuit PC including a thin-film transistor TFT and a storage capacitor Cst. In addition, the pixel circuit layer PCL may include a buffer layer 111, a first gate insulating layer 112, a second gate insulating layer 113, an interlayer insulating layer 114, a first planarization insulating layer 115, and a second planarization insulating layer 116, which are arranged below or/and above the elements of the pixel circuit PC.

The buffer layer 111 may reduce or block penetration of foreign materials, moisture, or ambient air into a lower portion of the substrate 100 and may provide a flat surface on the substrate 100. The buffer layer 111 may include an inorganic insulating material such as silicon oxide, silicon oxynitride, and silicon nitride, and may have a single layer or multiple layers including the material described above.

The thin-film transistor TFT on the buffer layer 111 includes a semiconductor layer Act, and the semiconductor layer Act may include polysilicon. As another example, the semiconductor layer Act may include amorphous silicon, an oxide semiconductor, or an organic semiconductor. The semiconductor layer Act may include a channel area C, and a drain area D and a source area S arranged at opposite sides of the channel area C. A gate electrode GE may overlap the channel area C.

The gate electrode GE may include a low-resistance metal material. The gate electrode GE may include a conductive material including at least one of molybdenum (Mo), aluminum (Al), copper (Cu), titanium (Ti), etc., and may have a single layer or multiple layers including the material described above.

The first gate insulating layer 112 between the semiconductor layer Act and the gate electrode GE may include at least one of silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_x$). $ZnO_x$ may include zinc oxide (ZnO) and/or zinc peroxide ($ZnO_2$).

The second gate insulating layer 113 may be provided to cover the gate electrode GE. Similar to the first gate insulating layer 112, the second gate insulating layer 113 may include an inorganic insulating material such as $SiO_2$, $SiN_x$, $SiO_xN_y$, $Al_2O_3$, $TiO_2$, $Ta_2O_5$, $HfO_2$, or $ZnO_x$. $ZnO_x$ may include ZnO and/or $ZnO_2$.

An upper electrode Cst2 of the storage capacitor Cst may be arranged on the second gate insulating layer 113. The upper electrode Cst2 may overlap the gate electrode GE therebelow. In this case, the gate electrode GE and the upper electrode Cst2 overlapping each other with the second gate insulating layer 113 therebetween may form (or constitute) the storage capacitor Cst. In other words, the gate electrode GE may function as a lower electrode Cst1 of the storage capacitor Cst.

As described above, the storage capacitor Cst and the thin-film transistor TFT may be formed to overlap each other. In some embodiments, the storage capacitor Cst may be formed not to overlap the thin-film transistor TFT.

The upper electrode Cst2 may include at least one of Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and Cu, and may have a single layer or multiple layers including the material(s) described above.

The interlayer insulating layer 114 may cover the upper electrode Cst2. The interlayer insulating layer 114 may include at least one of $SiO_2$, $SiN_x$, $SiO_xN_y$, $Al_2O_3$, $TiO_2$, $Ta_2O_5$, $HfO_2$, $ZnO_x$, or the like. The interlayer insulating layer 114 may have a single layer or multiple layers including the inorganic insulating materials described above. $ZnO_x$ may include ZnO and/or $ZnO_2$.

A drain electrode DE and a source electrode SE may be positioned on the interlayer insulating layer 114. The drain electrode DE and the source electrode SE may be respectively electrically connected to the drain area D and the source area S through contact holes of the insulating layers therebelow. Each of the drain electrode DE and the source electrode SE may include a material having high conductivity. Each of the drain electrode DE and the source electrode SE may include a conductive material including Mo, Al, Cu, Ti, etc., and may have a single layer or multiple layers including the material described above. In an embodiment, each of the drain electrode DE and the source electrode SE may have a multi-layer structure of a Ti layer, an Al layer, and another Ti layer.

The first planarization insulating layer 115 may cover the drain electrode DE and the source electrode SE. The first planarization insulating layer 115 may include an organic insulating material such as general-purpose polymers such as poly(methyl methacrylate) (PMMA) or polystyrene (PS), polymer derivatives having phenolic groups, acryl-based polymers, imide-based polymers, aryl ether-based polymers, amide-based polymers, fluorine-based polymers, p-xylene-based polymers, vinyl alcohol-based polymers, and any blends thereof.

The second planarization insulating layer 116 may be arranged on the first planarization insulating layer 115. The second planarization insulating layer 116 and the first planarization insulating layer 115 may include a same material, and the second planarization insulating layer 116 may include an organic insulating material such as general-purpose polymers, such as PMMA or PS, polymer derivatives having phenolic groups, acryl-based polymers, imide-based polymers, aryl ether-based polymers, amide-based polymers, fluorine-based polymers, p-xylene-based polymers, vinyl alcohol-based polymers, and any blends thereof.

The display layer DISL may be arranged on the pixel circuit layer PCL having the structure described above. The display layer DISL may include a light-emitting element 200 and a pixel-defining layer 120. For example, the light-emitting element 200 may include an organic light-emitting diode OLED, and the organic light-emitting diode OLED may include a stacked structure of a pixel electrode 210, an intermediate layer 220, and an opposite electrode 230. For example, the organic light-emitting diode OLED may emit one of red, green, and blue light, or may emit one of red, green, blue, and white light. The organic light-emitting diode OLED emits light through an emission area, and the emission area may be defined as a pixel PX.

The pixel electrode 210 may be arranged on the second planarization insulating layer 116. The pixel electrode 210 may be electrically connected to a contact metal CM arranged on the first planarization insulating layer 115 through a contact hole formed in the second planarization insulating layer 116, and may be electrically connected to the thin-film transistor TFT through the contact metal CM.

The pixel electrode 210 may include a conductive oxide such as indium tin oxide (ITO), indium zinc oxide (IZO), ZnO, $In_2O_3$, indium gallium oxide (IGO), or aluminum zinc oxide (AZO). In an embodiment, the pixel electrode 210 may include a reflective layer including Ag, Mg, Al, Pt, Pd, Au, Ni, Nd, Ir, Cr, or any compounds thereof. In an embodiment, the pixel electrode 210 may further include a layer including ITO, IZO, ZnO, or $In_2O_3$, above or below the reflective layer described above.

The pixel-defining layer 120 having an opening 120OP exposing a central portion of the pixel electrode 210 may be arranged on the pixel electrode 210. The pixel-defining layer 120 may include an organic insulating material and/or an inorganic insulating material. The opening 120OP may define an emission area of light emitted by the light-emitting element 200. For example, a size or width of the opening 120OP may correspond to a size or width of the emission area. Thus, the size and/or width of the pixel PX may be dependent on the size and/or width of a corresponding opening 120OP of the pixel-defining layer 120.

The intermediate layer 220 may include an emission layer 222 provided to correspond to the pixel electrode 210. The emission layer 222 may include a high- or low-molecular weight organic material emitting light of a color. In some embodiments, the emission layer 222 may include an inorganic emission material or quantum dots.

A first functional layer 221 and a second functional layer 223 may be arranged below and above the emission layer 222, respectively. For example, the first functional layer 221 may include a hole transport layer (HTL), or may include an HTL and a hole injection layer (HIL). The second functional layer 223 is an element arranged above the emission layer 222, and may include an electron transport layer (ETL) and/or an electron injection layer (EIL). Similar to the opposite electrode 230 to be described below, the first functional layer 221 and/or the second functional layer 223 may be common layers provided to entirely cover the substrate 100.

The opposite electrode 230 is arranged on the pixel electrode 210, and may overlap the pixel electrode 210. The opposite electrode 230 may include a conductive material having a low work function. For example, the opposite electrode 230 may include a (semi-)transparent layer including Ag, Mg, Al, Pt, Pd, Au, Ni, Nd, Ir, Cr, Li, Ca, or any alloys thereof. In some embodiments, the opposite electrode 230 may further include a layer including ITO, IZO, ZnO, or $In_2O_3$, on the (semi-)transparent layer including the materials described above. The opposite electrode 230 may be integrally provided as a single body to entirely cover the substrate 100.

The display panel 20 includes light-emitting elements 200, and the light-emitting elements 200 may emit light through the pixel PX to provide an image. In other words, the display area DA (see FIG. 1A or 1B) may be defined by the light-emitting elements 200.

The thin-film encapsulation layer TFE may be arranged on the opposite electrode 230 of the light-emitting element 200 and may cover the light-emitting elements 200 of the display layer DISL. The thin-film encapsulation layer TFE includes at least one inorganic encapsulation layer and at least one organic encapsulation layer, and in an embodiment, FIG. 5 illustrates that the thin-film encapsulation layer TFE includes a first inorganic encapsulation layer 310, an organic encapsulation layer 320, and a second inorganic encapsulation layer 330 which are sequentially stacked.

Each of the first inorganic encapsulation layer 310 and the second inorganic encapsulation layer 330 may include one or more inorganic materials among $Al_2O_3$, $TiO_2$, $Ta_2O_5$, $HfO_2$, $ZnO_x$, $SiO_2$, $SiN_x$, and $SiO_xN_y$. ZnO may include ZnO and/or $ZnO_2$. The organic encapsulation layer 320 may include a polymer-based material. The polymer-based material may include acryl-based resin, epoxy-based resin, PI, polyethylene, and the like. In an embodiment, the organic encapsulation layer 320 may include acrylate. The organic encapsulation layer 320 may be provided by curing a monomer or applying a polymer. The organic encapsulation layer 320 may be transparent.

The touch sensing layer TSL may be arranged on the thin-film encapsulation layer TFE. In an embodiment, as shown in FIG. 5, the touch sensing layer TSL may be provided directly on the thin-film encapsulation layer TFE, and in this case, an adhesive layer may not be between the touch sensing layer TSL and the thin-film encapsulation layer TFE.

The touch sensing layer TSL may obtain coordinate information according to an external input, for example, a touch event. For example, the touch sensing layer TSL may include a sensing electrode and signal lines electrically connected to the sensing electrode. The touch sensing layer TSL may detect an external input by using a mutual capacitance method or a self-capacitance method.

Although it is described above that the display apparatus 1 includes an organic light-emitting diode OLED as an emission element, the display apparatus 1 of the disclosure is not limited thereto. In an embodiment, the display apparatus 1 may be a light-emitting display apparatus including an inorganic light-emitting diode, for example, an inorganic light-emitting display. In an embodiment, the display apparatus 1 may be a quantum dot light-emitting display. However, for convenience of explanation, it is described below, that the display apparatus 1 includes the organic light-emitting diode OLED.

Figure 6:
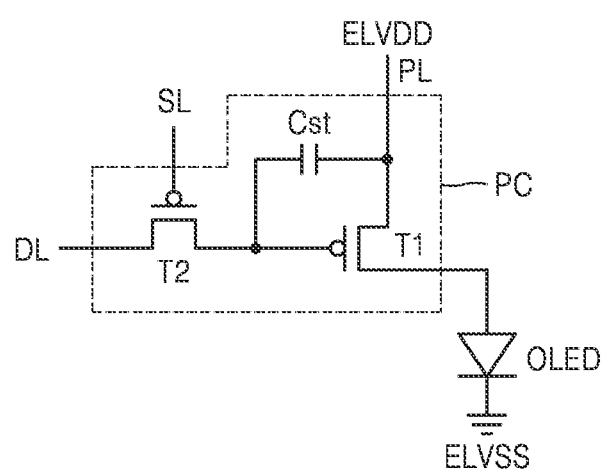
FIG. 6 is a schematic diagram of an equivalent circuit of a pixel circuit included in a display apparatus, according to an embodiment.

FIG. 6 is a schematic diagram of an equivalent circuit of a pixel circuit PC included in a display apparatus, according to an embodiment.

Referring to FIG. 6, the pixel circuit PC may include thin-film transistors TFT (see FIG. 5) and a storage capacitor Cst, and may be electrically connected to an organic light-emitting diode OLED. In an embodiment, the pixel circuit PC may include a driving thin-film transistor T1, a switching thin-film transistor T2, and the storage capacitor Cst.

The switching thin-film transistor T2 is electrically connected to a scan line SL and a data line DL and may transfer, to the driving thin-film transistor T1, a data signal or data voltage received via the data line DL, based on a scan signal or a switching voltage received via the scan line SL. The storage capacitor Cst is electrically connected to the switching thin-film transistor T2 and a driving voltage line PL and may store a voltage corresponding to a difference between a voltage received from the switching thin-film transistor T2 and a first power voltage ELVDD applied to the driving voltage line PL.

The driving thin-film transistor T1 is electrically connected to the driving voltage line PL and the storage capacitor Cst and may control a driving current flowing from the driving voltage line PL to the organic light-emitting diode OLED according to the voltage stored in the storage capacitor Cst. An opposite electrode (e.g., a cathode) of the organic light-emitting diode OLED may receive a second power voltage ELVSS. The organic light-emitting diode OLED may emit light having a luminance according to a driving current.

Although it is described that the pixel circuit PC includes two thin-film transistors and a storage capacitor, the disclosure is not limited thereto. For example, the pixel circuit PC may include three or more thin-film transistors and/or two or more storage capacitors. In an embodiment, the pixel circuit PC may include seven thin-film transistors and a storage capacitor. The number of thin-film transistors and the number of storage capacitors may be variously modified according to a design of the pixel circuit PC. However, for convenience of explanation, a case in which the pixel circuit PC includes two thin-film transistors and a storage capacitor is described below.

Figure 7:
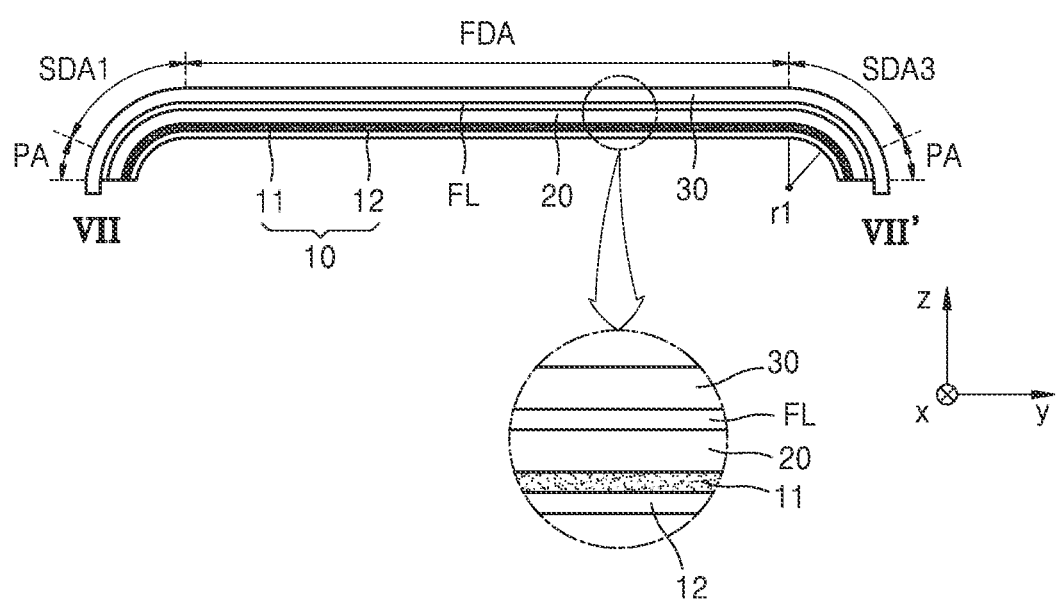
FIG. 7 is a schematic cross-sectional view of the display apparatus of FIG. 1A or 1B, taken along line VII-VII' of FIG. 1A or 1B.
Figure 8:
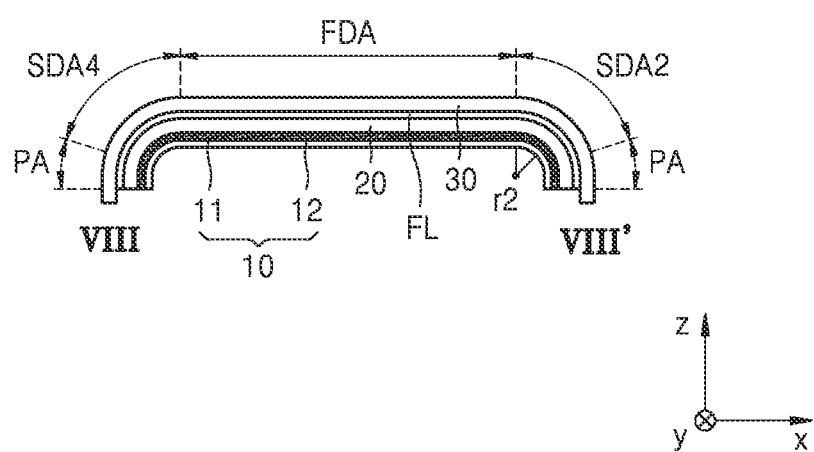
FIG. 8 is a schematic cross-sectional view of the display apparatus of FIG. 1A or 1B, taken along line VIII-VIII' of FIG. 1A or 1B.
Figure 9:
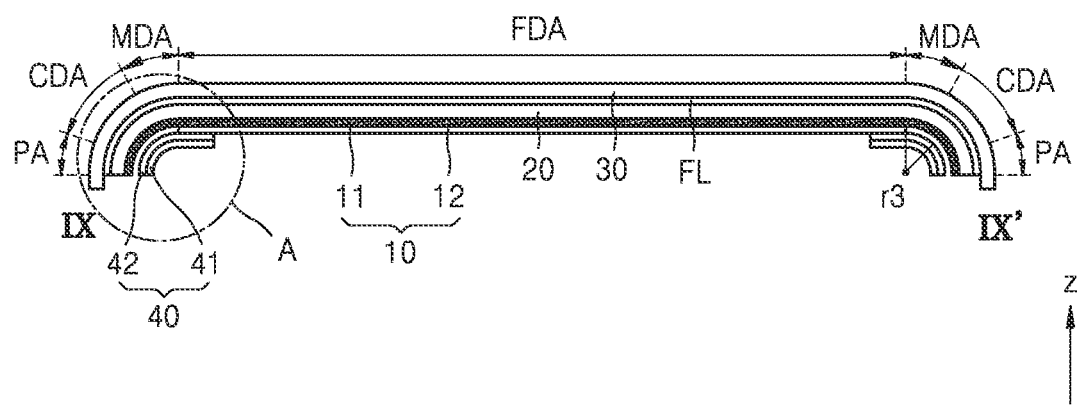
FIG. 9 is a schematic cross-sectional view of the display apparatus of FIG. 1A or 1B, taken along line IX-IX' of FIG. 1A or 1B.

FIG. 7 is a schematic cross-sectional view of the display apparatus 1 of FIG. 1A or 1B, taken along line VII-VII' of FIG. 1A or 1B. FIG. 8 is a schematic cross-sectional view of the display apparatus 1 of FIG. 1A or 1B, taken along line VIII-VIII' of FIG. 1A or 1B. FIG. 9 is a schematic cross-sectional view of the display apparatus 1 of FIG. 1A or 1B, taken along line IX-IX' of FIG. 1A or 1B.

Referring to FIGS. 7 to 9, the display apparatus 1 may include a protection member (not indicated), the display panel 20, and the cover window 30. The protection member may include the protective film 10 and the shielding member 40. In this case, the display panel 20 and the cover window 30 are the same as or similar to those described above, and thus, detailed descriptions thereof are omitted.

A functional layer FL may be attached to a front surface of the display panel 20 in a film shape by using an adhesive member. As the adhesive member, a general adhesive member known in the art may be employed without limitation, and for example, the adhesive member may be an OCA or a PSA.

In an embodiment, the functional layer FL may be an optical functional layer that reduces a reflectance of light (external light) incident thereon toward the display panel 20 from the outside and/or improves a color purity of light emitted from the display panel 20. In this case, the functional layer FL may be a polarization film including a retarder and/or a polarizer. In an embodiment, the retarder may include a λ/2 retarder and/or a λ/4 retarder, but the embodiments are not limited thereto.

The protective film 10 and the cover window 30 may perform a function of protecting the display panel 20.

The display panel 20 may be arranged below the cover window 30. The display area DA of the display panel 20 may include the main display area FDA, the auxiliary display area SDA, and the intermediate display area MDA, as described with reference to FIGS. 1A and 3. In an embodiment, the display area DA of the display panel 20 may include the main display area FDA, the auxiliary display area SDA, the corner display area CDA, and the intermediate display area MDA, as described with reference to FIGS. 1B and 3. For convenience of explanation, a case in which the display area DA includes the main display area FDA, the auxiliary display area SDA, the corner display area CDA, and the intermediate display area MDA is mainly described below, in detail.

The first auxiliary display area SDA1 and the third auxiliary display area SDA3 may be connected (or extended) to the main display area FDA in a second direction (e.g., ±y direction). For example, the first auxiliary display area SDA1 may be connected to the main display area FDA in the +y direction, and the third auxiliary display area SDA3 may be connected to the main display area FDA in the −y direction. The first auxiliary display area SDA1 may be connected to the first edge SD1 of the main display area FDA, and the third auxiliary display area SDA3 may be connected to the third edge SD3 of the main display area FDA.

Each of the first auxiliary display area SDA1 and the third auxiliary display area SDA3 may be bent at an arbitrary curvature radius. In an embodiment, curvature radii of the first auxiliary display area SDA1 and the third auxiliary display area SDA3 may be different from each other. In another example, the curvature radii of the first auxiliary display area SDA1 and the third auxiliary display area SDA3 may be the same as each other. Hereinafter, a case in which the first auxiliary display area SDA1 and the third auxiliary display area SDA3 have a same curvature radius, for example, a first curvature radius r1, is mainly described in detail. In addition, because the first auxiliary display area SDA1 and the third auxiliary display area SDA3 are the same as or similar to each other, the first auxiliary display area SDA1 is mainly described in detail.

The second auxiliary display area SDA2 and the fourth auxiliary display area SDA4 may be connected to the main display area FDA in a first direction (e.g., ±x direction). For example, the second auxiliary display area SDA2 may be connected to the main display area FDA in the +x direction, and the fourth auxiliary display area SDA4 may be connected to the main display area FDA in the −x direction.

Each of the second auxiliary display area SDA2 and the fourth auxiliary display area SDA4 may be bent at an arbitrary curvature radius. In an embodiment, curvature radii of the second auxiliary display area SDA2 and the fourth auxiliary display area SDA4 may be different from each other. In another example, the curvature radii of the second auxiliary display area SDA2 and the fourth auxiliary display area SDA4 may be the same as each other. Hereinafter, a case in which the second auxiliary display area SDA2 and the fourth auxiliary display area SDA4 have a same radius of curvature, for example, a second curvature radius r2, is mainly described in detail. In addition, because the second auxiliary display area SDA2 and the fourth auxiliary display area SDA4 are the same as or similar to each other, the second auxiliary display area SDA2 is mainly described in detail.

In an embodiment, the first curvature radius r1 of the first auxiliary display area SDA1 may be different from the second curvature radius r2 of the second auxiliary display area SDA2. For example, the first curvature radius r1 may be less than the second curvature radius r2. In another example, the first curvature radius r1 may be greater than the second curvature radius r2.

In an embodiment, the first curvature radius r1 of the first auxiliary display area SDA1 may be equal to the second curvature radius r2 of the second auxiliary display area SDA2. Hereinafter, a case in which the first curvature radius r1 is greater than the second curvature radius r2 is mainly described in detail.

Each of the corner display area CDA and the intermediate display area MDA may extend from a corner of the main display area FDA and be bent. In other words, as described above, the corner display area CDA and the intermediate display area MDA may be a corner of the display area DA, and may include a portion where a long side in the second direction (e.g., the ±y direction) and a short side in the first direction (e.g., the ±x direction) contact (or are in contact with) each other.

At least one of the corner display area CDA and the intermediate display area MDA may have a curved shape having a third curvature radius r3. In this case, the third curvature radius r3 may be constant in the corner display area CDA and the intermediate display area MDA. In an embodiment, the third curvature radius r3 of at least one of the corner display area CDA and the intermediate display area MDA may be provided in plurality. The corner display area CDA and the intermediate display area MDA may have third curvature radii r3. In other words, the third curvature radius r3 of the corner display area CDA and the intermediate display area MDA may vary. For example, the third curvature radii r3 of the corner display area CDA and the intermediate display area MDA may respectively correspond to arbitrary curvature radii within a vector sum (r1+r2) of the first curvature radius r1 of the first auxiliary display area SDA1 and the second curvature radius r2 of the second auxiliary display area SDA2. In other words, the third curvature radius r3 may vary within the vector sum (r1+r2) of the first curvature radius r1 and the second curvature radius r2.

In addition, the display apparatus 1 may be manufactured by sequentially attaching the display panel 20 and the protective film 10 to the cover window 30 that is bent at a preset curvature radius. Although it is described above that the display panel 20 is bent at the first curvature radius r1, the second curvature radius r2, and the third curvature radius r3, the embodiment may be applied in the same way to the cover window 30 and the protective film 10.

The protective film 10 may be attached to a lower portion of the display panel 20. The protective film 10 may be arranged on a rear surface (e.g., in a −z direction) of the display panel 20. The protective film 10 may include a first layer 11 and a second layer 12, and may be attached to the lower portion of the display panel 20 through the first layer 11 including an adhesive layer.

In an embodiment, the second layer 12 of the protective film 10 may at least partially expose a portion of the first layer 11 of the protective film 10 corresponding to the corner display area CDA of the display panel 20. In an embodiment, the second layer 12 of the protective film 10 may at least partially expose a portion of the first layer 11 of the protective film 10 corresponding to the corner display area CDA and the intermediate display area MDA of the display panel 20. In another example, the second layer 12 of the protective film 10 may at least partially expose a portion of the first layer 11 of the protective film 10 corresponding to the corner display area CDA of the display panel 20. The portion of the protective film 10 corresponding to the corner display area CDA of the display panel 20 may correspond to a corner area CA of the protective film 10 shown in FIG. 10 to be described below. The second layer 12 may at least partially expose the corner area CA of the first layer 11.

The shielding member 40 may shield the corner area CA of the first layer 11 arranged on the second layer 12. In an embodiment, the shielding member 40 may contact only the second layer 12. In an embodiment, the shielding member 40 may contact not only the second layer 12 but also at least a portion of the corner area CA of the first layer 11 exposed by the second layer 12.

The shielding member 40 described above may include a first shielding member layer 41 as a body portion and a second shielding member layer 42 as a contact layer. In this case, the first shielding member layer 41 may provide a supporting force to a certain extent, and the second shielding member layer 42 may provide conductivity as well as an adhesive force.

The first shielding member layer 41 may include silicon, rubber, and/or plastic (e.g., including PC, PMMA, etc.). In this case, the first shielding member layer 41 may provide a waterproof property.

The second shielding member layer 42 may provide adhesive properties and conductivity. In this case, the second shielding member layer 42 may include a metal such as Cu, Mg, and Al. In addition, the second shielding member layer 42 may include an adhesive. In this case, the second shielding member layer 42 may be a mixture of the metal and the adhesive. In an embodiment, the second shielding member layer 42 may be in a state where a metal layer and an adhesive layer are stacked. In this case, the metal layer may be arranged to contact the first shielding member layer 41, and the adhesive layer may be arranged in a direction opposite to that of the first shielding member layer 41 with respect to the metal layer. In this case, the second shielding member layer 42 or the metal layer of the second shielding member layer 42 may contact at least one of the first layer 11 and the second layer 12. In an embodiment, the second shielding member layer 42 may include at least two layers. For example, the second shielding member layer 42 may include a blocking layer in contact with the first shielding member layer 41 and a conductive layer in contact with the blocking layer. In this case, the blocking layer may be the same as or similar to a first functional layer 11a shown in FIG. 16 to be described below. In addition, the conductive layer may include a layer including a thin metal film or metal particles, as described above.

The first shielding member layer 41 and the second shielding member layer 42 described above may be manufactured in various ways. For example, in an embodiment, the first shielding member layer 41 may be manufactured by injection molding, compression molding, etc., and then, the second shielding member layer 42 may be manufactured as a thin metal film. The first shielding member layer 41 and the second shielding member layer 42 may be bonded to each other by arranging an adhesive therebetween. In an embodiment, the first shielding member layer 41 may be integrally provided as a single body on the second shielding member layer 42 by a die casting method, after the second shielding member layer 42 is molded into a thin metal film. In an embodiment, the shielding member 40 may be manufactured by depositing or spraying the first shielding member layer 41 on the second shielding member layer 42, after the second shielding member layer 42 is molded. In an embodiment, after the first shielding member layer 41 is formed, the second shielding member layer 42 may be arranged on the first shielding member layer 41 by arranging metal particles in an adhesive and applying the metal particles on the first shielding member layer 41.

In case that the shielding member 40 described above is arranged, a strength of portions of the corner display area CDA and the main display area FDA may be reinforced by shielding the portion of the first layer 11 arranged in the corner display area CDA and the main display area FDA by using the shielding member 40.

In addition, by arranging metal in the corner display area CDA and the main display area FDA, malfunction of the display panel 20 due to static electricity or the like may be effectively reduced.

Figure 10:
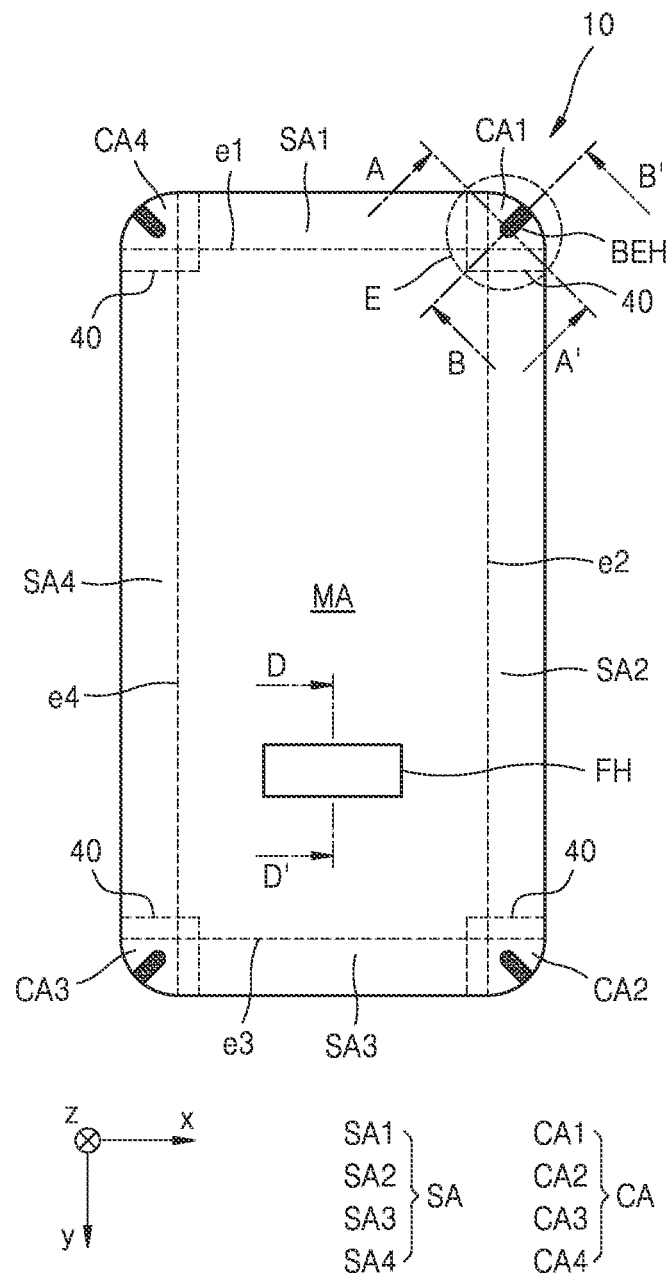
FIG. 10 is a plan view schematically illustrating a protection member according to an embodiment.

FIG. 10 is a plan view schematically illustrating a protection member according to an embodiment.

Referring to FIG. 10, a protective film 10 may include a central area MA, a side area SA, and a corner area CA.

The central area MA corresponds to a central portion of the protective film 10. The central area MA may have a rectangular shape when viewed from a direction (e.g., a z direction) perpendicular to the protective film 10, as shown in FIG. 10.

The side area SA may be connected (or extended) to an edge of the central area MA. The side area SA may extend from the edge of the central area MA. For example, a first side area SA1 may be connected to a first edge e1 of the central area MA, a second side area SA2 may be connected to a second edge e2 of the central area MA, a third side area SA3 may be connected to a third edge e3 of the central area MA, and a fourth side area SA4 may be connected to a fourth edge e4 of the central area MA. In this case, as shown in FIG. 10, the first edge e1 and the second edge e2 may intersect each other, the first edge e1 and the third edge e3 may be parallel to each other, and the second edge e2 and the fourth edge e4 may be parallel to each other.

The corner area CA may be positioned at a corner of the protective film 10. The corner area CA may connect the side areas SA to each other. For example, a first corner area CA1 may connect the first side area SA1 and the second side area SA2 to each other, a second corner area CA2 may connect the second side area SA2 and the third side area SA3 to each other, a third corner area CA3 may connect the third side area SA3 and the fourth side area SA4 to each other, and a fourth corner area CA4 may connect the first side area SA1 and the fourth side area SA4 to each other.

In an embodiment, as shown in FIG. 10, an edge of the corner area CA may be convex. The corner area CA may include a curved line at an edge thereof and a straight line in contact with the side area SA. The corner area CA may have a sectoral shape. The protective film 10 may have a rounded rectangular shape in a plan view.

In this case, in an embodiment, at least a portion of the corner area CA may be in a state of being removed or cut out. For example, a cutout groove BEH provided by removing at least a portion of the second layer 12 (see FIG. 9) may be provided in the corner area CA. The cutout groove BEH may have various shapes. For example, the cutout groove BEH is formed in a straight line, and an end thereof may be round. In addition, the cutout groove BEH may have a triangular shape. In an embodiment, the cutout groove BEH may have a polygonal shape such as a quadrangle.

In an embodiment, the cutout groove BEH may be arranged not only in the corner area CA, but also in the side area SA adjacent to the corner area CA. The cutout groove BEH may be arranged at a boundary portion of the corner area CA and the side area SA, or may be arranged in the side area SA adjacent to the boundary portion of the corner area CA and the side area SA.

The cutout groove BEH described above may be arranged in each of the corner areas CA. For example, the cutout groove BEH may be arranged in each of the first corner area CA1, the second corner area CA2, the third corner area CA3, and the fourth corner area CA4.

The shielding member 40 described above may be arranged on the cutout groove BEH described above. In this case, the shielding member 40 may be arranged to completely shield the cutout groove BEH when viewed from a rear surface of the display apparatus 1.

FIG. 10 illustrates that the cutout groove BEH is provided in singularity in the corner area CA. However, the disclosure is not limited thereto, and the cutout groove BEH may be provided in plurality. In case that cutout grooves BEH are provided, in an embodiment, the cutout groove BEH may be provided in plurality in the corner area CA. In an embodiment, some of the cutout grooves BEH may be arranged in the corner area CA, and other ones of the cutout grooves BEH may be arranged in the side area SA.

In case that the cutout grooves BEH are arranged, a shielding member 40 may be provided to shield all of the cutout grooves BEH. In an embodiment, shielding members 40 may be provided, one of the shielding members 40 may shield one of the cutout grooves BEH, and another one of the shielding members 40 may shield another one of the cutout grooves BEH. In an embodiment, in case that shielding member 40 is provided in plurality, the shielding members 40 may be arranged to correspond to the cutout grooves BEH, respectively, such that a shielding member 40 shields a cutout groove BEH.

In addition, in the above case, the shielding members 40 may be arranged in various shapes. For example, the shielding member 40 may be arranged only in the corner area CA. In an embodiment, the shielding member 40 may be arranged to shield the corner area CA and the side area SA adjacent to the corner area CA. In an embodiment, the shielding member 40 may be arranged to shield the corner area CA and the side area SA and the central area MA adjacent to the corner area CA.

Hereinafter, a shape of the shielding member 40 arranged in the first corner area CA1 described above is described in detail.

Figure 11A:
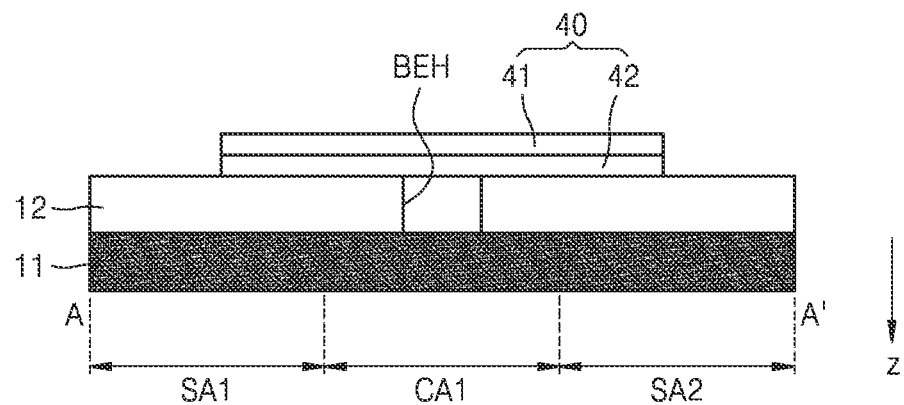
FIG. 11A is a schematic cross-sectional view of a portion of the protection member of FIG. 10, taken along line A-A' of FIG. 10.
Figure 11B:
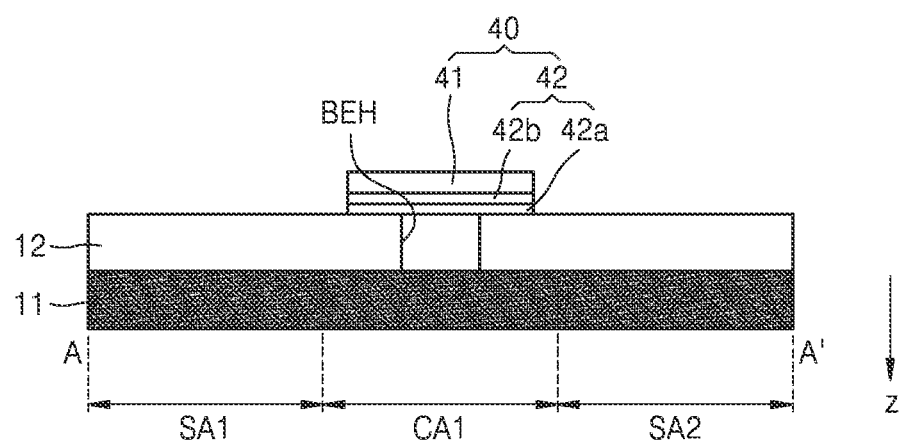
FIG. 11B is a schematic cross-sectional view of a portion of the protection member of FIG. 10, taken along line A-A' of FIG. 10.

FIG. 11A is a schematic cross-sectional view of a portion of the protection member of FIG. 10, taken along line A-A' of FIG. 10. FIG. 11B is a schematic cross-sectional view of a portion of the protection member of FIG. 10, taken along line A-A' of FIG. 10.

Referring to FIG. 11A, the protective film 10 may include the first layer 11 and the second layer 12 on the first layer 11. Each of the first layer 11 and the second layer 12 may include at least one of a light absorbing member, a buffering member, a heat-dissipating member, and a light-shielding member. For example, the first layer 11 may include a buffering member and a light-shielding member, and the second layer 12 may include a heat-dissipating member including metal.

An adhesive may be between the first layer 11 and the second layer 12. For example, at least one of an optical clear resin (OCR), an OCA, and a PSA may be between the first layer 11 and the second layer 12.

In an embodiment, the second layer 12 may expose at least a portion of the first corner area CA1 of the first layer 11. For example, as shown in FIG. 11A, the second layer 12 may cover (or overlap, e.g., in a plan view) the first side area SA1 and the second side area SA2 of the first layer 11 and expose the first corner area CA1 of the first layer 11. In this case, the second layer 12 includes the cutout groove BEH provided by removing a portion of the second layer 12, and at least a portion of the first corner area CA1 of the first layer 11 may be exposed to the outside through the cutout groove BEH.

The second layer 12 may cover the central area MA of the first layer 11. Although the first side area SA1, the second side area SA2, and the first corner area CA1 are mainly described, the embodiment may be applied in the same way to the third side area SA3, the fourth side area SA4, the second corner area CA2, the third corner area CA3, and the fourth corner area CA4.

The protective film 10 may be attached to the rear surface of the display panel 20. In this case, the first corner area CA1 of the protective film 10 may correspond to the corner display area CDA and the intermediate display area MDA of the display panel 20. The first corner area CA1 of the protective film 10 arranged below the display panel 20 may be bent together according to a curvature radius corresponding to a curvature radius of the corner display area CDA and the intermediate display area MDA of the display panel 20.

The shielding member 40 may be arranged on the second layer 12 described above. In this case, the shielding member 40 may include the first shielding member layer 41 and the second shielding member layer 42, as described above.

The shielding member 40 described above may be arranged to completely shield the cutout groove BEH, and an edge (e.g., a planar edge of the shielding member 40) of the shielding member 40 may be arranged on the second layers 12 which are adjacent to the cutout groove BEH and are spaced apart from each other. In this case, as shown in FIG. 11A, one of the edges of the shielding member 40 may be arranged on the second layer 12 arranged in the first side area SA1, and another one of the edges of the shielding member 40 may be arranged on the second layer 12 arranged in the second side area SA2. In this case, the shielding member 40 may shield a portion of the first side area SA1, the first corner area CA1, and a portion of the second side area SA2.

In an embodiment, as shown in FIG. 11B, all of the edges of the shielding member 40 may be arranged in the first corner area CA1. In this case, the shielding member 40 may not shield the first side area SA1 and the second side area SA2.

The second shielding member layer 42 of the shielding member 40 may include a blocking layer 42b and a conductive layer 42a. In this case, the blocking layer 42b and the conductive layer 42a may be the same as or similar to those described above. The conductive layer 42a may electrically connect the second layers 12 to each other, and the second layers 12 may be spaced apart from each other with the cutout groove BEH therebetween. In this case, a structure of the shielding member 40 shown in FIG. 11B is not limited to FIG. 11B, and may be included in all of embodiments that are described above or to be described below.

Although not shown in the drawings, the shielding member 40 may be arranged in a way identical or similar to the first corner area CA1 in a second corner area (not shown), a third corner area (not shown), and a fourth corner area (not shown).

Figure 11C:
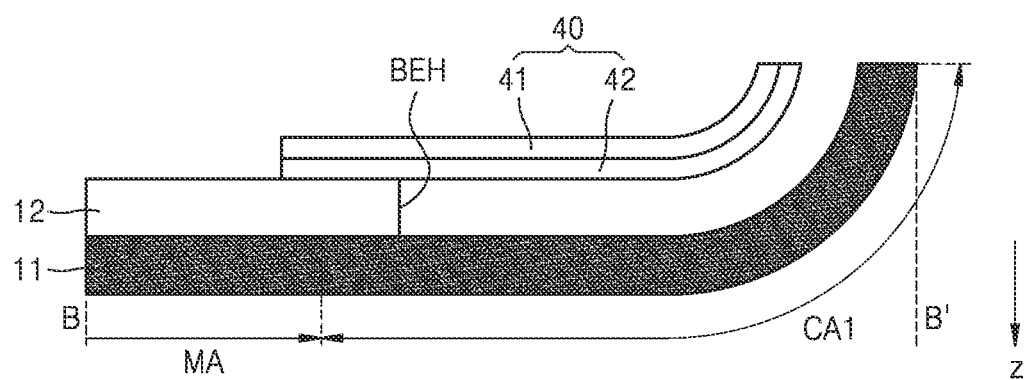
FIG. 11C is a schematic cross-sectional view of a portion of the protection member of FIG. 10, taken along line B-B' of FIG. 10.
Figure 11D:
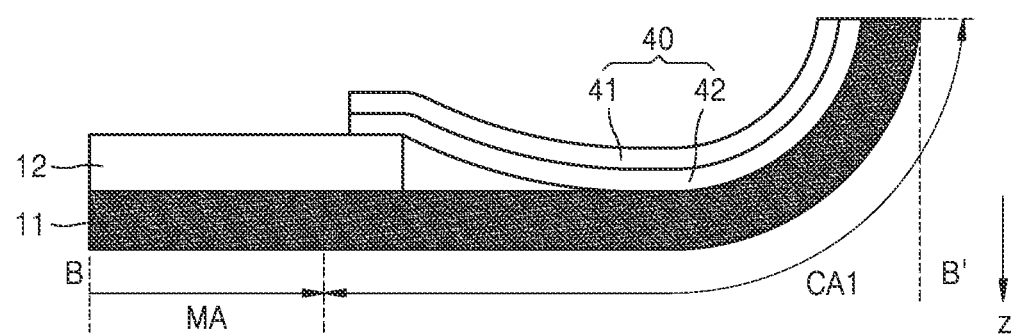
FIG. 11D is a schematic cross-sectional view of a portion of the protection member of FIG. 10, taken along line B-B' of FIG. 10.

FIG. 11C is a schematic cross-sectional view of a portion of the protection member of FIG. 10, taken along line B-B' of FIG. 10. FIG. 11D is a schematic cross-sectional view of a portion of the protection member of FIG. 10, taken along line B-B' of FIG. 10.

Referring to FIG. 11C, in case that the shielding member 40 is arranged on the second layer 12 as shown in FIGS. 11A and 11B, the shielding member 40 may shield at least a portion of the central area MA and the first corner area CA1. In this case, one of edges of the shielding member 40 may be arranged in the central area MA. The shielding member 40 may not contact the first layer 11 exposed through the cutout groove BEH. In other words, as shown in FIGS. 11A and 11B, because a portion of the edges of the shielding member 40 is seated on the second layer 12 so that the shielding member 40 maintains a flat state, the shielding member 40 may not contact the first layer 11 in the cutout groove BEH. In an embodiment, the shielding member 40 may contact the first layer 11 exposed through the cutout groove BEH, as shown in FIG. 11D.

In an embodiment, in case that the shielding member 40 is arranged on the second layer 12, as shown in FIGS. 11A and 11B, the first layer 11 exposed through the cutout groove BEH and the shielding member 40 may be arranged as shown in FIG. 11D. In this case, an edge of the shielding member 40 may not be arranged in the central area MA, but may be arranged in the first corner area CA1. In an embodiment, a portion of the edge of the shielding member 40 may be arranged in the central area MA, as shown in FIG. 11C.

Although not shown in the drawings, the shielding member 40 may be arranged in a way identical or similar to the first corner area CA1 in a second corner area (not shown), a third corner area (not shown), and a fourth corner area (not shown).

Figure 12A:
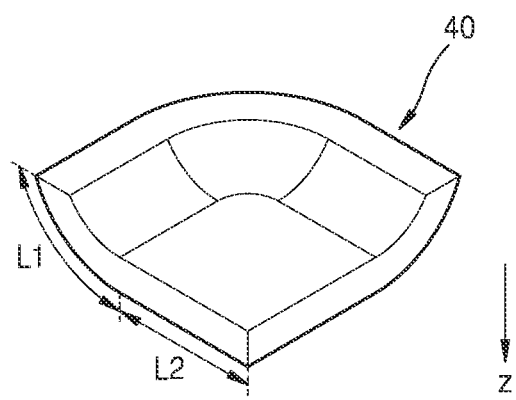
FIG. 12A is a perspective view schematically illustrating a shielding member of a protection member according to an embodiment.
Figure 12B:
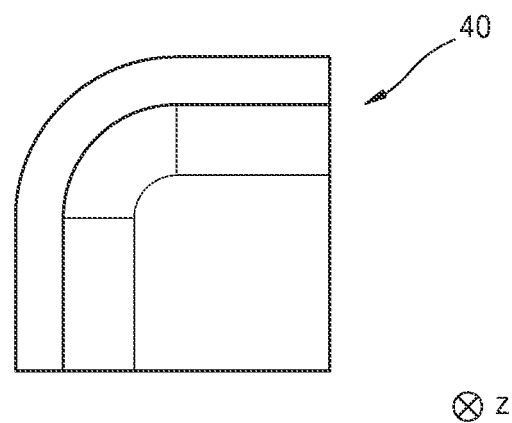
FIG. 12B is a plan view schematically illustrating the shielding member shown in FIG. 12A.
Figure 12C:
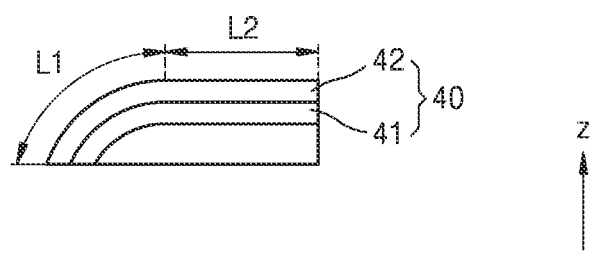
FIG. 12C is a cross-sectional view schematically illustrating the shielding member shown in FIG. 12A.

FIG. 12A is a schematic perspective view illustrating a shielding member 40 of a protection member according to an embodiment. FIG. 12B is a schematic plan view illustrating the shielding member 40 shown in FIG. 12A. FIG. 12C is a schematic cross-sectional view illustrating the shielding member 40 shown in FIG. 12A.

Referring to FIGS. 12A to 12C, the shielding member 40 may include a first shielding member area L1 and a second shielding member area L2. In this case, a portion of the first shielding member area L1 may be rounded to correspond to each of the corner areas CA (see FIG. 10) described above. In addition, another portion of the first shielding member area L1 may be arranged to correspond to the side area SA (see FIG. 10). In this case, a curvature radius of the portion of the first shielding member area L1 may correspond to a curvature radius of the corner area CA. For example, the curvature radii of the portion of the first shielding member area L1 and the corner area CA may be the same or similar. In addition, a curvature radius of the other portion of the first shielding member area L1 may correspond to that of the side area SA.

The second shielding member area L2 may be connected (or extended) to the first shielding member area L1. In this case, the second shielding member area L2 may form a flat surface. In this case, the second shielding member area L2 may be arranged to correspond to the central area MA.

The shielding member 40 described above may be formed in a concave shape. In this case, a convex outer surface of the shielding member 40 may be arranged to correspond to a concave corner portion of the display panel 20 shown in FIG. 2. For example, the shielding member 40 may be arranged to correspond to the corner area CA shown in FIG. 10. In this case, as described above, the shielding member 40 may shield the corner area CA and the side area SA and the central area MA adjacent to the corner area CA.

The first shielding member layer 41 and the second shielding member layer 42 may be arranged in the shielding member 40, as described above. In this case, the second shielding member layer 42 may contact the protective film 10 shown in FIG. 10.

In case that a cutout groove BEH is arranged in the corner area CA or in case that cutout grooves BEH are arranged in the corner area CA, the shielding member 40 described above may shield all of the cutout grooves BEH.

Figure 13A:
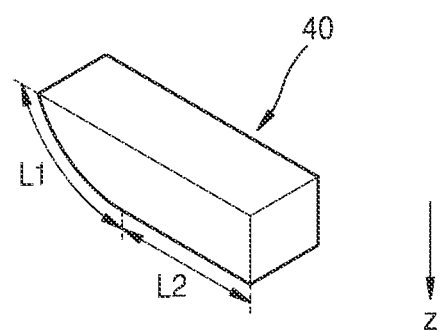
FIG. 13A is a perspective view schematically illustrating a shielding member of a protection member according to an embodiment.
Figure 13B:
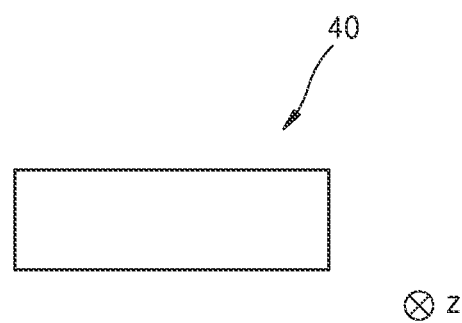
FIG. 13B is a plan view schematically illustrating the shielding member shown in FIG. 13A.
Figure 13C:
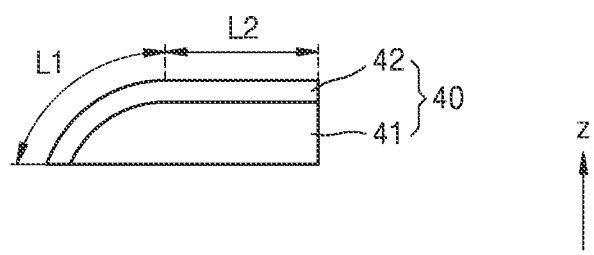
FIG. 13C is a cross-sectional view schematically illustrating the shielding member shown in FIG. 13A.

FIG. 13A is a schematic perspective view illustrating a shielding member 40 of a protection member according to an embodiment. FIG. 13B is a schematic plan view illustrating the shielding member 40 shown in FIG. 13A. FIG. 13C is a schematic cross-sectional view illustrating the shielding member 40 shown in FIG. 13A.

Referring to FIGS. 13A to 13C, the shielding member 40 may include the first shielding member layer 41 and the second shielding member layer 42. In this case, a surface of the shielding member 40 may be rounded, and a surface facing the rounded surface may be formed flat. In addition, surfaces connecting the rounded surface and the surface facing the rounded surface to each other may be formed flat.

In the above case, the shielding member 40 may be arranged to shield the cutout groove BEH of the corner area CA. In this case, in case that the cutout groove BEH is provided in singularity, the shielding member 40 may shield a cutout groove BEH. In an embodiment, in case that the cutout groove BEH is provided in plurality, the shielding member 40 may shield at least one of the cutout grooves BEH.

In the above case, the shielding member 40 may be arranged to correspond to the corner area CA of FIG. 10. In this case, a flat surface of the shielding member 40 may be supported by contact a case of the display apparatus 1 or another structure, thereby supporting the corner display area CDA of the display apparatus 1. In addition, the shielding member 40 may not only absorb force applied to the corner display area CDA, but also shield the cutout groove BEH, thereby preventing foreign materials from entering the corner display area CDA. The shielding member 40 may be connected to the second layer 12 to thereby prevent excessive charges from gathering in the cutout groove BEH of the second layer 12.

A width (e.g., a short side of FIG. 13B) of the shielding member 40 described above may be maintained to be constant in a longitudinal direction (e.g., a long side of FIG. 13B) of the shielding member 40.

Figure 14A:
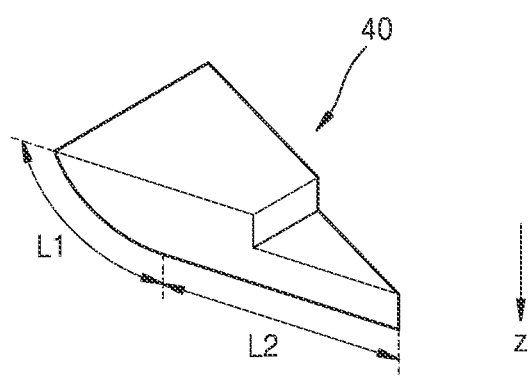
FIG. 14A is a perspective view schematically illustrating a shielding member of a protection member according to an embodiment.
Figure 14B:
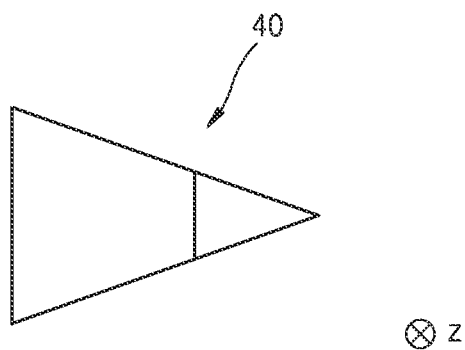
FIG. 14B is a plan view schematically illustrating the shielding member shown in FIG. 14A.
Figure 14C:
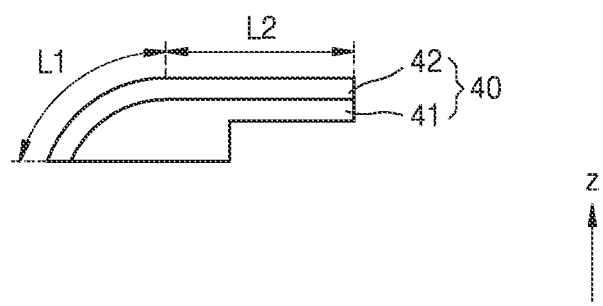
FIG. 14C is a cross-sectional view schematically illustrating the shielding member shown in FIG. 14A.

FIG. 14A is a schematic perspective view illustrating a shielding member 40 of a protection member according to an embodiment. FIG. 14B is a schematic plan view illustrating the shielding member 40 shown in FIG. 14A. FIG. 14C is a schematic cross-sectional view illustrating the shielding member 40 shown in FIG. 14A.

Referring to FIGS. 14A to 14C, the shielding member 40 may have a triangular shape in a plan view. In this case, the shielding member 40 may include the first shielding member layer 41 and the second shielding member layer 42.

Although not shown in FIGS. 14A to 14C, the shielding member 40 may have a sectoral shape in a plan view. However, for convenience of explanation, a case in which the shielding member 40 has a triangular shape in a plan view is mainly described in detail below.

The shielding member 40 may include the first shielding member area L1 with a rounded surface and the second shielding member area L2 having a flat surface. In the above case, the surface of the shielding member 40 may be formed to have a step. For example, the rounded surface of the first shielding member area L1 may be arranged to correspond to the corner area CA of FIG. 10. In addition, a surface facing the rounded surface of the shielding member 40 may be formed to have a step. In this case, in case that the shielding member 40 is arranged, a space in which another structure such as a camera and a sensor may be arranged may be secured. In addition, the flat surface of the shielding member 40 may support the corner area CA to thereby firmly support force applied to the corner area CA.

In the above case, a width of the shielding member 40 (e.g., measured in up and down directions of FIG. 14B) may decrease in the longitudinal direction (e.g., from left to right direction of FIG. 14B) of the shielding member 40. In this case, the shielding member 40 may be arranged only in the corner area CA, or may be arranged in the corner area CA and the central area MA. In an embodiment, the shielding member 40 may be arranged in the corner area CA, the central area MA, and the side area SA adjacent to the corner area CA.

In the above case, a space in which the shielding member 40 is arranged may be minimized so that interference between other elements and the shielding member 40 may be minimized.

Figure 15A:
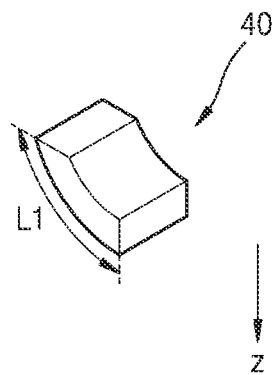
FIG. 15A is a perspective view schematically illustrating a shielding member of a protection member according to an embodiment.
Figure 15B:
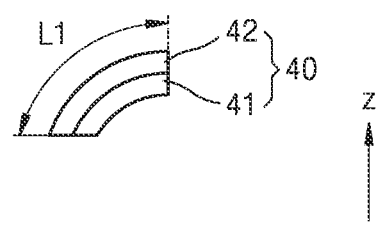
FIG. 15B is a cross-sectional view schematically illustrating the shielding member shown in FIG. 15A.

FIG. 15A is a schematic perspective view illustrating a shielding member 40 of a protection member according to an embodiment. FIG. 15B is a schematic cross-sectional view illustrating the shielding member 40 shown in FIG. 15A.

Referring to FIGS. 15A and 15B, the shielding member 40 may include the first shielding member layer 41 and the second shielding member layer 42. In this case, the first shielding member layer 41 and the second shielding member layer 42 are the same as or similar to those described above, and thus, detailed descriptions thereof are omitted.

The shielding member 40 described above may be round. In this case, the shielding member 40 may be arranged only in the corner area CA shown in FIG. 10. The shielding member 40 may have various shapes in a plan view. For example, the shielding member 40 may be formed to completely shield the corner area CA shown in FIG. 10 (e.g., a partial area of FIG. 12B). In an embodiment, the shielding member 40 may have a rectangular shape in a plan view, as shown in FIG. 13B. In an embodiment, the shielding member 40 may have a triangular shape in a plan view, as shown in FIG. 14B. In an embodiment, the shielding member 40 may have various shapes in a plan view, such as a sectoral shape, a rectangular shape of which a side is round, and a shape corresponding to an edge of the cutout groove BEH.

The shielding member 40 described above may shield the cutout groove BEH. In this case, in case that the cutout groove BEH is provided in plurality, the shielding member 40 may shield each of the cutout grooves BEH one by one. In an embodiment, the shielding member 40 may shield some of the cutout grooves BEH, and another shielding member 40 may shield other ones of the cutout grooves BEH.

Figure 16:
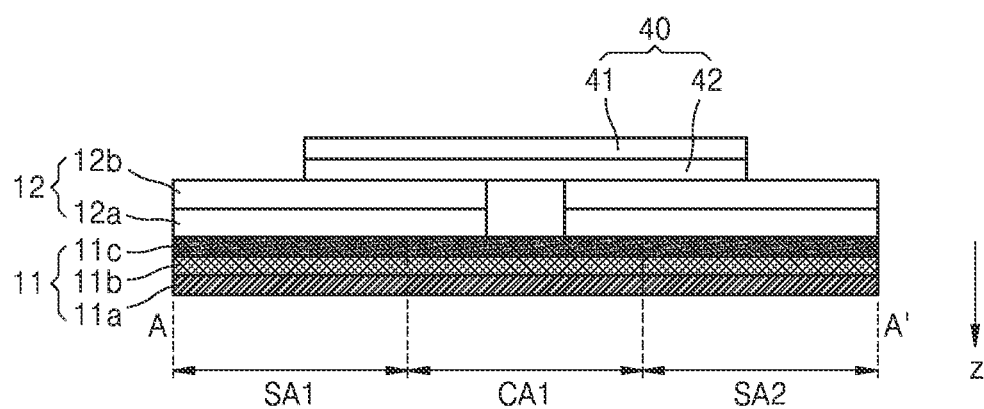
FIG. 16 is a schematic cross-sectional view of a portion of the protection member of FIG. 10, taken along line A-A' of FIG. 10.

FIG. 16 is a schematic cross-sectional view of a portion of the protection member of FIG. 10, taken along line A-A' of FIG. 10.

Referring to FIG. 16, the shielding member 40 may be arranged in a corner area of a protective film (not indicated). In this case, the protective film may include a first layer 11 and a second layer 12. For convenience of explanation, a case in which the shielding member 40 is arranged in each of the first corner area CA1, the first side area SA1, and the second side area SA2 is mainly described in detail below.

The first layer 11 may include a first functional layer 11a, a second functional layer 11b, and a third functional layer 11c, and the second layer 12 may include a fourth functional layer 12a and a fifth functional layer 12b.

The first functional layer 11a may have a light-shielding function. The first functional layer 11a may include at least one of a light-absorbing member for absorbing light incident thereon from the outside and a light-shielding layer for blocking light incident thereon from the outside.

In an embodiment, the first functional layer 11a may be black. The first functional layer 11a may include at least one of a black pigment, a black dye, and black particles. For example, the first functional layer 11a may include chromium (Cr), chromium oxide ($CrO_x$), $Cr/CrO_x$, $Cr/CrO_x$/chromium nitride ($CrN_y$), resin (carbon pigment, RGB mixed pigment), graphite, non-Cr-based pigment, lactam-based pigment, or perylene-based pigment. The first functional layer 11a may include a black organic pigment, and the black organic pigment may include at least one selected from the group consisting of aniline black, lactam black, and perylene black. As another example, the first functional layer 11a may be formed by coating a material such as carbon and Cr.

The first functional layer 11a may have an adhesion function to attach the protective film 10 to the rear surface of the display panel 20 (see FIGS. 7 to 9). The first functional layer 11a may include an embossed adhesive layer. A material of the embossed adhesive layer is not specifically limited, and an adhesive material widely known to a person skilled in the art may be used. For example, various polymer resins may be used as a material of the embossed adhesive layer.

The second functional layer 11b may serve as a base film for forming the first functional layer 11a. The second functional layer 11b may include silicon or PET. In case that the second functional layer 11b includes silicon, stretching characteristics of the second functional layer 11b may be further increased.

In an embodiment, the second functional layer 11b may be black. The second functional layer 11b may include at least one of a black pigment, a black dye, and black particles. For example, the second functional layer 11b may include Cr, $CrO_x$, $Cr/CrO_x$, $Cr/CrO_x/CrN_y$, resin (carbon pigment, RGB mixed pigment), graphite, non-Cr-based pigment, lactam-based pigment, or perylene-based pigment. The second functional layer 11b may include a black organic pigment, and the black organic pigment may include at least one selected from the group consisting of aniline black, lactam black, and perylene black. In some embodiments, the second functional layer 11b may be formed by coating a material such as carbon and Cr.

The third functional layer 11c may have a cushioning function. The third functional layer 11c may include a buffering member for absorbing external shock. The buffering member may include a single layer or multiple layers. For example, the buffering member may include a polymer resin such as polyurethane, polycarbonate, polypropylene, and polyethylene, or may include an elastic material such as rubber, a urethane-based material, or a sponge formed by foam-molding an acryl-based material. The buffering member may include a cushion layer.

The third functional layer 11c may include a synthetic resin foam including a matrix member and pores. The matrix member may include a flexible material. For example, the matrix member may include a synthetic resin. The pores may readily absorb shock applied to the display panel 20. The pores may be defined as the third functional layer 11c having a porous structure. Thus, the pores may be dispersed in the matrix member. The pores may allow the third functional layer 11c to be readily deformed. Accordingly, an elasticity of the third functional layer 11c may be improved, and an impact resistance of the protective film 10 may be improved.

Although not shown in FIG. 16, an adhesive may be between the second functional layer 11b and the third functional layer 11c. For example, at least one of an OCR, an OCA, and a PSA may be between the second functional layer 11b and the third functional layer 11c.

The fourth functional layer 12a may include a synthetic resin film. The fourth functional layer 12a may include a thermosetting resin. The fourth functional layer 12a may include at least one of PI-based resin, acryl-based resin, methacryl-based resin, polyisoprene, vinyl-based resin, epoxy-based resin, urethane-based resin, cellulose-based resin, siloxane-based resin, polyamide-based resin, and perylene-based resin.

Although not shown in FIG. 16, an adhesive may be between the third functional layer 11c and the fourth functional layer 12a. For example, at least one of an OCR, an OCA, and a PSA may be between the third functional layer 11c and the fourth functional layer 12a.

The fifth functional layer 12b may have a function of shielding electromagnetic interference (EMI) and/or a function of dissipating heat. The fifth functional layer 12b may include a heat dissipation member for efficiently dissipating heat of the display panel 20. For example, the fifth functional layer 12b may include a metal material having high thermal conductivity, such as Cu, Ni, ferrite, silver, and Al.

Although not shown in FIG. 16, an adhesive may be between the fourth functional layer 12a and the fifth functional layer 12b. For example, at least one of an OCR, an OCA, and a PSA may be between the fourth functional layer 12a and the fifth functional layer 12b.

In an embodiment, the fourth functional layer 12a and the fifth functional layer 12b may expose at least a portion of the third functional layer 11c corresponding to the first corner area CA1, and cover another portion of the third functional layer 11c corresponding to the first side area SA1 and the second side area SA2. In case that the fourth functional layer 12a and the fifth functional layer 12b having low stretching characteristics are at least partially removed to correspond to the first corner area CA1, the stretching characteristics of the first corner area CA1 of the protective film 10 may be improved. In other words, in case that an external force is applied to the protective film 10, the first corner area CA1 of the protective film 10 may be readily deformed. Because the first corner area CA1 of the protective film 10 is readily deformed, in case that the first corner area CA1 of the protective film 10 is bent to a preset curvature radius, wrinkling may not occur. Although the first corner area CA1 is mainly described above, the embodiment may also be applied in the same way to the second corner area CA2, the third corner area CA3, and the fourth corner area CA4.

The shielding member 40 may be arranged on the fifth functional layer 12b described above. In this case, the shielding member 40 may include the first shielding member layer 41 and the second shielding member layer 42. The first shielding member layer 41 and the second shielding member layer 42 are the same as or similar to those described above, and thus, detailed descriptions thereof are omitted.

In addition, the shielding member 40 may be the same as or similar to that of FIG. 12A, 13A, 14A, or 15A. Further, the shielding member 40 may be arranged in various forms with the protective film 10. For example, the shielding member 40 may be arranged on various portions of the protective film 10, as shown in FIGS. 11A to 11D.

Figure 17A:
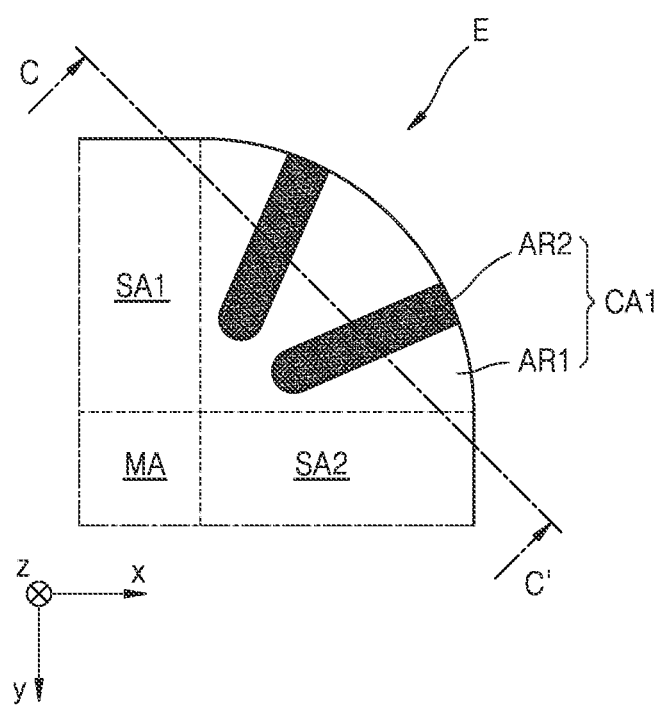
FIG. 17A is an enlarged plan view schematically illustrating portion E of a protective film according to an embodiment.
Figure 17B:
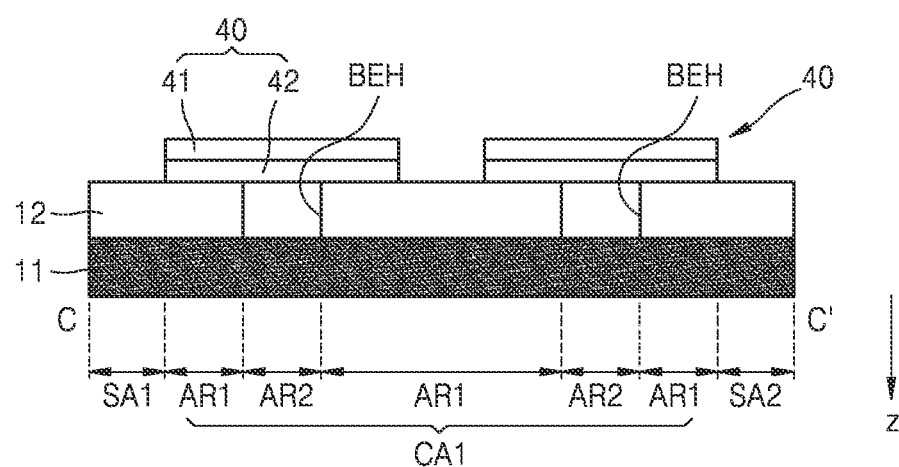
FIG. 17B is a schematic cross-sectional view of a portion of the protection member of FIG. 17A, taken along line C-C' of FIG. 17A.

FIG. 17A is an enlarged plan view schematically illustrating portion E of a protective film according to an embodiment. FIG. 17B is a schematic cross-sectional view of a portion of the protection member of FIG. 17A, taken along line C-C' of FIG. 17A.

Referring to FIGS. 17A and 17B, cutout grooves BEH may be arranged in the first corner area CA1. In this case, the cutout grooves BEH may be defined as a second area AR2 through which the first layer 11 is exposed to the outside. In this case, the first corner area CA1 may include a first area AR1 and the second area AR2, and the first area AR1 may be arranged between the second areas AR2 adjacent to each other, between the second area AR2 and the first side area SA1, or between the second area AR2 and the second side area SA2. However, for convenience of explanation, a case in which two second areas AR2 are provided is mainly described in detail below.

In the above case, the shielding member 40 may simultaneously shield the two second areas AR2. As another example, shielding members 40 that are different from each other may respectively shield second areas AR2 that are different from each other. However, for convenience of explanation, a case in which the shielding members 40 that are different from each other respectively shield the second areas AR2 that are different from each other will be described in detail below.

In the above case, the shielding members 40 may be arranged to be spaced apart from each other to shield the second areas AR2 that are spaced apart from each other. In this case, a shape of each of the shielding members 40 is the same as or similar to that described above, and thus, detailed descriptions thereof are omitted.

Figure 18A:
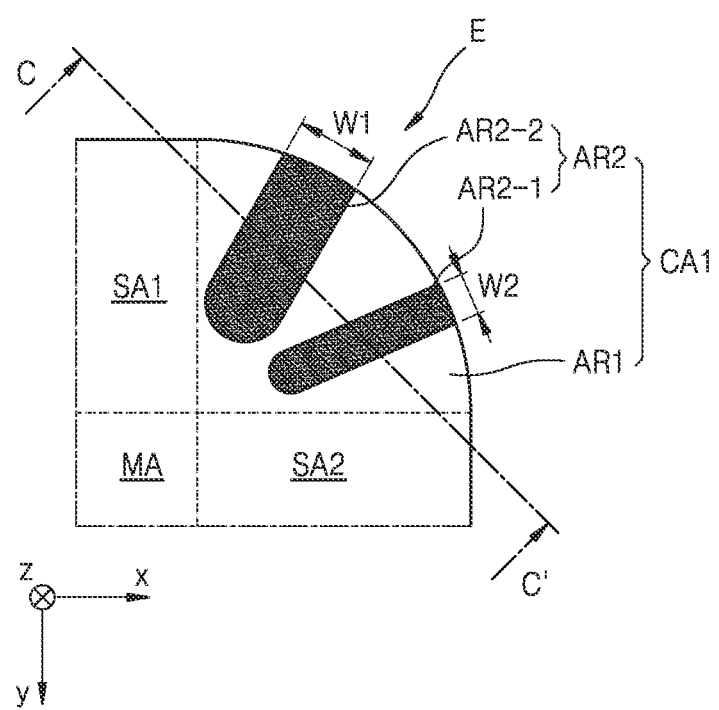
FIG. 18A is an enlarged plan view schematically illustrating portion E of a protective film according to an embodiment.
Figure 18B:
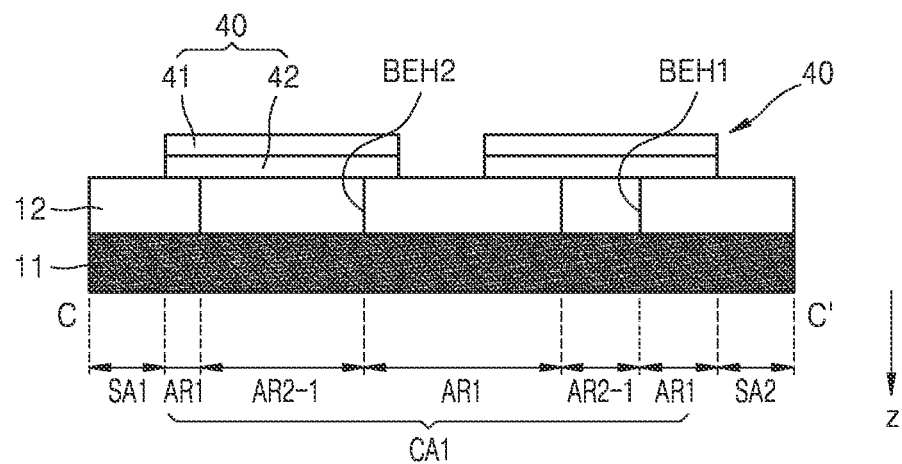
FIG. 18B is a schematic cross-sectional view of a portion of the protection member of FIG. 18A, taken along line C-C' of FIG. 18A.

FIG. 18A is an enlarged plan view schematically illustrating portion E of a protective film according to an embodiment. FIG. 18B is a schematic cross-sectional view of a portion of the protection member of FIG. 18A, taken along line C-C' of FIG. 18A.

Referring to FIGS. 18A and 18B, the protective film 10 may include cutout grooves BEH. For example, a first cutout groove BEH1 and a second cutout groove BEH2 may be arranged in the protective film 10. In this case, the first cutout groove BEH1 and the second cutout groove BEH2 may be defined as a 2-$1^{st}$ area AR2-1 and a 2-$2^{nd}$ area AR2-2 arranged in different areas from each other. In this case, the 2-$1^{st}$ area AR2-1 and the 2-$2^{nd}$ area AR2-2 may be areas provided by removing the second layer 12 from the protective film 10.

The first cutout groove BEH1 and the second cutout groove BEH2 described above may have different shapes or sizes from each other. For example, in case that the first cutout groove BEH1 and the second cutout groove BEH2 have a same shape, a first width W1 (e.g., a width measured in a diagonal direction in a plane defined by x and y directions in FIG. 18A) of the second cutout groove BEH2 may be different from a second width W2 of the first cutout groove BEH1. In other words, one of the first width W1 and the second width W2 may be greater than another one of the first width W1 and the second width W2.

In an embodiment, the first cutout groove BEH1 and the second cutout groove BEH2 may have different shapes from each other. For example, the first cutout groove BEH1 and that shown in FIG. 20A to be described below have a similar shape, and the second cutout groove BEH2 and that shown in FIG. 18A may include a same shape.

In an embodiment, although not shown in FIG. 18B, the first cutout groove BEH1 and the second cutout groove BEH2 may differ in length from each other. For example, a length of one of the first cutout groove BEH1 and the second cutout groove BEH2 may be less than that of another one of the first cutout groove BEH1 and the second cutout groove BEH2.

In the above case, the shielding member 40 may be arranged to shield the first cutout groove BEH1 and the second cutout groove BEH2 described above. In this case, at least one shielding member 40 may be provided. For example, in case that a shielding member 40 is provided in singularity, although not shown in the drawings, the shielding member 40 may be arranged to simultaneously shield the first cutout groove BEH1 and the second cutout groove BEH2. In an embodiment, in case that the shielding member 40 is provided in plurality, one of the shielding members 40 may shield the first cutout groove BEH1, and another one of the shielding member 40 may shield the second cutout groove BEH2. In this case, the shielding members 40 may be spaced apart from each other, or may be arranged so that ends thereof contact each other, as shown in FIG. 18B.

Figure 19:
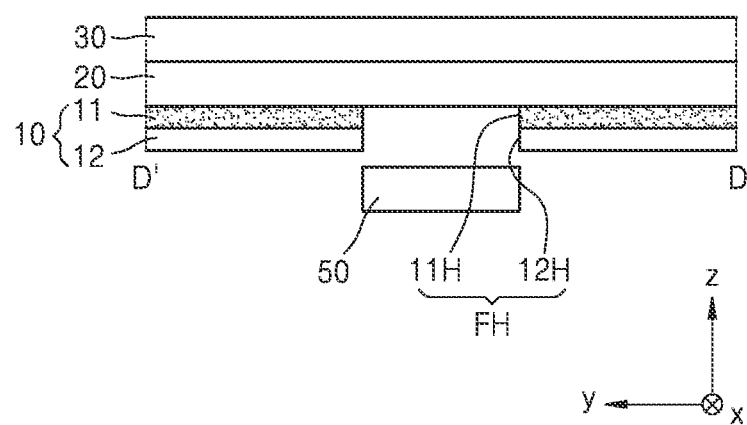
FIG. 19 is a schematic cross-sectional view of a portion of the protection member of FIG. 10, taken along line D-D' of FIG. 10.

FIG. 19 is a schematic cross-sectional view of a portion of the protection member of FIG. 10, taken along line D-D' of FIG. 10.

Referring to FIG. 19, the display panel 20 and the cover window 30 may be sequentially arranged on the protective film 10. The protective film 10 may include the first layer 11 and the second layer 12 that are sequentially arranged below the display panel 20.

In an embodiment, the first layer 11 may have a first hole 11H exposing a portion of the display panel 20, and the second layer 12 may have a second hole 12H corresponding to the first hole 11H. The first hole 11H and the second hole 12H may correspond to a hole FH arranged in the central area MA. In other words, the hole FH arranged in the central area MA may include the first hole 11H and the second hole 12H.

A component may be arranged below the protective film 10. A component 50 may be arranged to correspond to the hole FH of the protective film 10. The component 50 may include a fingerprint recognition sensor, an illuminance sensor, a proximity sensor, etc. The hole FH of the protective film 10 may minimize limitations on a function of the component 50.

In the above case, the component 50 may be arranged in various shapes. For example, at least a portion of the component 50 may be inserted into the hole FH. In an embodiment, the component 50 may not be inserted into the hole FH, but may be arranged in another structure to correspond to the location of the hole FH.

Figure 20A:
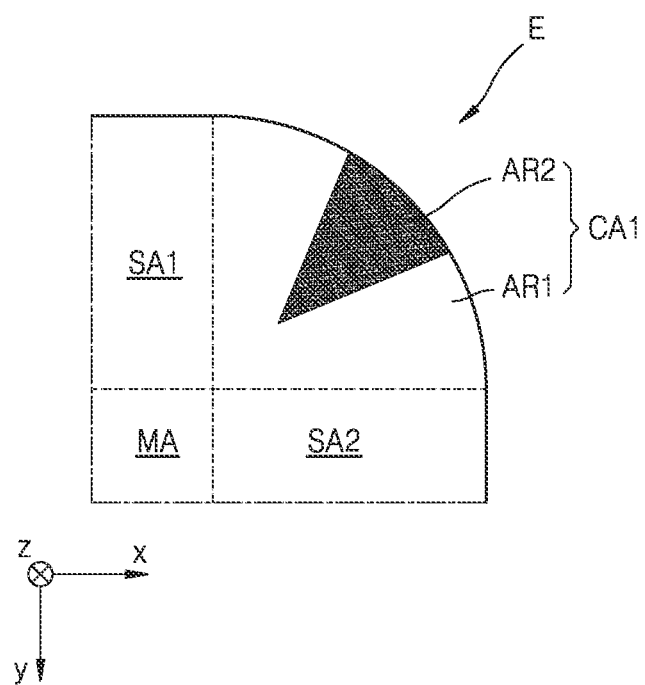
FIG. 20A is an enlarged plan view schematically illustrating portion E of a protective film according to an embodiment.

FIG. 20A is an enlarged plan view schematically illustrating portion E of a protective film according to an embodiment.

Referring to FIG. 20A, the first corner area CA1 of the protective film 10 (see FIG. 10) may include the first area AR1 and the second area AR2. The protective film 10 may include the first layer 11 and the second layer 12 on the first layer 11, as shown in FIG. 11A described above.

In an embodiment, the second layer 12 may cover (or overlap, e.g., in a plan view) the central area MA, first side area SA1, and second side area SA2 of the first layer 11, and expose the second area AR2 of the first corner area CA1 of the first layer 11.

In case that the second layer 12 having lower stretching characteristics than that of the first layer 11 is partially removed to correspond to the second area AR2 of the first corner area CA1, the stretching characteristics of the first corner area CA1 of the protective film 10 may be improved, and thus, the first corner area CA1 may be readily deformed. Because the first corner area CA1 of the protective film 10 is readily deformed, in case that deformation is applied to the first corner area CA1 to have a curvature (e.g., a certain or selected curvature), wrinkling or the like may not occur in the first corner area CA1.

In an embodiment, as shown in FIG. 20A, the second area AR2 may be spaced apart from the first side area SA1 and the second side area SA2. The first area AR1 may surround at least a portion of the second area AR2.

FIG. 20A illustrates that the second area AR2 has a sectoral shape in a plan view. However, in an embodiment, the planar shape of the second area AR2 may be variously changed, e.g., to a circular shape, an elliptical shape, a polygonal shape such as a quadrangular shape, a star shape, and a diamond shape.

Although the first side area SA1, the second side area SA2, and the first corner area CA1 are mainly described above in detail, the embodiment may be applied in the same way to the third side area SA3, the fourth side area SA4, the second corner area CA2, the third corner area CA3, and the fourth corner area CA4 shown in FIG. 10.

Although not shown in the drawings, a shielding member (not shown) may be arranged in the second area AR2 described above. An arrangement and shape of the shielding member are the same as or similar to those described above, and thus, detailed descriptions thereof are omitted.

Figure 20B:
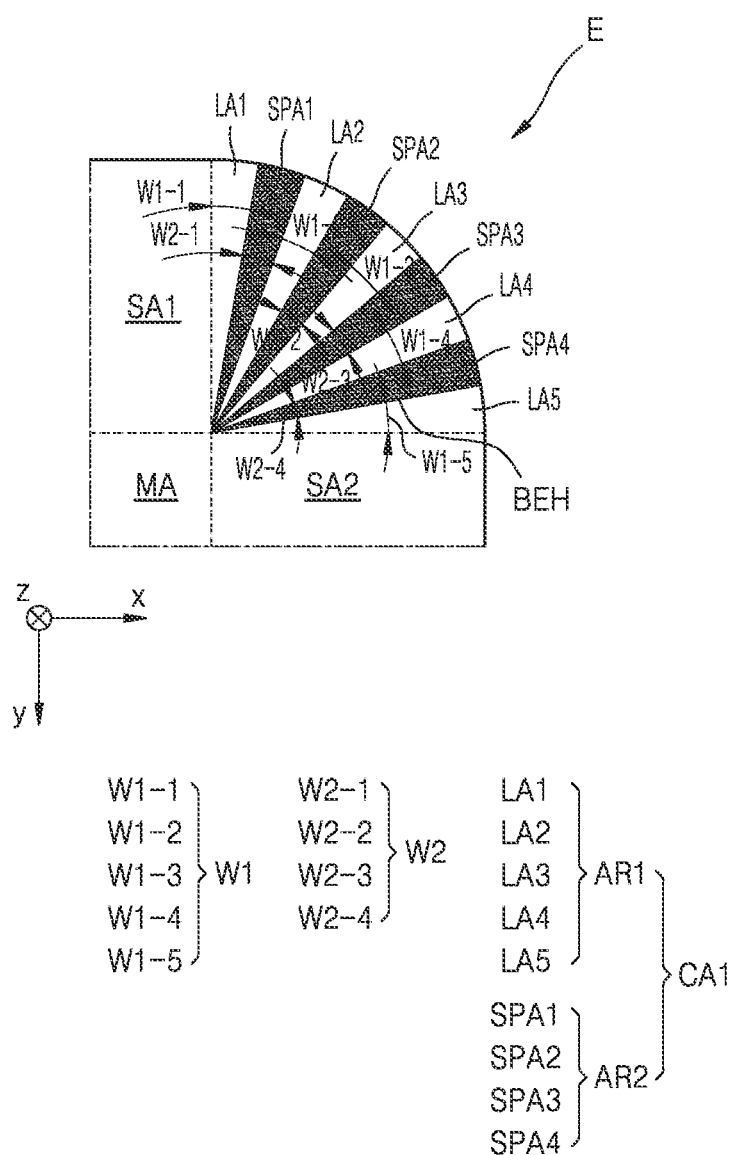
FIG. 20B is an enlarged plan view schematically illustrating portion E of a protective film according to an embodiment.

FIG. 20B is an enlarged plan view schematically illustrating portion E of a protective film according to an embodiment.

Referring to FIG. 20B, the first corner area CA1 of the protective film 10 (see FIG. 10) may include the first area AR1 (see FIG. 20A) and the second area AR2 (see FIG. 20A).

The first area AR1 may include line areas LA1, LA2, LA3, LA4, and LA5. The line areas LA1, LA2, LA3, LA4, and LA5 may each extend in a first direction, and may be arranged in a second direction. For example, the first corner area CA1 may have a sectoral shape in a plan view. In this case, the first direction may be a radial direction, and the second direction may be a circumferential direction. The line areas LA1, LA2, LA3, LA4, and LA5 may extend in the radial direction, and may be arranged in the circumferential direction. In this case, the line areas LA1, LA2, LA3, LA4, and LA5, for example, a first line area LA1, a second line area LA2, a third line area LA3, a fourth line area LA4, and a fifth line area LA5, may be sequentially arranged in a direction from the first side area SA1 to the second side area SA2. The first line area LA1, the second line area LA2, the third line area LA3, the fourth line area LA4, and the fifth line area LA5 may be separated from one another.

The first line area LA1, the second line area LA2, the third line area LA3, the fourth line area LA4, and the fifth line area LA5 may have a same shape. For example, all of the first line area LA1, the second line area LA2, the third line area LA3, the fourth line area LA4, and the fifth line area LA5 may have a sectoral shape.

In the case described above, a $1\text{-}1^{st}$ width W1-1 of the first line area LA1, a $1\text{-}2^{nd}$ width W1-2 of the second line area LA2, a $1\text{-}3^{rd}$ width W1-3 of the third line area LA3, a $1\text{-}4^{th}$ width W1-4 of the fourth line area LA4, and a $1\text{-}5^{th}$ width W1-5 of the fifth line area LA5 may be variously provided. In an embodiment, all of the $1\text{-}1^{st}$ width W1-1 of the first line area LA1, the $1\text{-}2^{nd}$ width W1-2 of the second line area LA2, the $1\text{-}3^{rd}$ width W1-3 of the third line area LA3, the $1\text{-}4^{th}$ width W1-4 of the fourth line area LA4, and the $1\text{-}5^{th}$ width W1-5 of the fifth line area LA5 that pass through a same arc may be the same.

In an embodiment, one of the $1\text{-}1^{st}$ width W1-1 of the first line area LA1, the $1\text{-}2^{nd}$ width W1-2 of the second line area LA2, the $1\text{-}3^{rd}$ width W1-3 of the third line area LA3, the $1\text{-}4^{th}$ width W1-4 of the fourth line area LA4, and the $1\text{-}5^{th}$ width W1-5 of the fifth line area LA5 that pass through a same arc may be greater or less than another one of the $1\text{-}1^{st}$ width W1-1 of the first line area LA1, the $1\text{-}2^{nd}$ width W1-2 of the second line area LA2, the $1\text{-}3^{rd}$ width W1-3 of the third line area LA3, the $1\text{-}4^{th}$ width W1-4 of the fourth line area LA4, and the $1\text{-}5^{th}$ width W1-5 of the fifth line area LA5. For example, the $1\text{-}3^{rd}$ width W1-3 may be the greatest, and the $1\text{-}2^{nd}$ width W1-2 and the $1\text{-}1^{st}$ width W1-1 may gradually decrease. In addition, the $1\text{-}4^{th}$ width W1-4 and the $1\text{-}5^{th}$ width W1-5 may gradually decrease with respect to the $1\text{-}3^{rd}$ width W1-3. In this case, the $1\text{-}4^{th}$ width W1-4 and the $1\text{-}2^{nd}$ width W1-2 may be the same, and the $1\text{-}1^{st}$ width W1-1 and the $1\text{-}5^{th}$ width W1-5 may be the same. In an embodiment, the $1\text{-}1^{st}$ width W1-1 may be the greatest, and sizes may be sequentially decreased from the $1\text{-}2^{nd}$ width W1-2, the $1\text{-}3^{rd}$ width W1-3, the $1\text{-}4^{th}$ width W1-4, to the $1\text{-}5^{th}$ width W1-5. In an embodiment, the $1\text{-}5^{th}$ width W1-5 may be the greatest, and sizes may be sequentially decreased from the $1\text{-}4^{th}$ width W1-4, the $1\text{-}3^{rd}$ width W1-3, the $1\text{-}2^{nd}$ width W1-2, to the $1\text{-}1^{st}$ width W1-1. In an embodiment, the $1\text{-}1^{st}$ width W1-1, the $1\text{-}2^{nd}$ width W1-2, the $1\text{-}3^{rd}$ width W1-3, the $1\text{-}4^{th}$ width W1-4, and the $1\text{-}5^{th}$ width W1-5 may be different from one another, and a size of each of the widths may have no tendency.

In addition, a shape of one of the first line area LA1, the second line area LA2, the third line area LA3, the fourth line area LA4, and the fifth line area LA5 may be different from a shape of another one of the first line area LA1, the second line area LA2, the third line area LA3, the fourth line area LA4, and the fifth line area LA5. For example, a shape of one of the first line area LA1, the second line area LA2, the third line area LA3, the fourth line area LA4, and the fifth line area LA5 is the same as or similar to a shape of the first area AR1 shown in FIGS. 17A, and 18A, and a shape of another one of the first line area LA1, the second line area LA2, the third line area LA3, the fourth line area LA4, and the fifth line area LA5 may be the same as or similar to a shape of the first area AR1 shown in FIG. 20A or 20B.

The second area AR2 may include space areas SPA1, SPA2, SPA3, and SPA4. The space areas SPA1, SPA2, SPA3, and SPA4 may each extend in the first direction, and may be arranged in the second direction. For example, the space areas SPA1, SPA2, SPA3, and SPA4 may each extend in a radial direction, and may be arranged in a circumferential direction.

In an embodiment, the line areas LA1, LA2, LA3, LA4, and LA5 and the space areas SPA1, SPA2, SPA3, and SPA4 may be alternately arranged in the second direction. For example, as shown in FIG. 20B, the line areas LA1, LA2, LA3, LA4, and LA5 and the space areas SPA1, SPA2, SPA3, and SPA4 may be alternately arranged in the circumferential direction.

In the above case, the space areas SPA1, SPA2, SPA3, and SPA4 may include a first space area SPA1, a second space area SPA2, a third space area SPA3, and a fourth space area SPA4 which are arranged to be spaced apart from one another from the first side area SA1 to the second side area SA2. In this case, each of the space areas SPA1, SPA2, SPA3, and SPA4 may define a cutout groove BEH.

As described above, shapes of the space areas SPA1, SPA2, SPA3, and SPA4 may be the same as or different from each other. For example, a shape of each of the space areas SPA1, SPA2, SPA3, and SPA4 may be the same as or similar to a shape of the second area AR2 shown in each of FIGS. 17A, 18A, 20A, and 20B. However, for convenience of explanation, a case in which the shape of each of the space areas SPA1, SPA2, SPA3, and SPA4 is a sectoral shape, as shown in FIG. 20B, is mainly described in detail below.

The second width W2 of each of the space areas SPA1, SPA2, SPA3, and SPA4 arranged in a same arc may be the same as or different from each other. For example, a $2\text{-}1^{st}$ width W2-1 of the first space area SPA1, a $2\text{-}2^{nd}$ width W2-2 of the second space area SPA2, a $2\text{-}3^{rd}$ width W2-3 of the third space area SPA3, and a $2\text{-}4^{th}$ width W2-4 of the fourth space area SPA4 may be the same as or different from each other. In this case, a relationship between the $2\text{-}1^{st}$ width W2-1, the $2\text{-}2^{nd}$ width W2-2, the $2\text{-}3^{rd}$ width W2-3, and the $2\text{-}4^{th}$ width W2-4 may be the same as or different from a relationship between the $1\text{-}1^{st}$ width W1-1, the $1\text{-}2^{nd}$ width W1-2, the $1\text{-}3^{rd}$ width W1-3, the $1\text{-}4^{th}$ width W1-4, and the $1\text{-}5^{th}$ width W1-5.

In this case, a first width W1 of each of the line areas LA1, LA2, LA3, LA4, and LA5 in the second direction may gradually increase in the first direction, and a second width W2 of the space areas SPA1, SPA2, SPA3, and SPA4 in the second direction may gradually increase in the first direction. For example, as shown in FIG. 20B, the first width W1 of each of the line areas LA1, LA2, LA3, LA4, and LA5 in a circumferential direction may gradually increase in a radial direction. The second width W2 of each of the space areas SPA1, SPA2, SPA3, and SPA4 in the circumferential direction may gradually increase in the radial direction.

As described above, the second layer 12 of the protective film 10 may cover the first area AR1 of the first corner area CA1 of the first layer 11, and expose the second area AR2 of the first corner area CA1 of the first layer 11. The second layer 12 of the protective film 10 may cover the line areas LA1, LA2, LA3, LA4, and LA5 of the first layer 11, and expose the space areas SPA1, SPA2, SPA3, and SPA4.

In case that the second layer 12 having lower stretching characteristics than the first layer 11 is partially removed to correspond to the space areas SPA1, SPA2, SPA3, and SPA4 of the first corner area CA1, the stretching characteristics of the first corner area CA1 of the protective film 10 may be improved so that the first corner area CA1 may be readily deformed. Because the first corner area CA1 of the protective film 10 is readily deformed, in case that deformation is applied to the first corner area CA1 to have a curvature, wrinkling or the like may not occur in the first corner area CA1.

Although the first side area SA1, the second side area SA2, and the first corner area CA1 are mainly described above, the embodiment may be applied in the same way to the third side area SA3, the fourth side area SA4, the second corner area CA2, the third corner area CA3, and the fourth corner area CA4.

Each of the space areas SPA1, SPA2, SPA3, and SPA4 described above may be defined by an edge of the cutout groove BEH. In this case, although not shown in the drawings, each of the space areas SPA1, SPA2, SPA3, and SPA4 may be shielded by the shielding member described above. In this case, that the shielding member shields the space areas SPA1, SPA2, SPA3, and SPA4 is described above, and thus, detailed descriptions thereof are omitted.

Figure 20C:
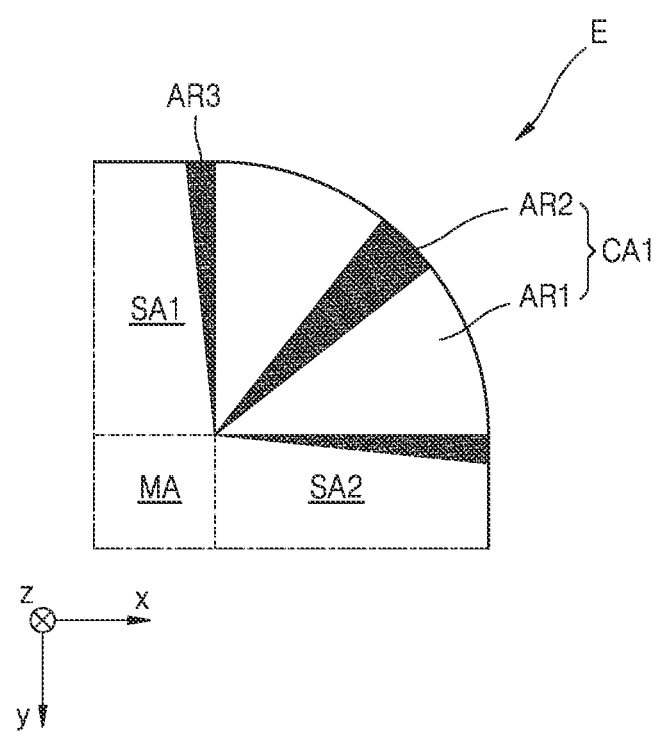
FIG. 20C is an enlarged plan view schematically illustrating portion E of a protective film according to an embodiment.

FIG. 20C is an enlarged plan view schematically illustrating portion E of a protective film 10 according to an embodiment.

Referring to FIG. 20C, the protective film 10 may further include a third area AR3 in addition to the first area AR1 and the second area AR2 of the first corner area CA1. In this case, similar to the second area AR2, the third area AR3 may include an area in which a cutout groove (not indicated) is provided in the second layer 12 so that the first layer 11 is exposed to the outside. The third area AR3 may be arranged in at least one of the first side area SA1 and the second side area SA2. In this case, the third area AR3 may be arranged at a boundary between the first side area SA1 and the first corner area CA1 and/or at a boundary between the second side area SA2 and the first corner area CA1. In an embodiment, the third area AR3 may be arranged in each of the first side area SA1 and the second side area SA2. In this case, the third area AR3 may be arranged adjacent to the first corner area CA1.

Although not shown in the drawings, a shielding member may be arranged in the second area AR2 and the third area AR3. In this case, the shielding member may simultaneously shield the second area AR2 and the third area AR3 or may individually shield the second area AR2 and the third area AR3.

Although the first side area SA1, the second side area SA2, and the first corner area CA1 are mainly described above, the embodiment may be applied in the same way to the third side area SA3, the fourth side area SA4, the second corner area CA2, the third corner area CA3, and the fourth corner area CA4.

Figure 21A:
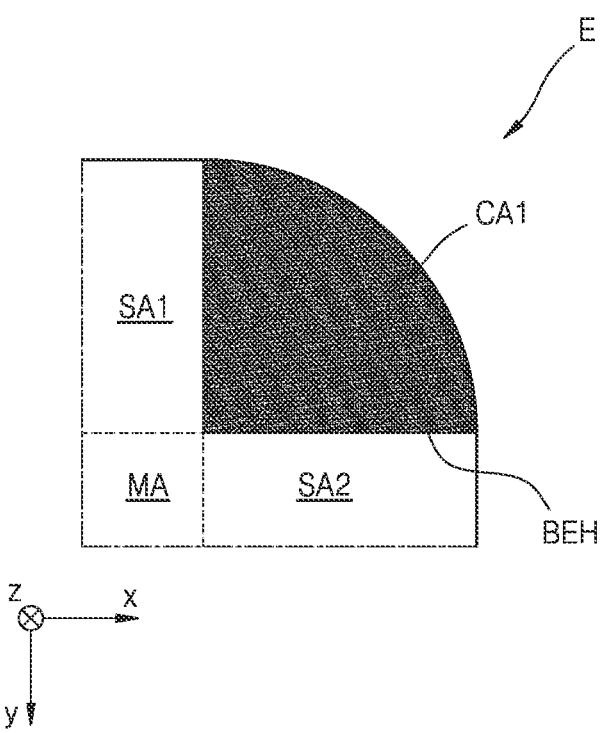
FIG. 21A is an enlarged plan view schematically illustrating portion E of a protective film according to an embodiment.
Figure 21B:
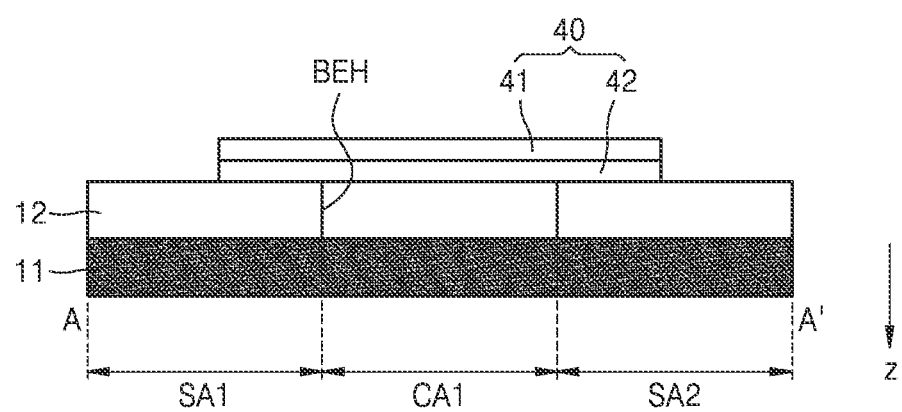
FIG. 21B is a cross-sectional view schematically illustrating a portion of the protective film of FIG. 21A, according to an embodiment.

FIG. 21A is an enlarged plan view schematically illustrating portion E of a protective film according to an embodiment. FIG. 21B is a cross-sectional view schematically illustrating a portion of the protective film of FIG. 21A according to an embodiment.

Referring to FIGS. 21A and 21B, the second area AR2 may be provided to correspond to the first corner area CA1. In other words, all of the second layer 12 arranged in the first corner area CA1 may be removed so that the first layer 11 is exposed to the outside in the first corner area CA1. In other words, the cutout groove BEH may be provided to correspond to the first corner area CA1.

In this case, the shielding member 40 may be arranged on the cutout groove BEH. In this case, the shielding member 40 may be arranged to overlap the first side area SA1 and the second side area SA2. In addition, the shielding member 40 may be arranged to overlap the central area MA. In this case, a shape of the shielding member 40 may be the same as or similar to the shape described above.

Although not shown in the drawings, the second area AR2 may be arranged in at least one of the first side area SA1 and the second side area SA2 as well as the first corner area CA1. In this case, the shielding member 40 may be arranged to completely shield the second area AR2.

Although the first side area SA1, the second side area SA2, and the first corner area CA1 are mainly described above, the embodiment may be applied in the same way to the third side area SA3, the fourth side area SA4, the second corner area CA2, the third corner area CA3, and the fourth corner area CA4.

FIGS. 22A to 22I are side views schematically illustrating a method of manufacturing a display apparatus, according to an embodiment.

Figure 22A:
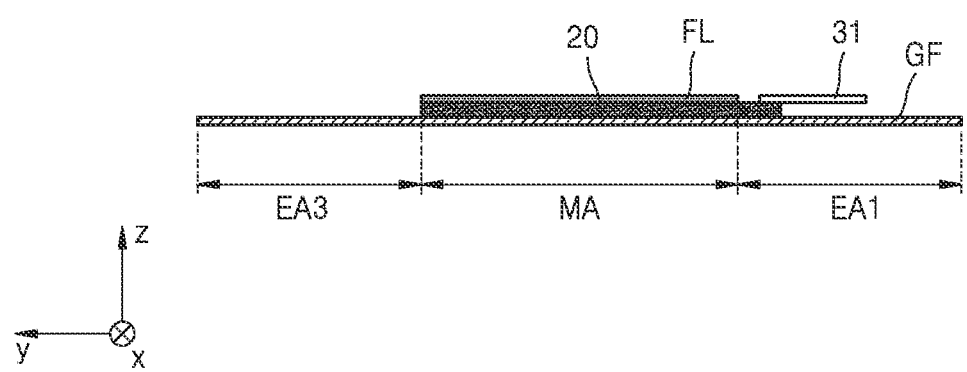
FIGS. 22A to 22I are side views schematically illustrating a method of manufacturing a display apparatus, according to an embodiment.

Referring to FIG. 22A, a guide film GF may be attached to a rear surface of the display panel 20 where the functional layer FL is arranged. In this case, the functional layer FL and a bending protective layer BPL (see FIG. 23G) and the display circuit board 31 to be described below may be arranged on a front surface of the display panel 20.

In an embodiment, in case that the guide film GF is attached to a rear surface of the display panel 20, the guide film GF may be attached so that the display panel 20 corresponds to the central area MA of the guide film GF. For example, the guide film GF may be attached so that all of the main display area FDA, the auxiliary display area SDA, the intermediate display area MDA, and the corner display area CDA of the display panel 20 correspond to the central area MA of the guide film GF. In this case, an edge area EA (see FIG. 23A) of the guide film GF and the display panel 20 may not overlap each other.

Figure 22B:
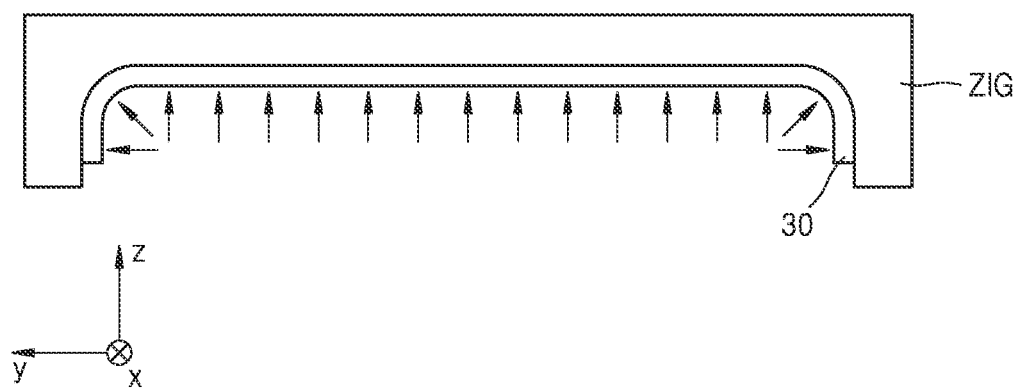

Referring to FIG. 22B, in order to prepare the cover window 30, the cover window 30 may be deformed to have a flat surface and a curved surface by using a zig ZIG including a concave surface corresponding to a final shape of the cover window 30. In other words, the zig ZIG may be a frame having a shape of a display apparatus to be finally manufactured. The cover window 30 may be deformed to have a shape of the concave surface of the zig ZIG by bringing the cover window 30 into close contact with the concave surface of the zig ZIG.

Figure 22C:
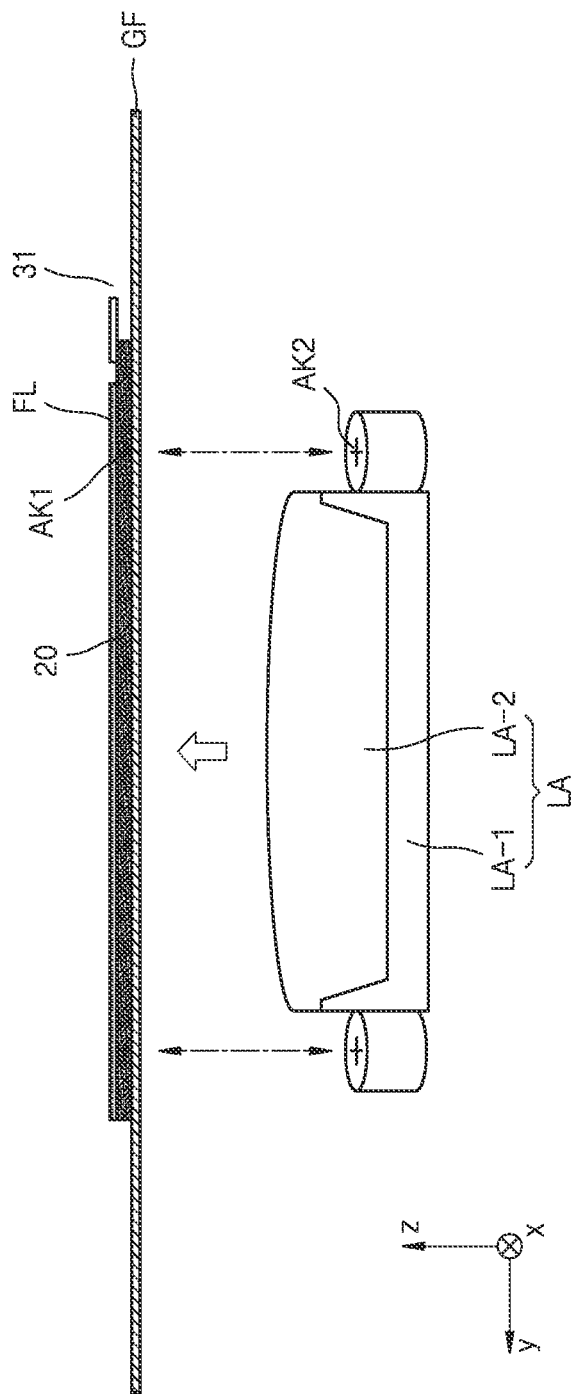

Referring to FIG. 22C, a lamination apparatus LA including a support portion LA-1 and a volume change portion LA-2 on the support portion LA-1 may be prepared. The support portion LA-1 may support the volume change portion LA-2. The volume change portion LA-2 may include an air pump or may be connected to an air pump. Because the volume change portion LA-2 has a low modulus, a shape and volume of the volume change portion LA-2 may vary according to an air pressure through the air pump. As another example, the volume change portion LA-2 may include a diaphragm.

A rear surface of the display panel 20 may face the lamination apparatus LA. In other words, the guide film GF may be arranged on a side of the lamination apparatus LA. The display panel 20 and the lamination apparatus LA may be aligned. For example, the display panel 20 and the lamination apparatus LA may be aligned so that a first alignment key AK1 displayed on the display panel 20 and a second alignment key AK2 displayed on the lamination apparatus LA correspond to each other.

Figure 22D:
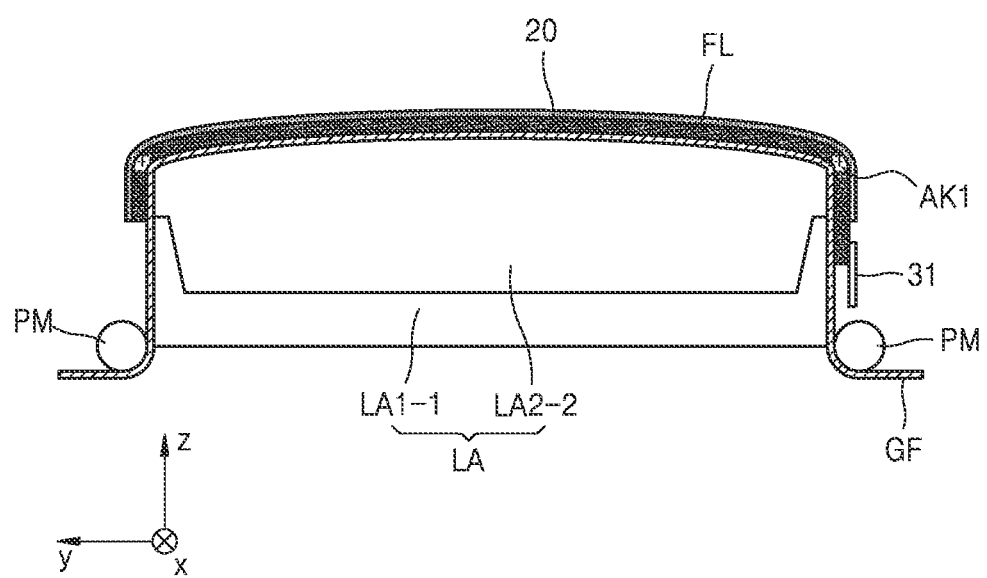

Referring to FIG. 22D, the display panel 20 may be preformed by means of the guide film GF. In an embodiment, the display panel 20 may be deformed by applying an external force, for example, a tensile force, to the guide film GF.

For example, the guide film GF may be seated on the lamination apparatus LA. A push member PM may be positioned on the guide film GF, and the guide film GF may be brought into close contact with a side surface of the lamination apparatus LA by using the push member PM. For example, as the push members PM respectively press the edge areas EA of the guide film GF, a tensile force is applied to the guide film GF, and the guide film GF is deformed along an outer surface of the lamination apparatus LA, and accordingly, the display panel 20 on the guide film GF may also be appropriately bent or deformed.

Figure 22E:
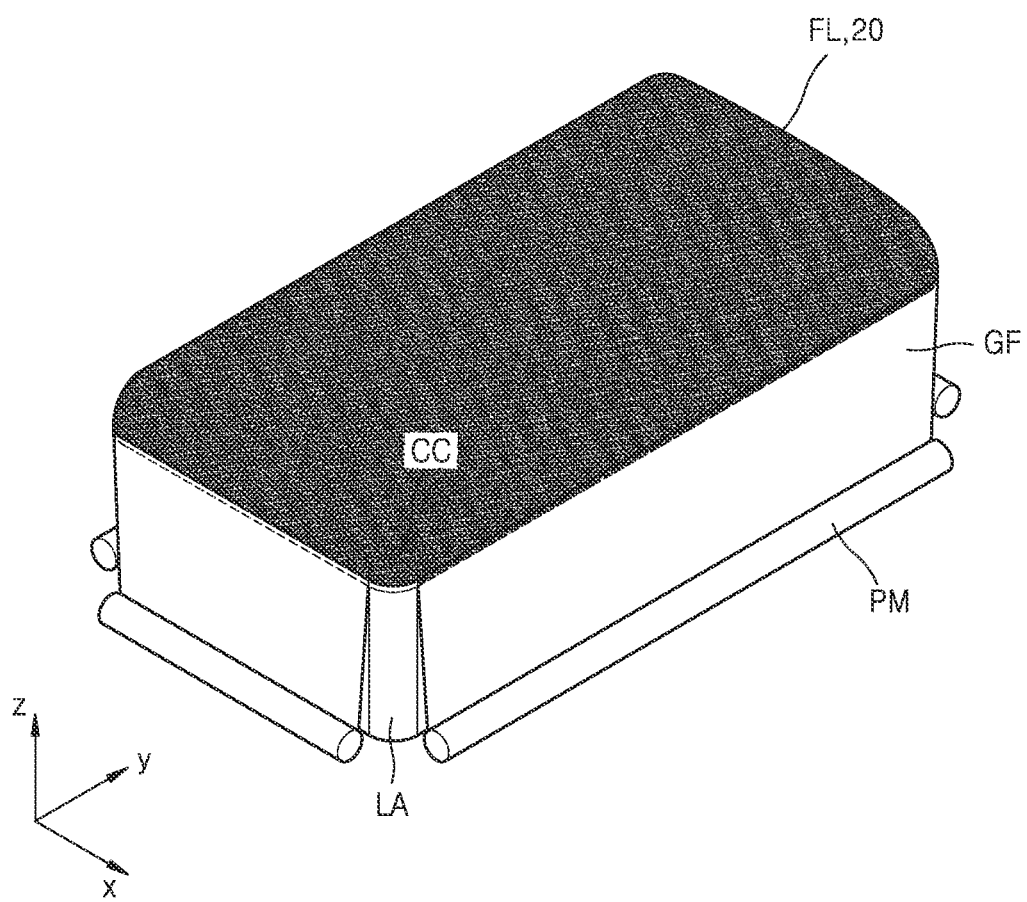

Referring to FIG. 22E, a shape of the functional layer FL and the display panel 20 that are preformed through the guide film GF may be identified.

Figure 22F:
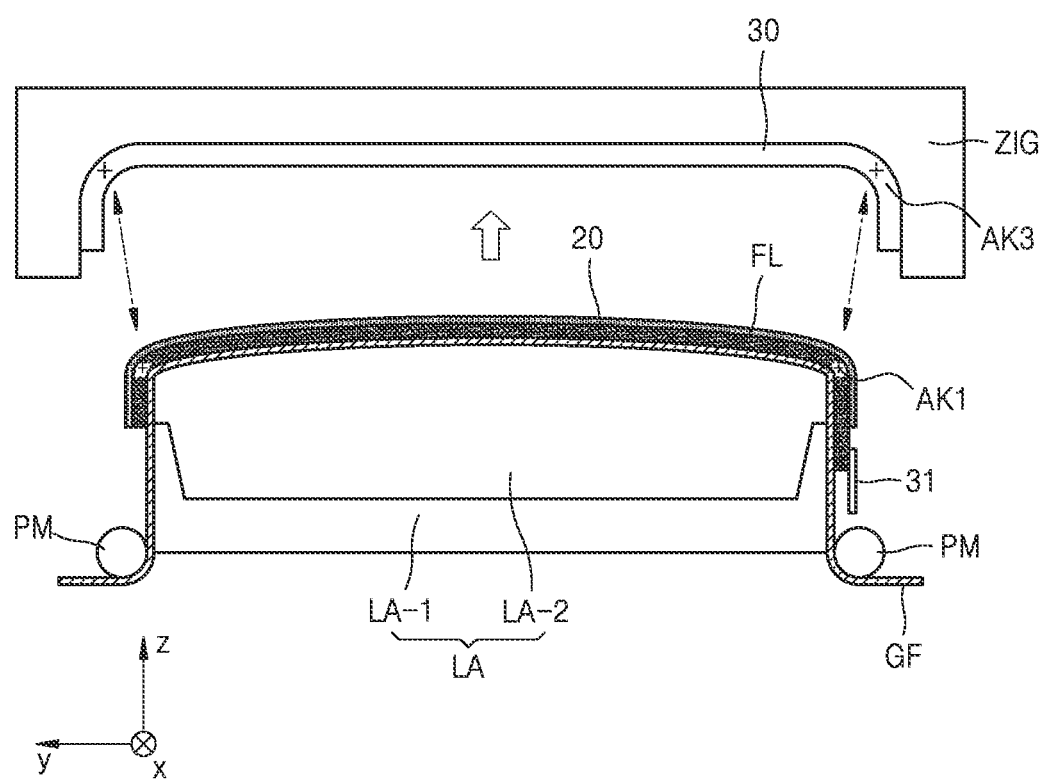

Referring to FIG. 22F, after the display panel 20 is preformed, the front surface of the display panel 20 may be arranged to face the cover window 30, and the display panel 20 and the cover window 30 may be aligned. The display panel 20 and the cover window 30 may be aligned so that the first alignment key AK1 displayed on the display panel 20 and a third alignment key AK3 displayed on the cover window 30 correspond to each other.

Figure 22G:
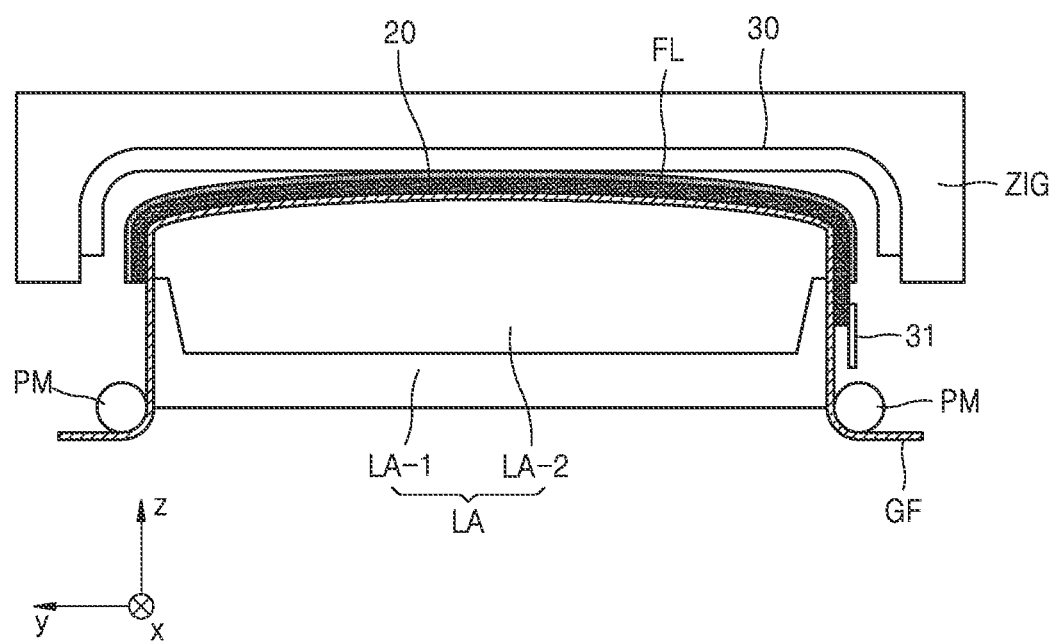
Figure 22H:
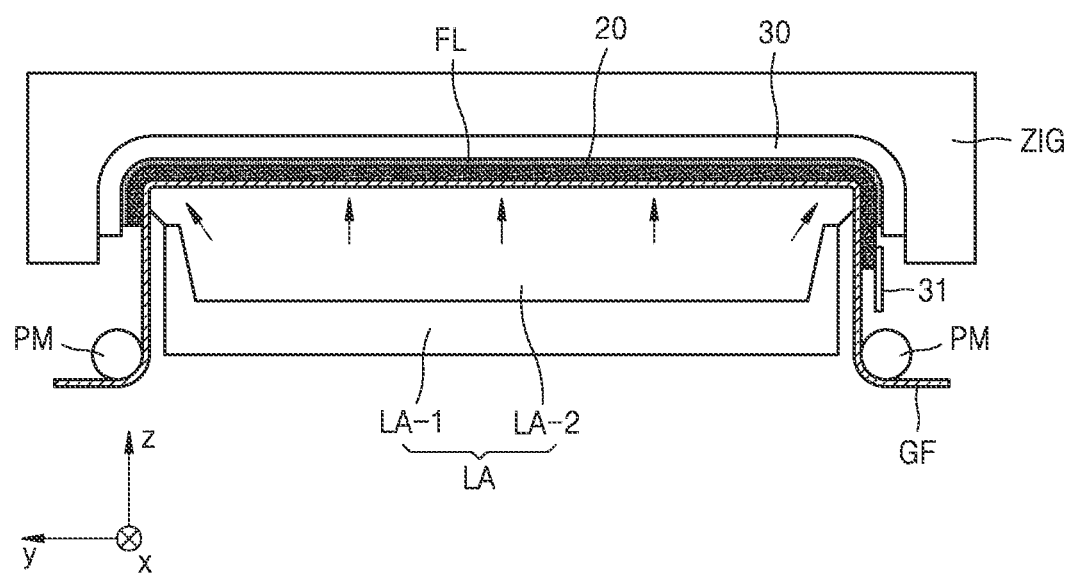

Referring to FIGS. 22G and 22H, the cover window 30 may be attached to the front surface of the display panel 20. For example, as shown in FIG. 22G, a portion of the display panel 20 may be first attached to the cover window 30. A flat surface (e.g., a main display area FDA) not having a curvature in the final shape of the display panel 20 may be first attached to the cover window 30.

As shown in FIG. 22H, as a shape of the volume change portion LA-2 of the lamination apparatus LA is changed and a volume thereof is increased, the remaining portions of the display panel 20, for example, the auxiliary display area SDA and the corner display area CDA, may be attached to the cover window 30.

A process of attaching the cover window 30 to the auxiliary display area SDA and the corner display area CDA may be simultaneously performed. For example, in case that the auxiliary display area SDA and the cover window 30 are attached to each other, the corner display area CDA may naturally contact and be attached to the cover window 30 by a peripheral external force. In an embodiment, a process of attaching each of the auxiliary display area SDA and the corner display area CDA to the cover window 30 may be performed at different times. For example, the auxiliary display area SDA and the cover window 30 may be first attached to each other, and the corner display area CDA and the cover window 30 may then be attached to each other.

Figure 22I:
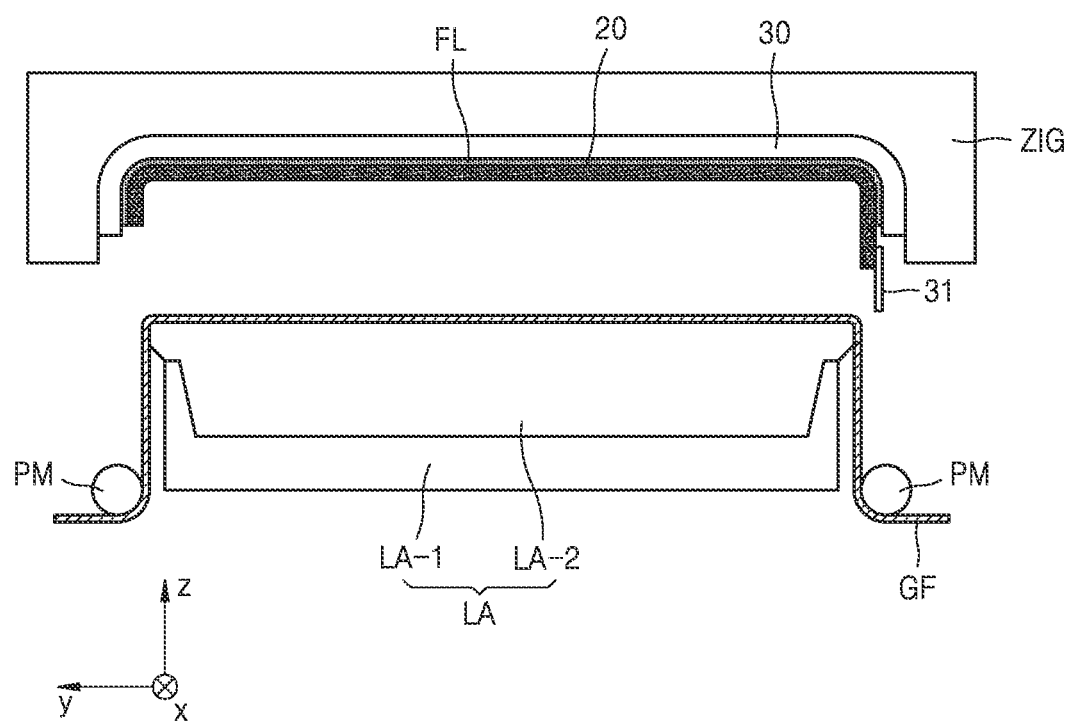

Referring to FIG. 22I, after an operation of attaching the display panel 20 to the cover window 30 is performed, the guide film GF may be removed from the display panel 20, to which the cover window 30 is attached. For example, the guide film GF and the display panel 20 may be separated from each other by irradiating ultraviolet (UV) to an adhesive member (not shown) for attaching the guide film GF and the display panel 20 to each other and weakening an adhesive force of the adhesive member.

In case that the process described above is completed, an operation of curing the cover window 30 and the display panel 20 may be performed. For example, UV may be irradiated to the cover window 30 and the display panel 20 to perform curing. When UV is irradiated to the cover window 30 and the display panel 20, bubbles, etc. may be released from an adhesive member attached to the display panel 20 or the like.

Up to this point, the display apparatus 1 of FIG. 1B is described as an example described with reference to FIGS. 22A to 22I. However, this is for convenience of explanation, and the explanations described above may also be applied in the same way to the display apparatus 1 of FIG. 1A. In this case, the disclosure related to the corner display area CDA of the display apparatus 1 of FIG. 1B may be applied to the display apparatus corner area DCA of the display apparatus 1 of FIG. 1A.

Figure 23A:
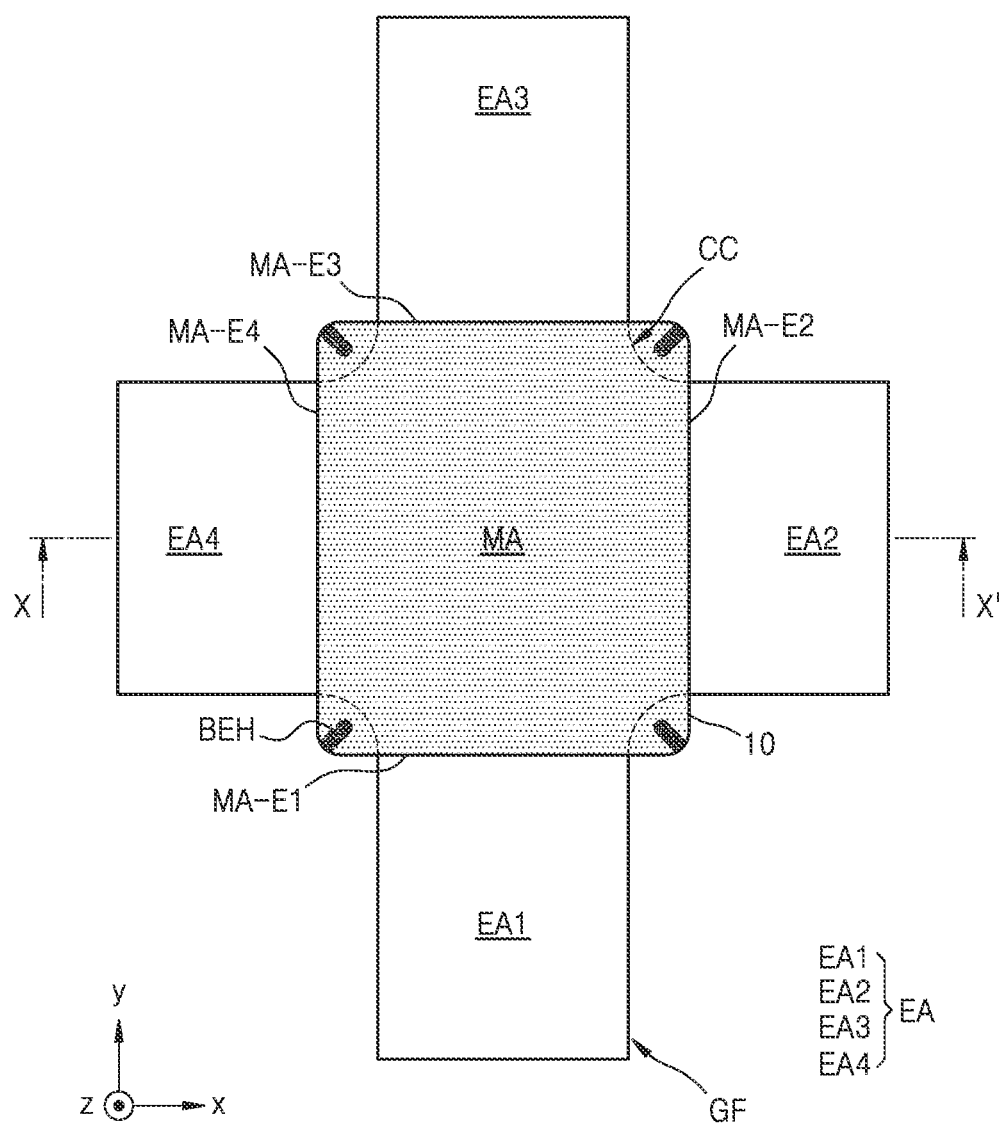
FIG. 23A is a plan view schematically illustrating a guide film and a protective film according to an embodiment.

FIG. 23A is a plan view schematically illustrating a guide film GF and a protective film 10 according to an embodiment. FIGS. 23B to 23G are side views schematically illustrating a method of manufacturing a display apparatus, according to an embodiment.

Figure 23B:
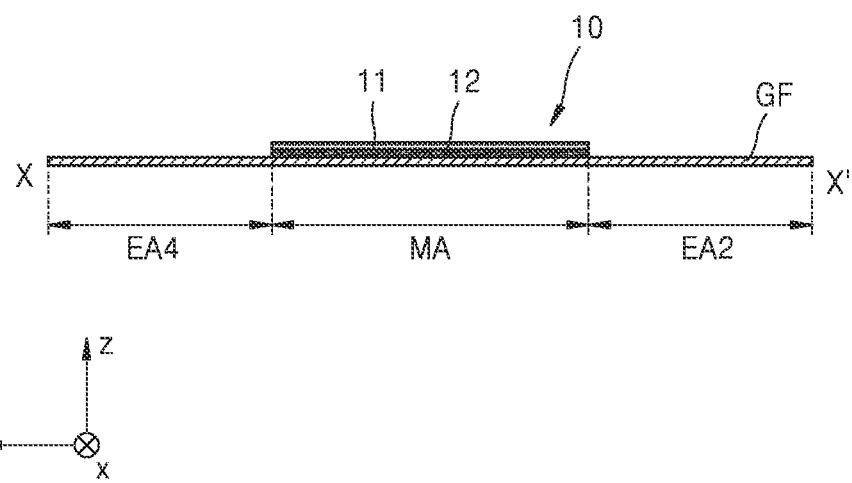
FIG. 23B are side views schematically illustrating a method of manufacturing a display apparatus, according to an embodiment.

Referring to FIGS. 23A and 23B, the protective film 10 may be attached to the display panel 20 after the functional layer FL and the display panel 20 are attached to the cover window 30. In an embodiment, a method of attaching the protective film 10 may be similar to the above-described method of attaching the display panel 20 to the cover window 30. In an embodiment, the protective film 10 may be arranged to face the display panel 20, and may be compressed by a silicon pad, etc., so that the protective film 10 may contact the display panel 20. In an embodiment, the protective film 10 may be arranged to face the display panel 20, and may linearly move and reciprocate on a surface of the protective film 10 by means of a roller, etc., so that the protective film 10 is attached to the display panel 20. However, for convenience of explanation, a case in which a method of attaching the protective film 10 to the display panel 20 is similar to a method of attaching the display panel 20 to the cover window 30 is mainly described in detail below.

For example, the guide film GF may be attached to the rear surface of the protective film 10. In this case, the method of attaching the protective film 10 to the guide film GF may be similar to the method of attaching the display panel 20 to the guide film GF, described with reference to FIG. 22A, and thus, detailed descriptions thereof are omitted.

In an embodiment, the guide film GF described above may include the central area MA and an edge area EA connected to each of edges of the central area MA. For example, the guide film GF may include a first edge area EA1 connected to a first outline MA-E1 of the protective film 10, a second edge area EA2 connected to a second outline MA-E2 of the protective film 10, a third edge area EA3 connected to a third outline MA-E3 of the protective film 10, and a fourth edge area EA4 connected to a fourth outline MA-E4 of the protective film 10.

The central area MA of the guide film GF may include a concave corner CC so as not to overlap the corner area CA of the protective film 10 in a plan view.

Although FIG. 23A illustrates that the guide film GF includes four edge areas EA, the disclosure is not limited thereto, and the guide film GF may include less or more edge areas EA according to a shape of the display apparatus 1. In addition, FIG. 23A illustrates that the edge area EA has a quadrangular shape in a plan view. However, the edge area EA may have various shapes such as a polygonal shape such as a triangular shape, a portion of a circle, and a portion of an ellipse.

In an embodiment, the guide film GF may be attached to a rear surface of the protective film 10 to overlap the protective film 10 in a plan view. The central area MA of the guide film GF may be attached to overlap the protective film 10. Although FIG. 23B illustrates that an edge of the protective film 10 corresponds to an edge of the central area MA of the guide film GF, the disclosure is not limited thereto.

As described above, the protective film 10 may correspond to the main display area FDA, the auxiliary display area SDA, the intermediate display area MDA, and the corner display area CDA of the display panel 20.

The protective film 10 may have a shape corresponding to the display area DA and the peripheral area PA of the display panel 20 in a plan view. For example, as shown in FIG. 23A, the protective film 10 may have an overall quadrangular shape with rounded corners in a plan view.

In case that the protective film 10 is preformed using the guide film GF, the cutout groove BEH of the protective film 10 described above may help the corner display area CDA (see FIG. 23A) of the protective film 10 to be well bent.

In a comparative example, in case that the protective film 10 does not include the cutout groove BEH, and in case that the protective film 10 is preformed using the guide film GF, the corner area CA of the protective film 10 may be incompletely bent even though the side area SA of the protective film 10 is well bent.

In this state, in case that the protective film 10 is attached to the display panel 20, the corner area CA of the protective film 10 which is incompletely bent is pressed by the corner portion of the cover window 30 and receives an excessive pressure, and thus, the corner display area CDA of the display panel 20 may be damaged, and buckling or wrinkling may occur in the corner area CA of the protective film 10. In some embodiments, an unexpected space may be created between the display panel 20 and the cover window 30 due to incomplete bending in the corner display area CDA of the display panel 20, and air bubbles may be trapped in the space.

However, according to an embodiment, the event described above does not occur, and thus, the protective film 10 corresponding to the display panel 20 may maintain a bending state of the corner display area CDA.

Referring to FIG. 23C, after the protective film 10 is arranged on the guide film GF as described above, the lamination apparatus LA including the support portion LA-1 and the volume change portion LA-2 on the support portion LA-1 may be prepared. The support portion LA-1 may support the volume change portion LA-2. The volume change portion LA-2 may include an air pump or may be connected to an air pump. Because the volume change portion LA-2 has a low modulus, a shape and volume of the volume change portion LA-2 may vary according to an air pressure through the air pump. In some embodiments, the volume change portion LA-2 may include a diaphragm.

A rear surface of the protective film 10 may face the lamination apparatus LA. In other words, the guide film GF may be arranged on a side of the lamination apparatus LA. The protective film 10 and the lamination apparatus LA may be aligned. For example, the protective film 10 and the lamination apparatus LA may be aligned so that a fourth alignment key AK4 displayed on the protective film 10 and the second alignment key AK2 displayed on the lamination apparatus LA correspond to each other.

Figure 23D:
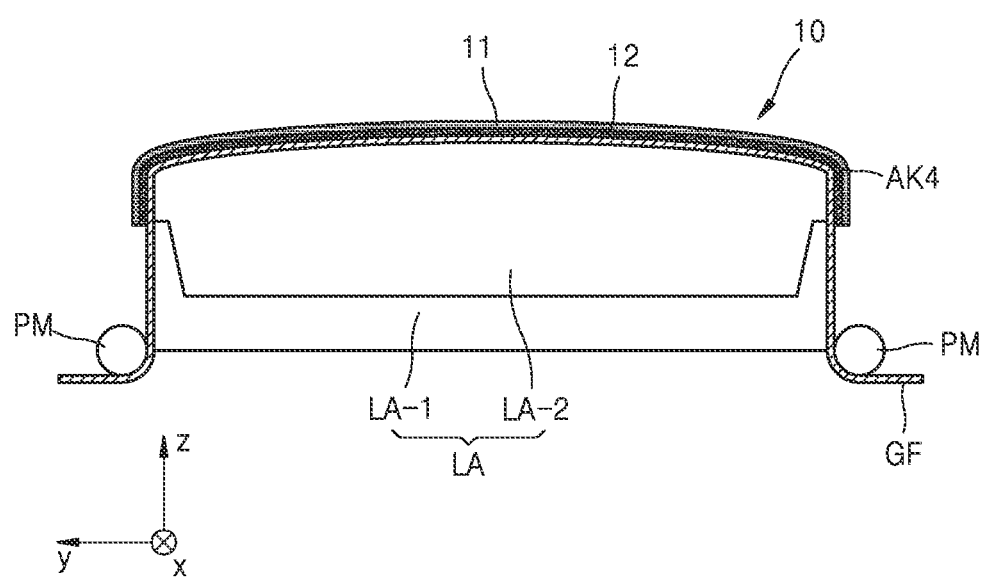

Referring to FIG. 23D, the protective film 10 may be preformed by means of the guide film GF. In this case, in case that the corner area CA is deformed, the cutout groove BEH arranged in the corner area CA of the protective film 10 may prevent buckling in the entire protective film 10. The preforming method is similar to a method of preforming the display panel 20 described above, and thus, detailed descriptions thereof are omitted.

Figure 23E:
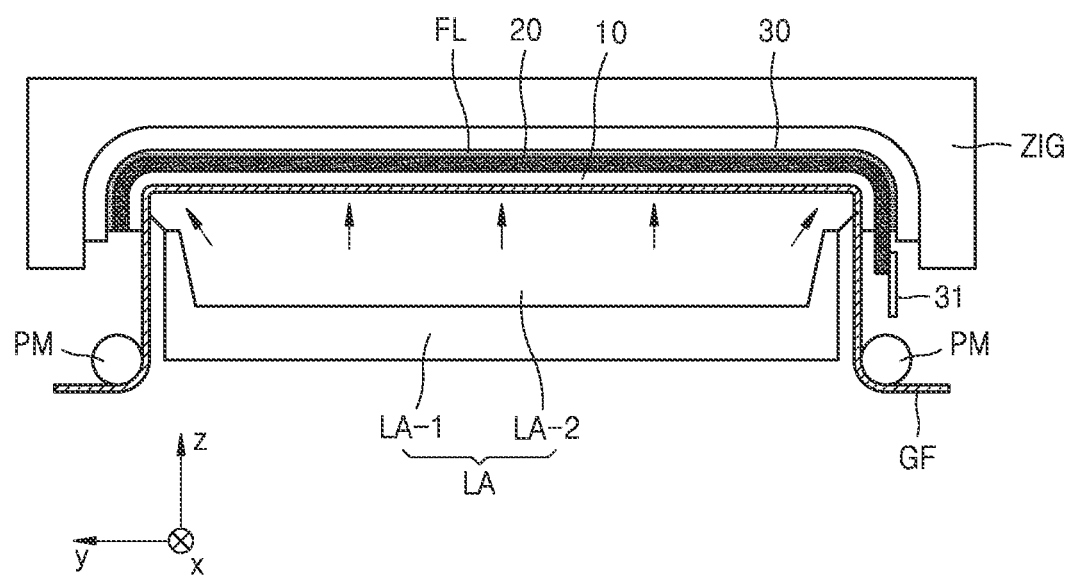

Referring to FIG. 23E, the protective film 10 that is preformed may be attached to the rear surface of the display panel 20. In this case, although not shown in the drawings, an adhesive layer may be arranged on the front surface of the protective film 10 or the rear surface of the display panel 20. In this case, a method of attaching the protective film 10 to the display panel 20 is similar to the method of attaching the display panel 20 to the cover window 30 described with reference to FIGS. 22G and 22H, and thus, detailed descriptions thereof are omitted.

Figure 23F:
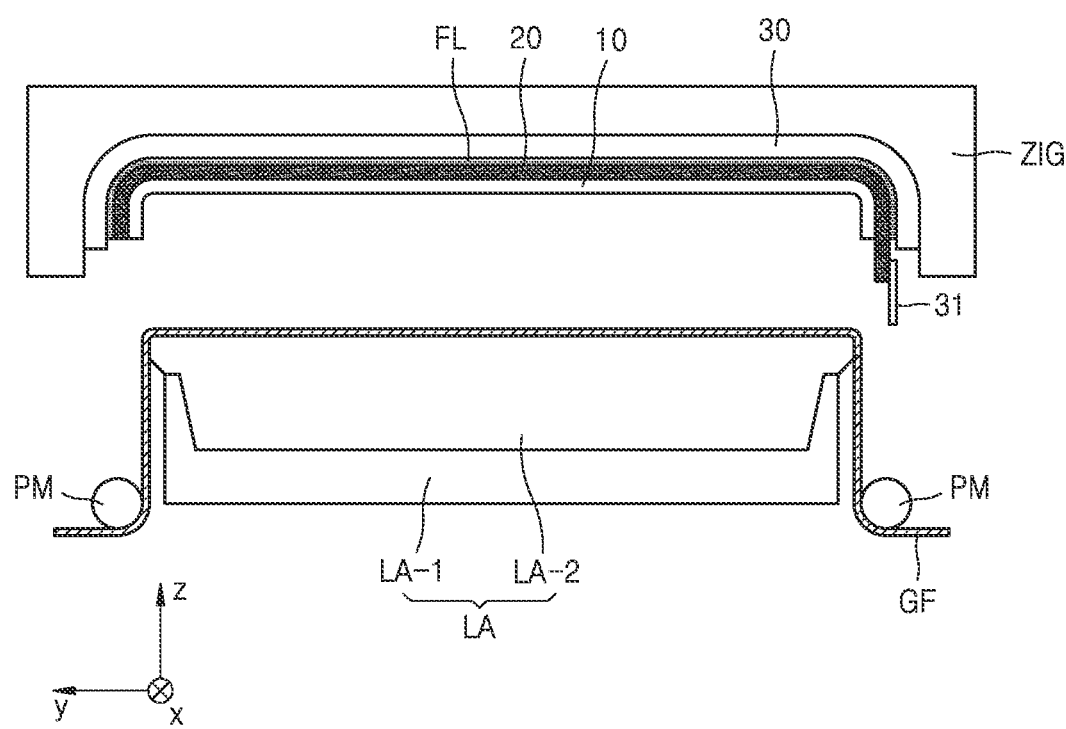

Referring to FIG. 23F, the protective film 10 may be attached to the display panel 20, and the guide film GF may be separated from the protective film 10.

Figure 23G:
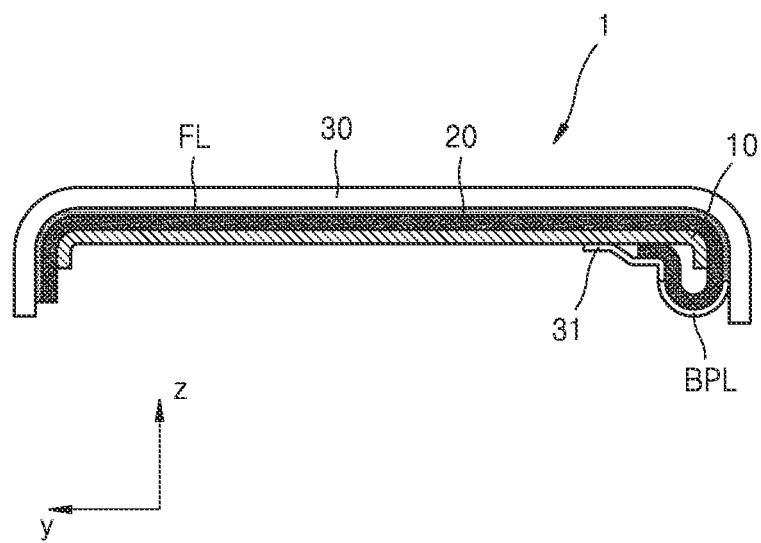

Referring to FIG. 23G, after the protective film 10 is attached to the rear surface of the display panel 20, the display circuit board 31 may be attached to the rear surface of the protective film 10 by bending a portion of the display panel 20. In this case, although not shown in FIG. 23G, a spacer including a material such as PET may be arranged on the rear surface of the protective film 10 so that the display circuit board 31 is arranged on the spacer.

In this case, the shielding member 40 may be attached to the corner area CA before at least a portion of the display panel 20 is bent, or may be attached to the corner area CA after at least a portion of the display panel 20 is bent. In this case, in a method of attaching the shielding member 40, the shielding member 40 and the corner area CA may be arranged to correspond to each other using an additional cylinder or the like, and the shielding member 40 may be pressed with a cylinder and attached.

In this case, the display panel 20 may be attached to the cover window 30 in case that the protective film 10 is attached to the display panel 20. Although not shown in the drawings, in case that an operation of FIGS. 22A to 22I is performed, the protective film 10, the display panel 20, the functional layer FL, and the cover window 30 may have the same shape as the shape shown in FIG. 23F.

In addition, at least a portion of the display panel 20 may be bent as shown in FIG. 23G, and the display circuit board 31 may be attached to the rear surface of the protective film 10, or may be attached to the spacer attached to the rear surface of the protective film 10. Further, the shielding member 40 may be attached to correspond to the corner area CA before or after at least a portion of the display panel 20 is bent.

Thus, the method of manufacturing the display apparatus 1 may not only reinforce the corner area CA by using the shielding member 40, but also prevent the penetration of moisture through the cutout groove BEH of the corner area CA.

In the method of manufacturing the display apparatus 1, the second layer 12 of the corner area CA, a portion of which is cut out, may be electrically connected to the shielding member 40, thereby preventing excessive concentration of electric charges in a cut-out portion of the second layer 12.

A protection member according to one or more embodiments may not only effectively support a display panel in a corner area having a curvature, but also prevent foreign materials from entering the corner area.

In a display apparatus according to one or more embodiments, an image may be displayed even on a side surface and/or a corner of the display apparatus in order to reduce an area of a non-display area and increase an area of a display area.

In the method of manufacturing the display apparatus according to one or more embodiments, damage to corners of the display panel, buckling, and wrinkling may be prevented or minimized.

However, the scope of the disclosure is not limited by this effect.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A protection member comprising:
    a protective film comprising:
        a first layer having:
            a central area;
            a first side area extended to a first edge of the central area;
            a second side area intersecting the first edge of the central area; and
            a corner area extended between the first side area and the second side area; and
        a second layer arranged on the first layer and including a groove exposing at least
    a portion of the corner area of the first layer in a plan view; and
    a shielding member shielding the at least the portion of the corner area that is exposed.

2. The protection member of claim 1, wherein
    the second layer overlaps the central area, the first side area, and the second side area of the first layer in the plan view, and
    the second layer exposes the corner area of the first layer.

3. The protection member of claim 1, wherein
    the corner area comprises a first area and a second area,
    the second layer overlaps the central area, the first side area, the second side area of the first layer, and the first area in the plan view, and
    the second layer exposes the second area of the first layer.

4. The protection member of claim 3, wherein the shielding member shields the second area and at least one of the central area, the first side area, the second side area, and the first area.

5. The protection member of claim 3, wherein
    the first area comprises a first line area and a second line area spaced apart from each other,
    the first line area is positioned between the first side area and the second area, and
    the second line area is positioned between the second side area and the second area.

6. The protection member of claim 5, wherein the shielding member shields the second area and at least one of the central area, the first side area, and the second side area, the first line area, and the second line area.

7. The protection member of claim 3, wherein
    the first area comprises line areas that extend in a first direction and are spaced apart from each other in a second direction,
    the second area comprises space areas that extend in the first direction and are arranged in the second direction, and
    the line areas and the space areas are arranged to alternate with each other in the second direction.

8. The protection member of claim 7, wherein the shielding member comprises:
    a first shielding member shielding one of the space areas; and
    a second shielding member shielding another one of the space areas.

9. The protection member of claim 1, wherein the shielding member comprises:
    a body portion; and
    a contact layer contacting the second layer.

10. The protection member of claim 9, wherein the contact layer comprises metal particles.

11. The protection member of claim 9, wherein a surface of the body portion is flat.

12. The protection member of claim 9, wherein the contact layer comprises:
    a blocking layer arranged on the body portion; and
    a conductive layer arranged on the blocking layer.

13. The protection member of claim 1, wherein at least a portion of the shielding member is curved.

14. A display apparatus comprising:
    a protective film comprising:
        a first layer having:
            a central area;
            a side area extended to an edge of the central area; and
            a corner area that extends from a corner of the central area and is bent at a first curvature radius; and
        a second layer exposing at least a portion of the corner area of the first layer;
    a shielding member shielding at least the portion of the corner area, the portion of the corner area being exposed; and
    a display panel arranged on a second surface facing the first surface, the display panel comprising:
        a main display area corresponding to the central area; and
        a corner display area corresponding to the corner area.

15. The display apparatus of claim 14, wherein
    the second layer overlaps the central area and the side area of the first layer in a plan view, and
    the second layer exposes the corner area of the first layer.

16. The display apparatus of claim 14, wherein
    the corner area comprises a first area and a second area,
    the second layer overlaps the central area, the side area of the first layer, and the first area in a plan view, and
    the second layer exposes the second area of the first layer.

17. The display apparatus of claim 16, wherein the shielding member shields the second area and at least one of the central area, the side area, and the first area.

18. The display apparatus of claim 16, wherein
the first area comprises a first line area and a second line area spaced apart from each other,
the first line area is positioned between a first side area of the side area and the second area, and
the second line area is positioned between a second side area of the side area and the second area.

19. The display apparatus of claim 18, wherein the shielding member shields the second area and at least one of the central area, the first side area, the second side area, the first line area, and the second line area.

20. The display apparatus of claim 16, wherein
the first area comprises line areas that extend in a first direction and are spaced apart from each other in a second direction,
the second area comprises space areas that extend in the first direction and are arranged in the second direction, and
the line areas and the space areas are arranged to alternate with each other in the second direction.

21. The display apparatus of claim 20, wherein the shielding member comprises:
a first shielding member shielding one of the space areas; and
a second shielding member shielding another one of the space areas.

22. The display apparatus of claim 14, wherein the shielding member comprises:
a body portion; and
a contact layer contacting the second layer.

23. The display apparatus of claim 22, wherein the contact layer comprises metal particles.

24. The display apparatus of claim 22, wherein the contact layer comprises:
a blocking layer arranged on the body portion; and
a conductive layer arranged on the blocking layer.

25. The display apparatus of claim 22, wherein a surface of the body portion is flat, the surface being arranged in an opposite direction to a surface facing the display panel.

26. The display apparatus of claim 14, wherein at least a portion of the shielding member is curved.

27. The display apparatus of claim 14, further comprising:
a cover window overlapping the display panel in a plan view.

28. A method of manufacturing a display apparatus, the method comprising:
aligning a first surface of a display panel to face a cover window and bonding the cover window and the display panel to each other;
aligning a first surface of a protective film to face a second surface opposite to the first surface of the display panel and bonding the display panel to the protective film, the protective film comprising:
a first layer having:
a central area;
a first side area extended to a first edge of the central area;
a second side area extended to a second edge crossing the first edge of the central area; and
a corner area extending between the first side area and the second side area; and
a second layer arranged on the first layer and exposing at least a portion of the corner area of the first layer; and
arranging a shielding member on the second layer to shield the first layer that is exposed.

29. The method of claim 28, wherein the shielding member comprises:
a body portion; and
a contact layer on the body portion and contacting the second layer.

30. The method of claim 29, wherein the contact layer comprises metal particles.

31. The method of claim 29, wherein the contact layer comprises:
a blocking layer arranged on the body portion; and
a conductive layer arranged on the blocking layer.

32. The method of claim 28, wherein a surface of the body portion is flat, the surface being arranged in an opposite direction to a surface facing the display panel.

33. The method of claim 28, wherein at least a portion of the shielding member is curved.

\* \* \* \* \*